United States Patent [19]
Ikeda et al.

[11] Patent Number: 5,492,856
[45] Date of Patent: Feb. 20, 1996

[54] METHOD OF FORMING A SEMICONDUCTOR DEVICE HAVING A LC ELEMENT

[76] Inventors: Takeshi Ikeda, 2-5-6-213, Sanno, Ohta-ku, Tokyo, Japan; Susumu Okamura, 4-1-12-1305, Hiroo, Shibuya-ku, Tokyo, Japan

[21] Appl. No.: 460,165

[22] Filed: Jun. 2, 1995

Related U.S. Application Data

[62] Division of Ser. No. 329,520, Oct. 26, 1994.

[51] Int. Cl.$^6$ .............................. H01L 21/70; H01L 27/00
[52] U.S. Cl. .............................. 437/60; 437/47; 437/958; 437/919
[58] Field of Search ................... 437/904, 47, 60, 437/919, 957–958; 257/531, 277, 275; 148/DIG. 163; 333/184, 242, 247, 191, 248

[56] References Cited

U.S. PATENT DOCUMENTS

| | | | |
|---|---|---|---|
| 3,022,472 | 2/1962 | Tanenbaum et al. | 333/18 |
| 3,778,643 | 12/1973 | Jaffe | 307/293 |
| 5,111,169 | 5/1992 | Ikeda | 333/181 |
| 5,384,274 | 1/1995 | Kanehachi | 437/47 |

FOREIGN PATENT DOCUMENTS

| | | |
|---|---|---|
| 0388985 | 9/1990 | European Pat. Off. . |
| 3-259608 | 11/1991 | Japan . |

*Primary Examiner*—George Fourson
*Assistant Examiner*—H. Jey Tsai
*Attorney, Agent, or Firm*—Oliff & Berridge

[57] ABSTRACT

An LC element with a pn junction layer formed near the surface of a p-Si substrate by forming an n$^+$ region having a predetermined shape and in a portion thereof additionally forming a p$^+$ region having the same shape, and with first and second electrodes formed over entire length on the surface of this pn junction layer; wherein the two electrodes respectively function as inductors and by using the pn junction layer with reverse bias, a distributed constant type capacitor is formed between these inductors, thereby providing excellent attenuation characteristics over a wide band, a semiconductor device including the LC element, and a method of manufacturing the LC element. This LC element and semiconductor device can be easily manufactured; in the case of manufacturing as a portion of an IC or LSI device, component assembly work in subsequent processing can be abbreviated, and by changing the capacitance of the distributed constant type capacitor according to requirements, the characteristics can be changed.

2 Claims, 45 Drawing Sheets

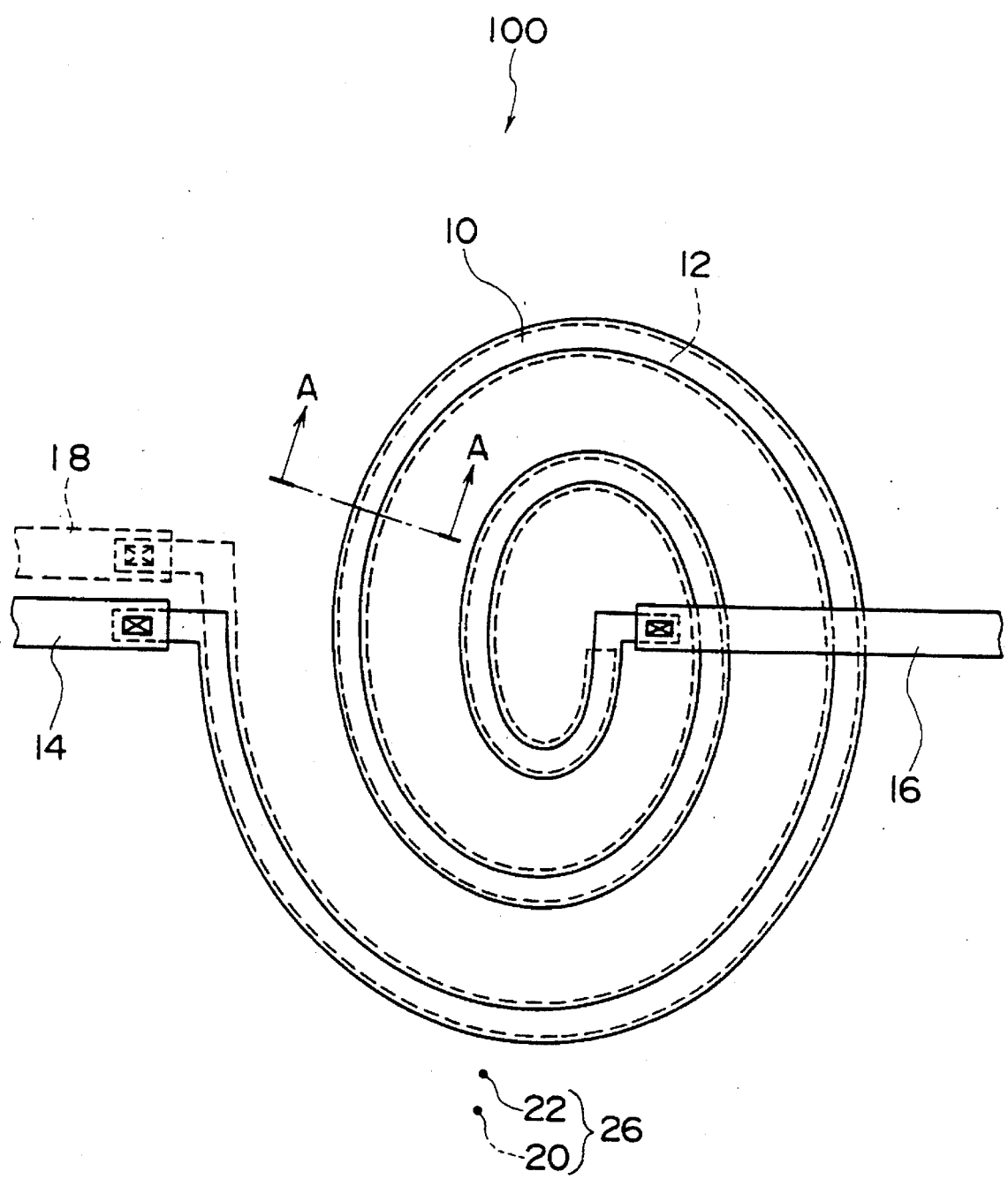

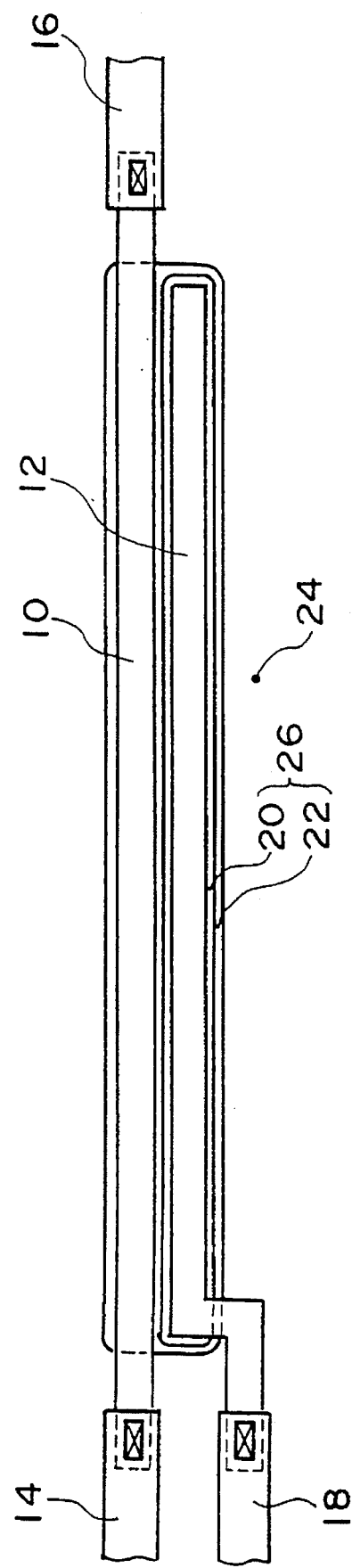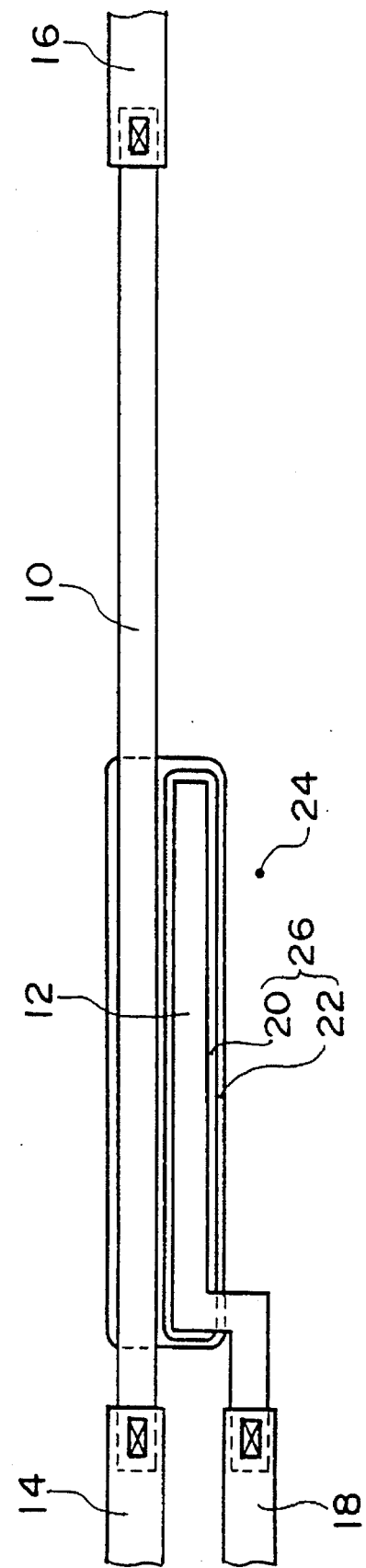

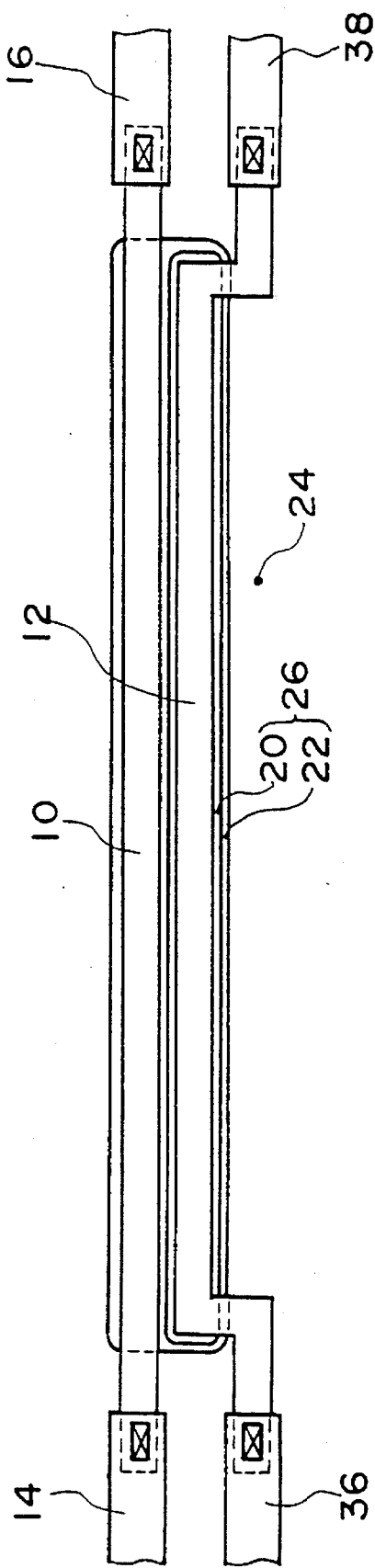
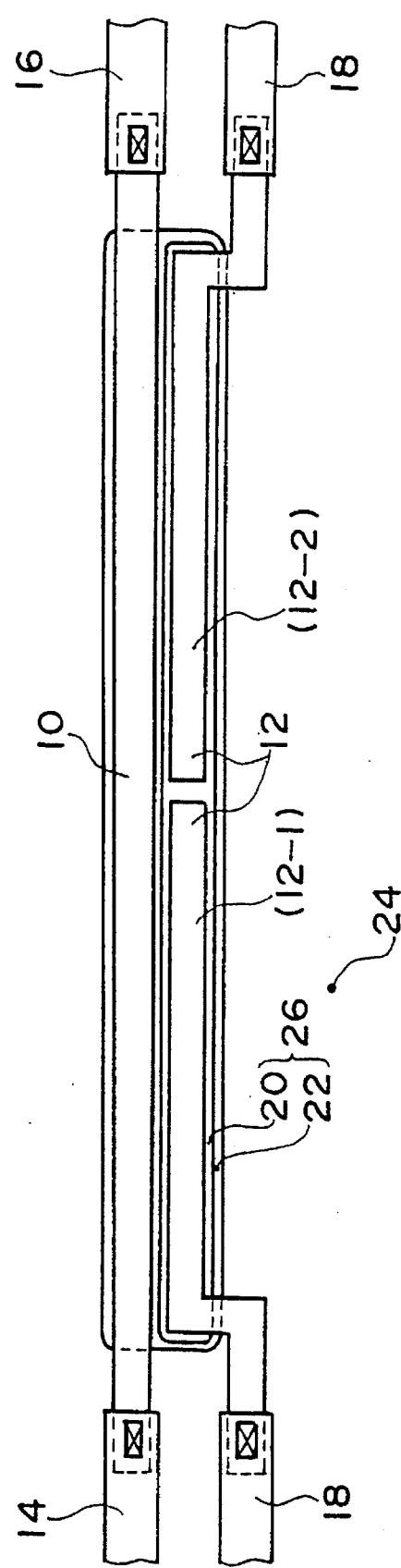
FIG. 27A
FIG. 27B

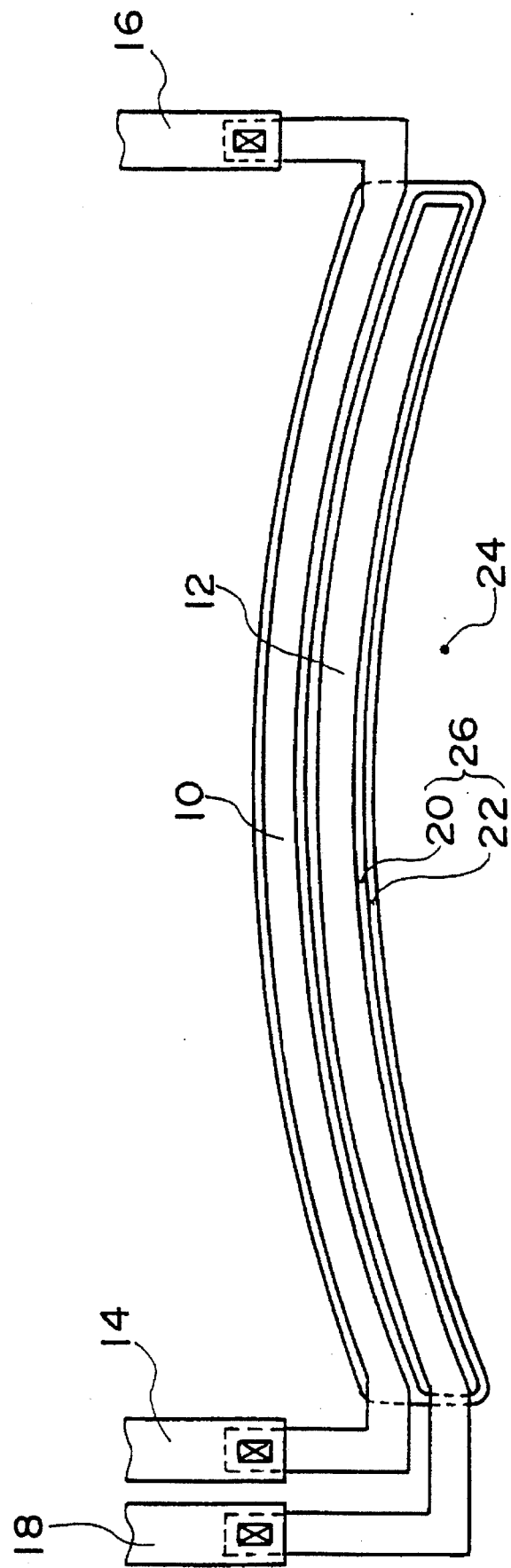

METHOD OF FORMING A SEMICONDUCTOR DEVICE HAVING A LC ELEMENT

This is a Division of application Ser. No. 08/329,520 filed Oct. 26, 1994.

BACKGROUND OF THE INVENTION

1. Field of the Invention

The present invention relates to an LC element capable of attenuating a predetermined frequency band and used either as part of a semiconductor or other device, or as a discrete element, a semiconductor device including such an LC element and a method for manufacturing such an LC element.

2. Background Art

The rapid advancement of electronics technology in recent years has brought about the use of electronic circuits in an increasingly broad range of fields. Therefore, stable operation of these electronic circuits is sought without being affected by external conditions.

However, electronic circuits are directly or indirectly subject to the incursion of external noise. Consequently, a problem exists whereby operating error is caused in electronic products using electronic circuits.

In particular, there are many cases of using switching regulators as electronic circuit DC power supplies. As a result of transient current produced by such operations as switching, or by load fluctuations arising from switching operation of utilized digital ICs, intense noise having many frequency components is often produced in the switching regulator power supply line. This noise is conveyed via the power supply line or by radiation to other circuits in the same product, giving rise to such effects as operating error and impaired signal to noise ratio, and in some cases even causing operating error in other nearby electronic products.

Various types of noise filters are presently being used with respect to electronic circuits in order to remove noise. In particular, since a great many electronic products of numerous types have come into use in recent years, the regulations against noise have grown ever more stringent, and development of an LC element having functions as a compact high performance noise filter capable of reliably removing such noise is desired.

One example of this type of LC element is an LC noise filter disclosed in Japanese Patent Application Laid-open No. 3-259608. In the case of this LC noise filter, the L (inductance) and C (capacitance) components exist as distributed constants, and compared to a lumped constant type LC filter, favorable attenuation response can be obtained over a relatively wide band.

However, manufacturing process of this LC noise filter is complicated because this LC noise filter is formed by folding an insulation sheet which has been provided with the conductor on both sides to form the inductor and the capacitor.

Also, wiring is required when directly inserting this LC filter into an IC or LSI power supply or signal line, thus necessitating time and labor for installing the components.

In addition, since this LC filter is formed as a discrete component, inclusion in an IC or LSI circuit, i.e., insertion into the internal wiring of an IC, LSI or other device is nearly impossible.

Furthermore, in the case of this LC noise filter, since a capacitor formed in the manner of a distributed constant is determined by the respective shape and arrangement of the conductors which also functions as the inductors, after completion of the product, the capacitance is fixed. Consequently, the problem arises whereby the overall characteristics are also fixed and use for general purpose applications is restricted. For example, in order to change only the capacitance, the shape of the capacitor type conductor must be changed. Freely changing the capacitance of the LC noise filter which has been connected to a particular circuit according to requirements is difficult.

SUMMARY OF THE INVENTION

The present invention considers the above mentioned points and objects are to provide an LC element and a semiconductor device which enable simplified manufacturing, eliminate the parts assembly operations in subsequent processing, and which can be formed as part of an IC or LSI device, and to provide a manufacturing method of such an LC element.

Another object of the present invention is to provide an LC element, semiconductor device and LC element manufacturing method allowing characteristics to be freely changed by changing the distributed constant type capacitance according to requirements.

In order to resolve the above mentioned problems, an LC element according to this invention comprises:

two inductor electrodes respectively having predetermined inductances disposed essentially in parallel, and a pn junction layer functioning as a capacitor by using in a reverse bias state, formed on a semiconductor substrate along the two inductor electrodes and comprising a p region and an n region electrically connected over their entire length respectively to one and the other of the two inductor electrodes, wherein inductors respectively formed by the two inductor electrodes and the capacitor formed by the pn junction layer along the two inductor electrodes exist as distributed constants, and at least one of the two inductor electrodes is used as a signal transmission line.

An LC element according to this invention comprises two electrodes having predetermined inductances and formed essentially in parallel. In general, a function as an inductor is obtained by forming a conductor in a spiral shape. However, a function as an inductor can also be obtained by modifying the conductor shape or, by forming the conductor into shapes other than spiral, for example, meander, wave, curved line and straight line shapes depending on the frequency band to be used.

Also, a pn junction is formed between these two electrodes with predetermined inductances and a function as a capacitor is obtained by using this pn junction in the reverse bias state. This capacitor is formed as a distributed constant over the entire length of the electrodes with predetermined inductances. As a result, when an input signal applied to at least either one of these two inductor electrodes is transmitted via the distributed constant type inductors and capacitor, excellent attenuation characteristics are obtained over a wide band.

In particular, because the LC element according to this invention can be constructed by forming a pn junction layer of a predetermined shape on a semiconductor substrate, then on this surface forming the two electrodes with shape corresponding to the pn junction layer, manufacturing is extremely easy. Also, since this LC element is formed on a semiconductor substrate, formation as part of an IC or LSI device is also possible, and when formed as part of this type of device, part assembly work in subsequent processing can be abbreviated.

Another LC element according to this invention comprises:

two inductor electrodes respectively having predetermined inductances disposed essentially in opposition, and a pn junction layer functioning as a capacitor by using in a reverse bias state, formed on a semiconductor substrate between the two inductor electrodes and comprising a p region and an n region electrically connected over their entire length respectively to one and the other of the two inductor electrodes, wherein inductors respectively formed by the two inductor electrodes and the capacitor formed by the pn junction layer between the two inductor electrodes exist as distributed constants, and at least one of the two inductor electrodes is used as a signal transmission line.

In contrast to the above mentioned LC element, whereby two electrodes respectively functioning as inductors having predetermined inductances are disposed in parallel within essentially the same plane, in the case of this LC element, the two electrodes are arranged essentially in opposition and the semiconductor substrate exists between them. By using the pn junction layer in the reverse bias state, a distributed constant type capacitor exists between these electrodes. Consequently, this LC element has excellent attenuation characteristics over a wide band, while manufacturing is easy and formation as part of a substrate is enabled.

According to the present invention, the shapes of the above mentioned electrodes functioning as inductors can in practice be spiral, meander, wave, curved line, straight line and others.

In other words, although having inductance is self-evident when the electrodes are formed in a spiral shape, when the electrodes are meander or wave shape, each concave and convex portion individually comprises an approximately ½ turn coil, and since these are connected in series, an overall predetermined inductance is possessed. In particular, by using a meander shape, since adjacent electrodes can be formed in close proximity, space can be effectively utilized. Also, if the employed frequency band is limited to the high frequency region, even when the electrode shape is a curved line or straight line, a predetermined inductance is possessed, and the same operation can be obtained as forming the electrodes in spiral and other shapes.

An LC element according to another aspect of this invention further comprises:

first and second input/output electrodes respectively provided in proximity to one end and to the other end of either one of the two inductor electrodes, and a ground electrode provided in proximity to one end of the other of the two inductor electrodes, wherein a signal is input to either one of the first and second input/output electrodes and output from the other, and the ground electrode is connected to a fixed potential power supply or ground.

In the case of this. LC element, first and second input/output electrodes are provided respectively at one end of either one of the electrodes functioning as inductors of the above mentioned LC elements and in proximity to the other end, while the ground electrode is provided in proximity to one end of the other of these electrodes functioning as inductors. Consequently, a three terminal type LC element using the electrode provided with the first and second input/output electrodes as the signal transmission line can be easily formed.

An LC element according to another aspect of this invention further comprises:

first and second input/output electrodes respectively provided in proximity to one end and to the other end of either one of the two inductor electrodes, and third and fourth input/output electrodes respectively provided in proximity to one end and to the other end of the other of the two inductor electrodes, and used as a common mode type element having the two inductor electrodes as signal transmission lines.

Thus, a four terminal common mode type LC element can be easily formed by also providing third and fourth input/output electrodes at the other inductor electrode.

In the case of an LC element according to another aspect of this invention, the two inductor electrodes are of different length, and the pn junction layer is formed at least over entire length of the shorter of the two inductor electrodes.

Either one of the two electrodes functioning as inductors is formed shorter than the other. In this case as well, the two electrodes with different lengths respectively function as inductors, while a distributed constant type capacitor is formed between these electrodes by the pn junction layer. Consequently, this LC element has excellent attenuation characteristics over a wide band, while manufacturing is easy and formation as part of a substrate is enabled.

In the case of an LC element according to another aspect of this invention, only either one of the inductor electrodes is used as a signal transmission line, either the other one of the inductor electrodes is divided into a plurality of segments or both of the other one of the inductor electrodes and the pn junction layer corresponding to the other one of the inductor electrodes are divided into a plurality of segments, and each of the divided plurality of inductor electrode segments is mutually connected electrically.

In this case, either one of the two electrodes functioning as inductors is divided into a plurality of electrode segments, while these are mutually electrically connected. The self-inductance of each of these divided electrode segments is small and exerts only a small effect on the distributed constant type LC element.

According to another aspect of this invention, the capacitance of the pn junction layer can be changed by changing the reverse bias voltage applied to the pn junction layer.

In the case of this LC element, the reverse bias voltage can be variably set. Consequently, the capacitance of the capacitor formed between the two electrodes functioning as inductors can be changed and the attenuation characteristics can be variably controlled according to requirements.

According to another aspect of this invention, a buffer is connected to the output side of the signal transmission line of any one of the above mentioned LC elements.

In this case, the buffer is connected and amplifies the output signal via the LC element signal transmission line.

Among the advantages enabled by this aspect are signal amplification, output impedance adjustment and preventing interference from subsequent circuit stages.

According to another aspect of this invention, any one of the above mentioned LC elements formed on a semiconductor substrate further comprises terminals by forming an insulation layer on the entire surface of this semiconductor substrate, opening perforations in portions of this insulation layer by etching or laser light emission, and then closing the perforations by solder applied to the degree of protruding above the surface.

In the case of this aspect, after forming any one of the above mentioned LC elements on a semiconductor substrate, an insulation layer is formed on the entire surface by such means as chemical liquid phase deposition. Perforations are then opened in portions of this insulation layer by etching or laser light emission and the perforations are filled with solder to provide terminals. Consequently, a surface mounting type LC element can be easily manufactured. By producing the LC element as a surface mounting type, installation work can also be performed easily.

According to another aspect of this invention, a semiconductor device is formed as a portion of a semiconductor substrate in an integrated manner and comprises any one of the above mentioned LC elements formed as a portion of the semiconductor substrate, and at least one of the two inductor electrodes is inserted into a signal line or power supply line of the device.

In the case of this semiconductor device, an LC element according to any one of the above mentioned embodiments is formed on a portion of a substrate so that it would be inserted into the signal line or power supply line of the semiconductor device. Consequently, the LC element can be manufactured in an integrated manner with other components on a semiconductor substrate, manufacturing is easy and component assembly work in subsequent processing is unnecessary.

An LC element manufacturing method according to this invention comprises the steps of:

a first process whereby a p region or n region is formed in a predetermined shape in a semiconductor substrate, a second process whereby a pn junction layer having a predetermined shape is formed by forming an inverted layer n region or p region in a portion of the p region or n region including the surface formed in the first process, a third process whereby two inductor electrodes respectively having predetermined inductances are formed, electrically connected over their entire length respectively to the p region and n region, on the surface of the pn junction layer, and a fourth process whereby wiring layers are formed respectively connected to the two inductor electrodes.

This LC element manufacturing method is a means for making the above mentioned LC elements by applying semiconductor manufacturing technology to it. In other words, in the first process, a p region or n region is formed in a predetermined shape and in the second process, by forming an inversion layer n region or p region in a portion of the p region or n region including surface formed in the first process, a pn junction layer having an overall predetermined shape is formed. Then in the third process, the two electrodes are formed in a shape corresponding to the pn junction layer to complete the above mentioned LC element. In the following process, wiring layers respectively connected to the two electrodes are formed in accordance with requirements. According to the LC element manufacturing method of this invention, the two electrodes having predetermined inductances and shape corresponding to the pn junction layer are formed essentially in parallel. In general, a spiral shaped conductor functions as an inductor. However, by modifying the conductor shape or using a shape other than spiral according to the frequency band, for example, meander, wave, curved line, straight line or other shape, the conductor also functions as an inductor.

In this manner, the above mentioned LC elements can be manufactured by using ordinary semiconductor manufacturing technology, while down-sizing, cost reduction and simultaneous mass production of a plurality of LC elements are enabled.

DESCRIPTION OF THE DRAWINGS

FIG. 5 indicates an example of a variation of the first embodiment wherein first and second electrodes are arranged in essentially opposing positions on opposite sides of a p-Si substrate;

FIGS. 26A and 26B are plan views of LC elements in accordance with a ninth embodiment of this invention;

FIGS. 27A and 27B are plan views of LC elements in accordance with a ninth embodiment of this invention;

FIG. 28 indicates an example of a variation of the ninth embodiment;

DETAILED DESCRIPTION OF THE INVENTION

Following is a description of the preferred embodiments of the LC elements in accordance with this invention with reference to the attached drawings.

FIRST EMBODIMENT

Figure 1:
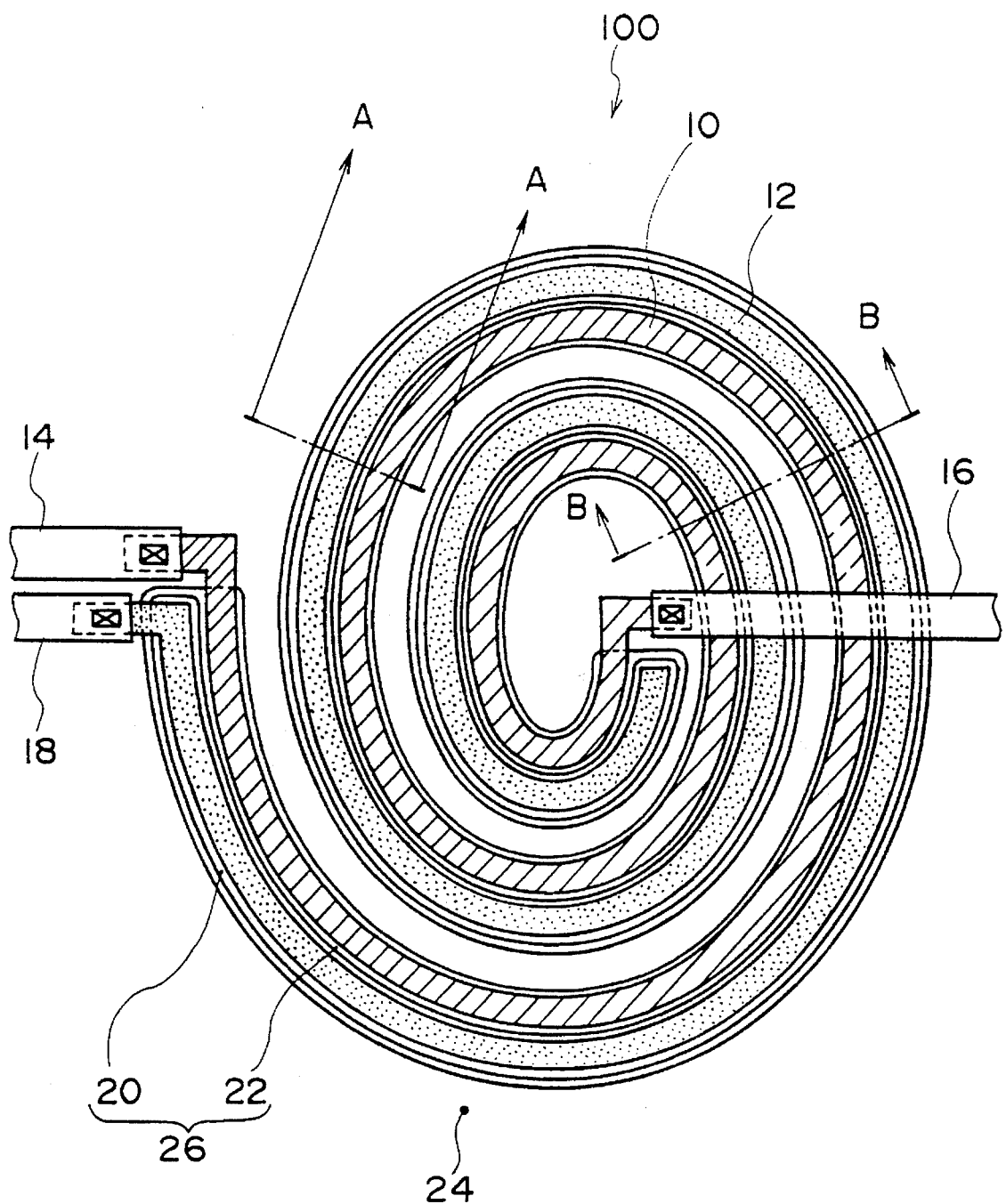
FIG. 1 is a plan view of an LC element in accordance with a first embodiment of this invention.
Figure 2:
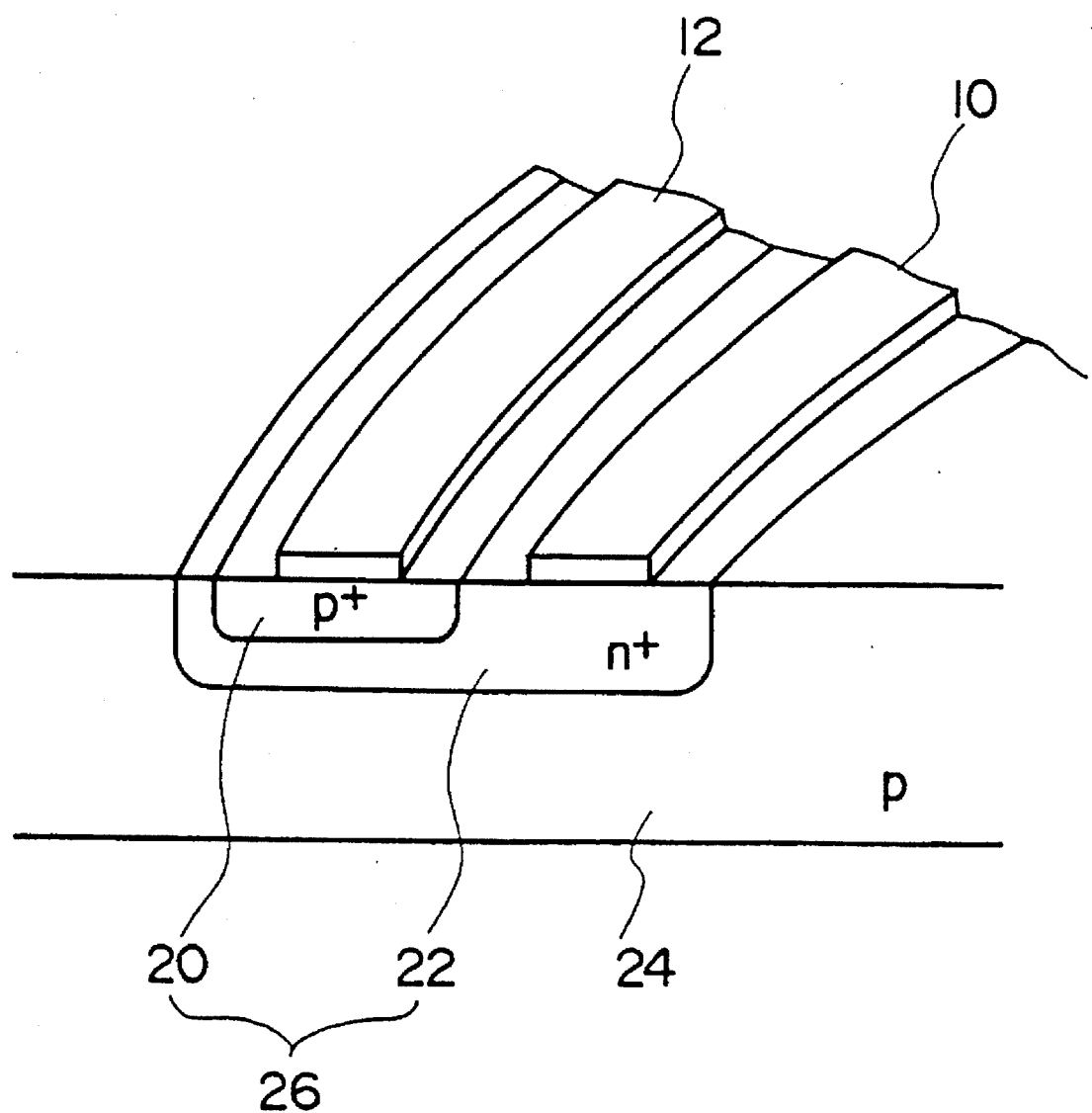
FIG. 2 is an enlarged cross-sectional view viewed along line A—A in FIG. 1.

FIG. 1 is a plan view of an LC element in accordance with a first embodiment of this invention. FIG. 2 is an enlarged cross-sectional view viewed along line A—A in FIG. 1.

As indicated in the figures, the LC element 100 of this embodiment comprises a spiral shaped $n^+$ region 22 formed near the surface of a p type silicon (p-Si) substrate 24 which is a semiconductor substrate, and a spiral shaped $p^+$ region 20 formed in a portion of the $n^+$ region 22. The $n^+$ region 22 and $p^+$ region 20 form a pn junction layer 26. Compared with the p-Si substrate 24, the respective impurity concentrations of the $n^+$ region 22 and $p^+$ region 20 are set higher. An isolation region function is obtained by applying a reverse bias voltage between the p-Si substrate 24 and $n^+$ region 22. In practice, reverse bias voltage can be securely applied by setting a ground electrode 18 (described below) and the p-Si substrate 24 to the same potential.

Also, a spiral shaped first electrode 10 is formed over the longitudinal direction on the $n^+$ region 22 surface. Similarly, a second electrode 12 is formed over the longitudinal direction on the $p^+$ region 20 surface. Two input/output electrodes 14 and 16 are respectively connected to the ends of the first electrode 10, and the ground electrode 18 is provided at one end (for example, the side corresponding to the input/output electrode 14) of the second electrode 12. In this manner, as indicated in FIG. 1, attachment of the two input/output electrodes 14 and 16 to the first electrode 10 and attachment of the ground electrode 18 to the second electrode 12 are performed outside the active regions so as not to damage the thin $n^+$ region 22 or $p^+$ region 20.

In the case of an LC element 100 of this embodiment having this type of construction, the spiral shaped first and second electrodes 10 and 12 respectively function as inductors. Also, in the reverse bias state, the pn junction layer 26 electrically connected respectively to the first and second electrodes 10 and 12 functions as a spiral shaped capacitor. Consequently, an LC element 100 having inductors and capacitors formed as distributed constants respectively by the first and second electrodes 10 and 12, and by the pn junction layer 26.

Figure 3A:
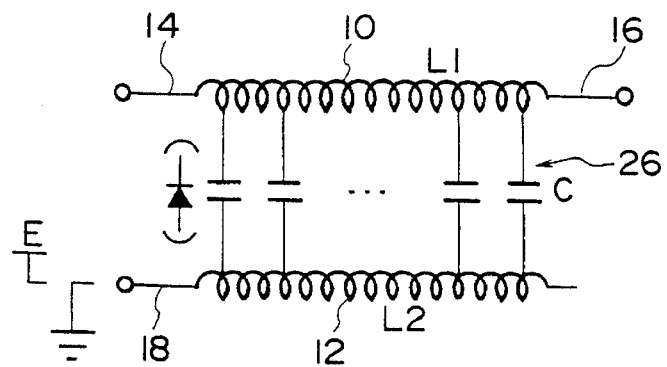
FIGS. 3A, 3B and 3C are schematic diagrams indicating equivalent circuits of LC elements in accordance with the first embodiment.

FIG. 3A shows an equivalent circuit of an LC element 100 according to this embodiment. As indicated in the figure, the spiral shaped first electrode 10 functions as an inductor with inductance L1. An input signal applied to one input/output electrode 14 is transmitted via the first electrode 10 and output from the other input/output electrode 16. The spiral shaped second electrode 12 also functions as an inductor with inductance L2. The ground electrode 18 is provided at one end of the second electrode 12 and is grounded or connected to a power supply with a fixed potential E.

When connected in this manner and the input voltage level to the input/output electrode 14 is set higher than the ground electrode 18 voltage level (0 V or fixed potential E), since reverse bias voltage is applied to the pn junction layer 26 comprising $n^+$ and $p^+$ regions 22, 20, this pn junction layer 26 functions as a capacitor with capacitance C. Also, since this capacitor is formed as a distributed constant over the entire length of the first and second electrodes 10 and 12, superb attenuation characteristics unattained with conventional lumped constant type LC elements can be realized.

Figure 3B:
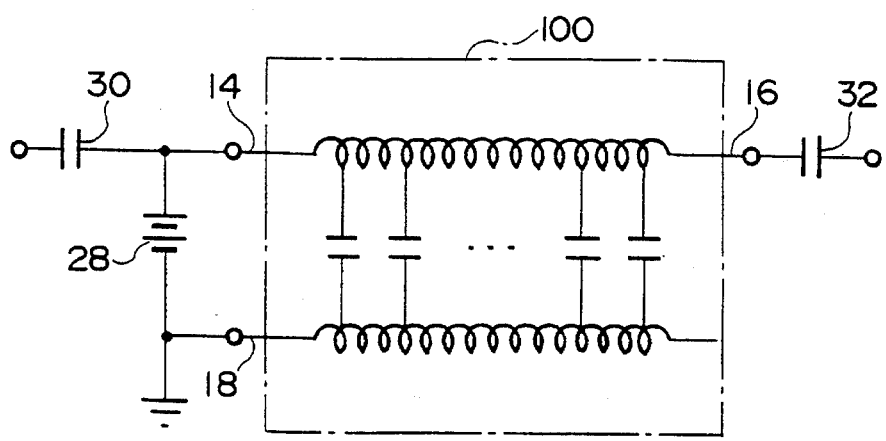

FIG. 3B shows an example of forcibly applying reverse bias voltage to the pn junction layer 26, thereby ensuring the pn junction layer 26 operation as a capacitor. In this case, a bias power supply 28 is connected for applying a predetermined reverse bias voltage between the input/output electrode 14 and ground electrode 18, while a capacitor 30 is connected to the input/output electrode 14 side for removing only the DC component from the input signal. By adding this type of circuit a fixed reverse bias voltage can be continuously applied to the pn junction layer 26, while a signal overlapped on this reverse bias voltage can be applied to the LC element 100 input.

Since the reverse bias voltage component is also be contained in the output signal from the input/output electrode 16, connecting an additional capacitor 32 for removing this reverse bias voltage, i.e., DC component, is desirable.

Figure 3C:
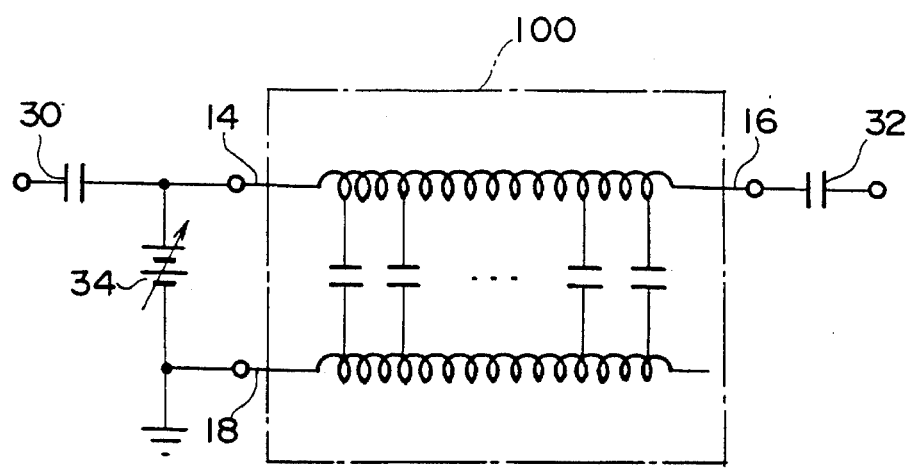

FIG. 3C shows an example of connecting a variable bias power supply 34 in place of the above mentioned bias power supply 28 to enable varying the reverse bias voltage level as desired. In general, since the thickness of the depletion layer produced in the pn junction varies according to the value of the reverse bias voltage applied to the pn junction layer 26, the capacitance C also varies as a result. Consequently, by varying the reverse bias voltage applied to the pn junction layer 26 via the two input/output electrodes 14 and 16, the distributed constant type capacitance C can be varied and the overall attenuation characteristics of the LC element 100 can be adjusted or changed.

FIGS. 4A–4D indicate a manufacturing process for the LC element 100 and show cross-sectional views of each step viewed along line B—B in FIG. 1.

Figure 4A:
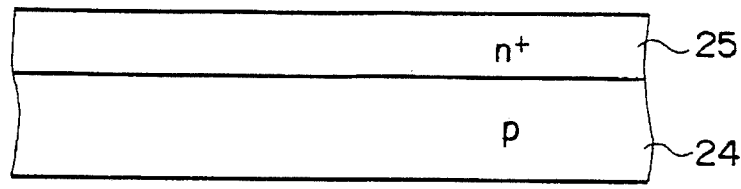
FIGS. 4A–4D indicate a manufacturing process of an LC element in accordance with the first embodiment.

1) Epitaxial layer growth:

The oxide film is first removed from the p-Si substrate 24 (wafer) surface, then an $n^+$ type epitaxial layer 25 is grown on the entire surface of the p-Si substrate 24 (FIG. 4A).

2) Isolation region formation:

Diffusion or ion injection of p type impurities is performed in order to produce an isolation region for the area except for the $n^+$ region 22 and $p^+$ region 20 indicated in FIGS. 1 and 2.

Figure 4B:
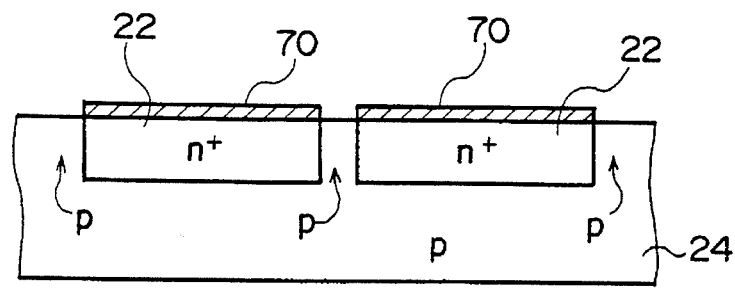

In practice, an oxidation film 70 is formed by thermal oxidation on the surface of the epitaxial layer 25. The oxidation film 70 is then removed by photo-lithography from the position for forming the p region. By selectively adding p type impurities by thermal diffusion or ion injection, the p region is selectively formed. The p region formed in this manner comprises an isolation region as a portion of the p-Si substrate 24 (FIG. 4B).

As a result of forming the isolation region in this manner, a spiral shaped $n^+$ region 22 is formed by the remaining epitaxial layer 25.

3) pn junction layer formation:

The spiral shaped $p^+$ region 20 is formed by introducing p type impurities by thermal diffusion or ion injection into a portion of the spiral shaped n* region.

In practice, an oxidation film 72 is first formed by thermal oxidation of the p-Si substrate 24 surface including the $n^+$ region 22. The oxidation film 72 is then removed by photo-lithography from the position for forming the $p^+$ region 20. By selectively adding p type impurities by thermal diffusion or ion injection, the $p^+$ region 20 is selectively formed.

Figure 4C:
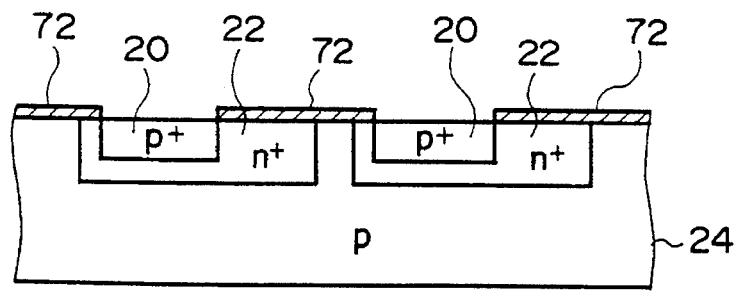

Since the $p^+$ region 20 needs to be formed within the previously formed $n^+$ region 22, the $p^+$ region 20 is formed by adding p type impurities in an amount exceeding the previously introduced n type impurities (FIG. 4C).

In this manner, the pn junction layer 26 composed of the $n^+$ region 22 and $p^+$ region 20 is formed.

Figure 4D:
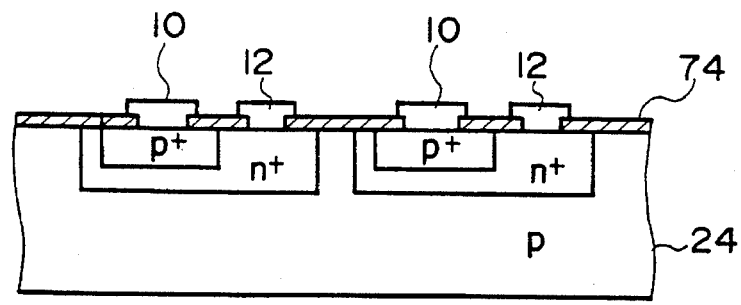

4) First and second electrode formation:

An oxidation film 74 is formed on the surface by thermal oxidation, then spiral shaped grooves are opened by photo-lithography in the respective surfaces of the $n^+$ region 22 and $p^+$ region 20. The first and second electrodes 10 and 12 are formed by vapor deposition of such material as aluminum, copper or gold onto the opened spiral shaped groove portions (FIG. 4D). Afterwards, the two input/output electrodes 14 and 16, and the ground electrode 18 are respectively formed by vapor deposition of aluminum or other material.

The LC element 100 is then finished by applying P-glass to the entire surface and heating to form a flat surface.

The manufacturing process of the LC element 100 of the present embodiment basically resembles the ordinary bipolar transistor or diode manufacturing process and differs in such respects as configuration of the pn junction layer 26 and isolation region in between. Consequently, the ordinary bipolar transistor manufacturing process can be adapted by changing the shape of the photomask, manufacturing is both easy and applicable to down-sizing. The LC element 100 can also be formed on the same substrate as ordinary semiconductor components such as bipolar transistors and MOSFETs, and can be formed as a portion of an ZC or LSZ device. In addition, when formed as a portion of an ZC or LSI device, component assembly work in subsequent processing can be abbreviated.

Although the above mentioned manufacturing process referred to the example of first forming the $n^+$ region on the entire surface by epitaxial growth, then performing isolation, conversely, after forming an oxidation film on the p-S1 substrate 24 surface and opening a window corresponding to the spiral shaped $n^+$ region 22 by photo-lithography, then after forming the $n^+$ region 22 by introducing n type impurities into this portion by thermal diffusion or ion injection, the $p^+$ region 20 can be directly formed by the same method. Also, ordinary semiconductor manufacturing technology can be used as a method for forming the pn junction layer.

In this manner, the first and second electrodes 10 and 12 respectively form inductors, and by using the spiral shaped pn junction layer 26 formed along these electrodes with reverse bias, the function as a capacitor is obtained. In addition, since the pn junction layer 26 is formed over the entire length of the first and second electrodes 10 and 12, the inductances L1 and L2 formed by the first and second electrodes 10 and 12, and the capacitance C1 formed by the pn junction layer 26 exist as distributed constants.

Consequently, by connecting the ground electrode 18 provided at one end of the second electrode 12 to the ground or a fixed potential and using the first electrode 10 as the signal transmission line, an LC element is comprised having excellent attenuation characteristics over a wide band with respect to an input signal.

As mentioned above, since the LC element 100 can be manufactured by using ordinary bipolar transistor and similar manufacturing technology, manufacturing is both easy and applicable to such objectives as down-sizing. Also, when the LC element is manufactured as a portion of a semiconductor substrate, wiring with other components on the same semiconductor substrate can also be performed simultaneously, making assembly work in subsequent processing unnecessary.

Also, by changing the reverse bias voltage applied to the pn junction layer 26, the capacitance C of the distributed constant type capacitor can be variably controlled and the overall frequency response of the LC element 100 can be adjusted or changed.

Although the foregoing description referred to the example of using the first electrode 10 as the signal transmission line, the second electrode 12 can alternatively be used as the signal transmission line (this point also applies to the other embodiments described in the following). In other words, by connecting the input/output electrodes 14 and 16 respectively to the ends of the second electrode 12, the second electrode 12 is used as the signal transmission line, while the ground electrode 18 is connected to one end of the first electrode 10 and to the ground or a fixed potential.

Figure 6:
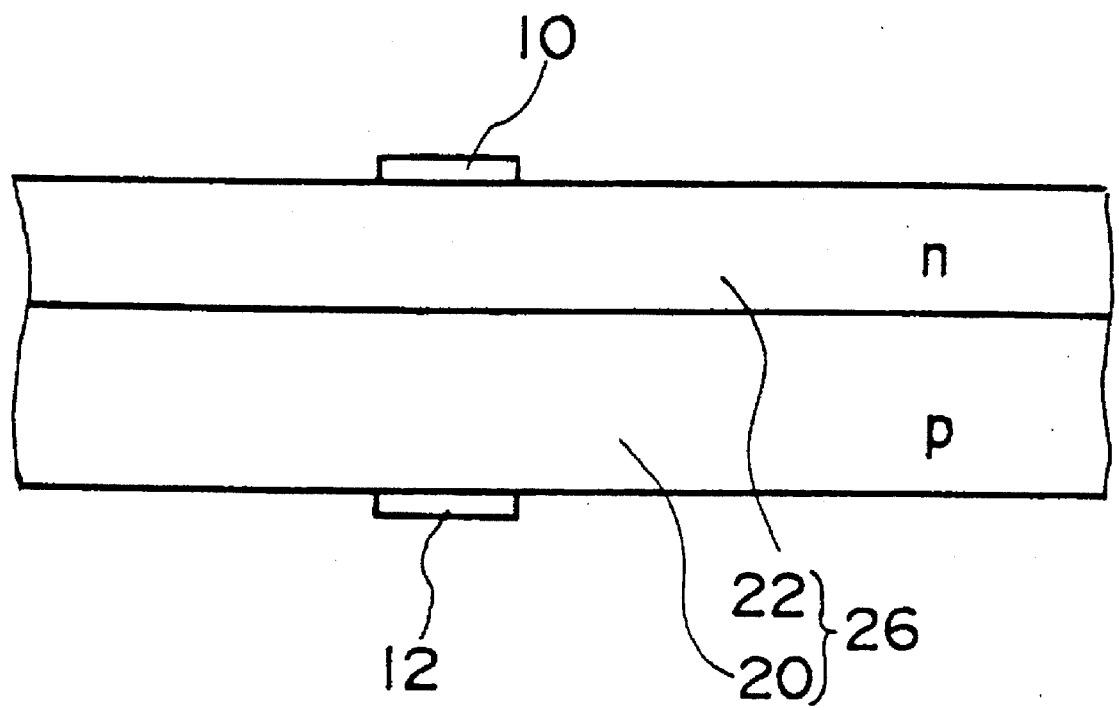
FIG. 6 is an enlarged cross-sectional view viewed along line A—A in FIG. 5.

FIG. 5 indicates an example of a variation of the first embodiment whereby the second electrode 12 is disposed essentially in opposition to the first electrode 10 on the opposite face (rear) of the p-Si substrate 24. For the sake of convenience, the rear electrode shape is shifted slightly toward the upper left in the plan view. Also, FIG. 6 is an enlarged cross-sectional view viewed along line A—A in FIG. 5 and corresponds to FIG. 2. In this manner, even though the two spiral shaped electrodes 10 and 12 are disposed essentially in opposition through the pn junction layer 26, in the same manner as the LC element 100 indicated in FIGS. 1 and 2, the first and second electrodes 10 and 12 respectively function as inductors, while formation of a distributed constant type capacitor between these is unchanged, thereby providing such advantages as excellent attenuation characteristics and easy manufacture. In particular, when the first and second electrodes 10 and 12 are essentially opposing, compared to the example indicated in FIG. 1 wherein these are disposed essentially in parallel on the same plane, an additional advantage can be realized in terms of reduced installation area.

The LC element cross-sectional construction indicated in FIG. 6 refers to an example whereby the overall pn junction layer 26 comprises a single capacitor having large opposing electrodes (the n region 22 and p region 20 respectively correspond to opposing electrodes). However, the n region 22 and p region 20 respectively have comparatively large resistivities and since the distance between the mutually opposing first and second electrodes 10, 12 is short, in the case when an alternating current signal flows between the first and second electrodes 10 and 12, most of the AC signal flows via the spiral shaped capacitor formed by the closely positioned pn junction layer 26, and AC signal flow via the capacitor produced by the closely positioned pn junction layer 26 between portions of the first and second electrodes 10 and 12 not directly opposing is nearly absent. Consequently, the pn junction layer 26 does not effectively function as a capacitor between portions where the first and second electrodes 10 and 12 are not disposed in opposition and only the pn junction layer 26 of the first and second electrode 10 and 12 opposing portions functions as a capacitor.

SECOND EMBODIMENT

An LC element in accordance with a second embodiment of this invention differs from the first embodiment mainly by using non-spiral shapes for the first and second electrodes 10 and 12, and the pn junction layer 26. In the figures, the same designations are used for items that correspond to those of the first embodiment.

Figure 7:
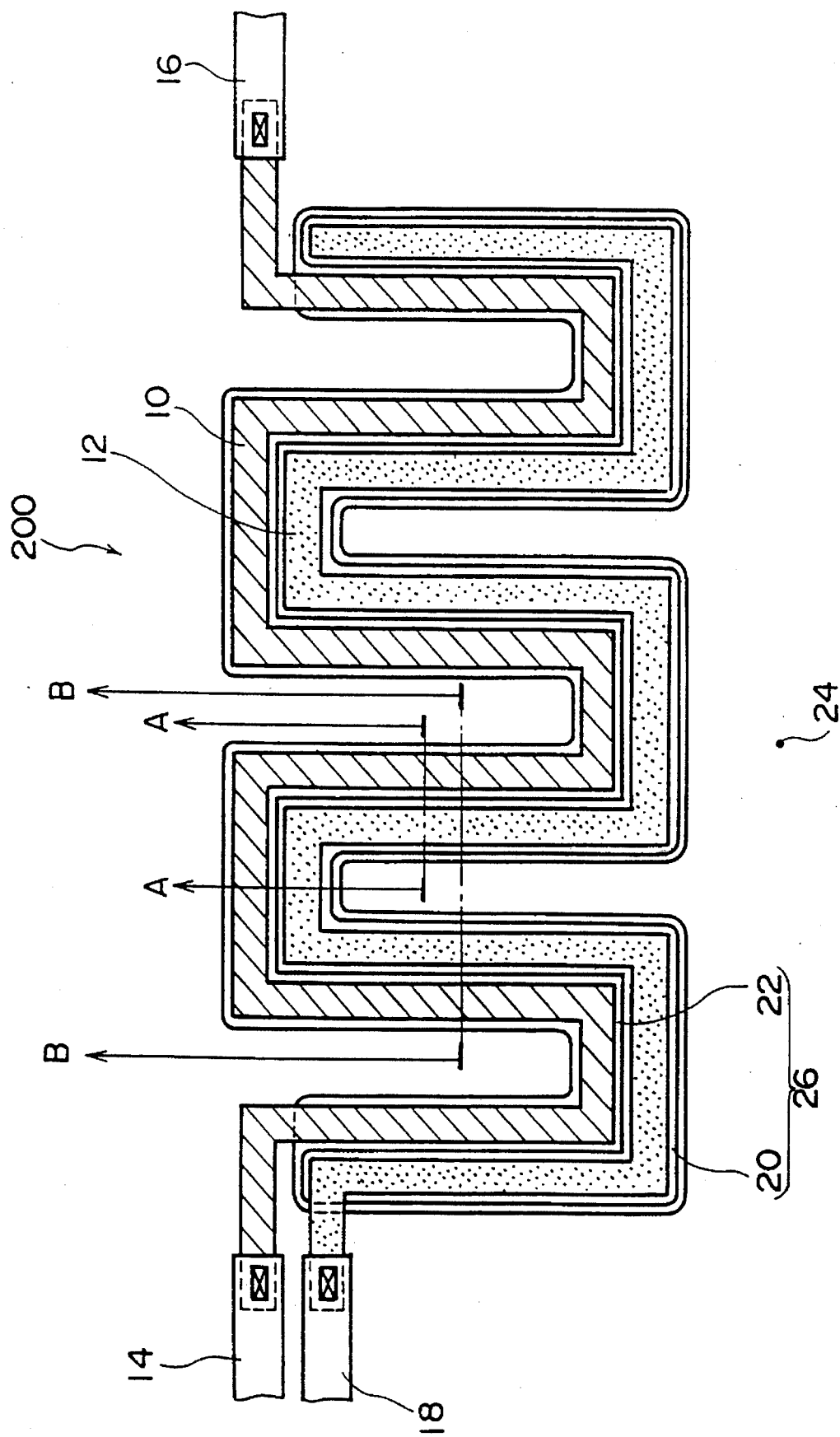
FIG. 7 is a plan view of an LC element in accordance with a second embodiment of this invention.
Figure 8:
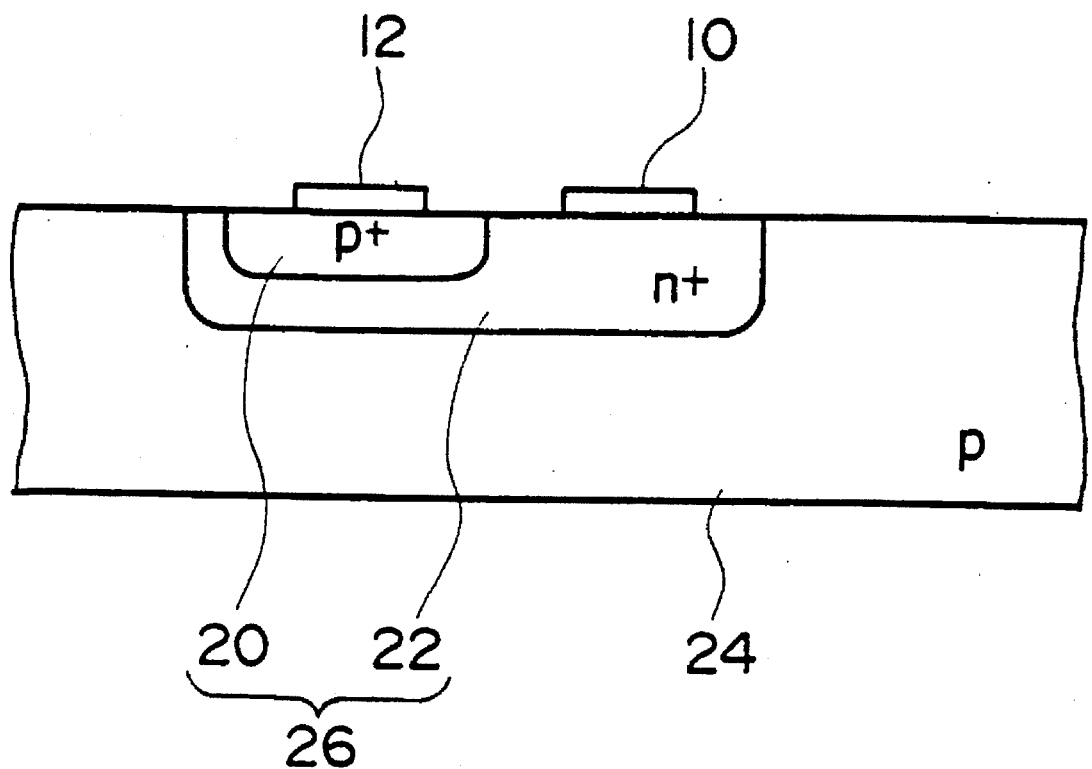
FIG. 8 is an enlarged cross-sectional view viewed along line A—A in FIG. 7.

FIG. 7 is a plan view of an LC element 200 according to the second embodiment. FIG. 8 is an enlarged cross-sectional view viewed along line A—A in FIG. 7.

Figure 9:
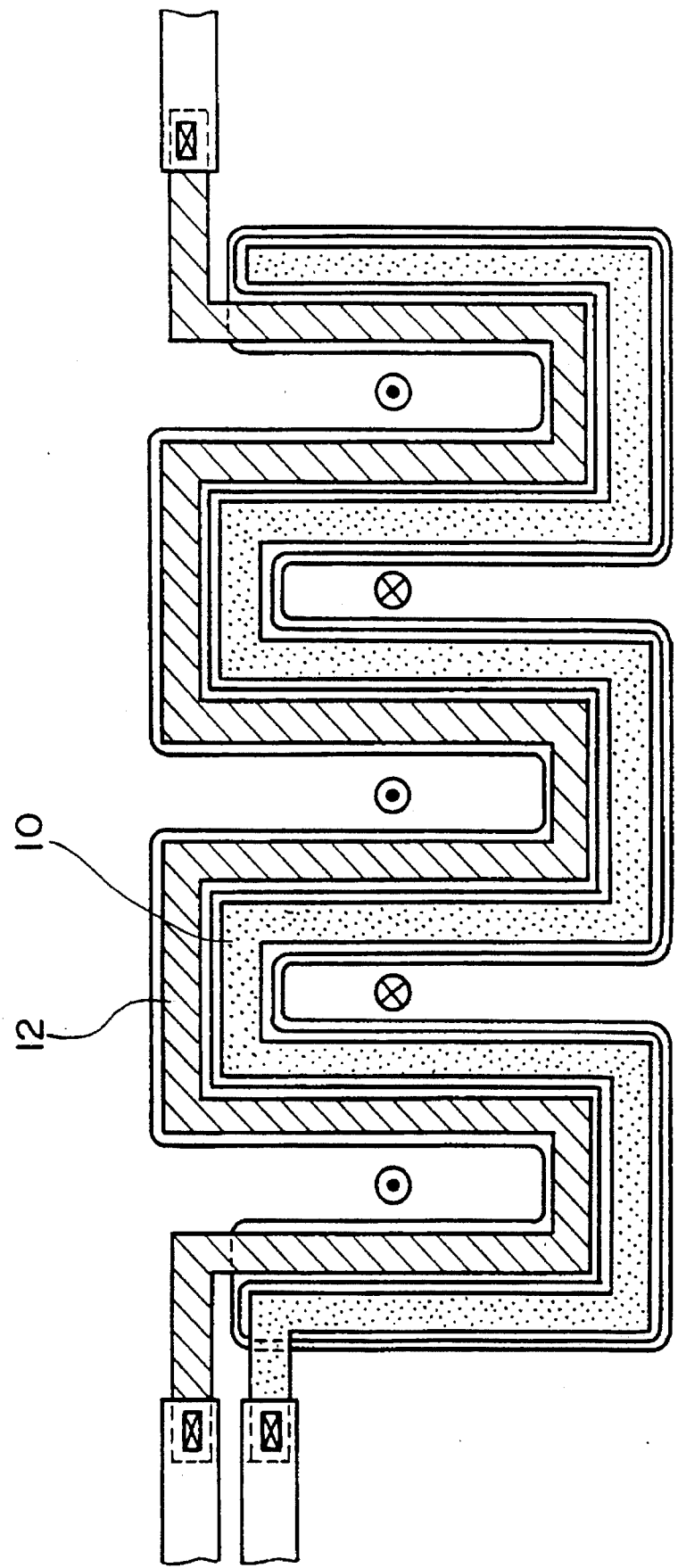
FIG. 9 indicates the principle of an inductor formed by a meander shaped electrode.

FIG. 9 indicates the principle of an inductor formed by a meander shaped electrode. As indicated in the figure, when current flows in a single direction in an electrode 10 or 12 having a meander shape with concave and convex bends, magnetic flux is alternately generated so as to reverse the direction in adjacent concave and convex portions (in FIG. 9, arrow-head and arrow-tail like symbols indicates magnetic fluxes of one and the other directions, respectively), thereby resembling the state when ½ turn coils are connected in series. Consequently, the overall LC element 200 can be made to function as an inductor having a predetermined inductance in the same manner as the spiral shaped electrodes of the first embodiment.

Figure 10:
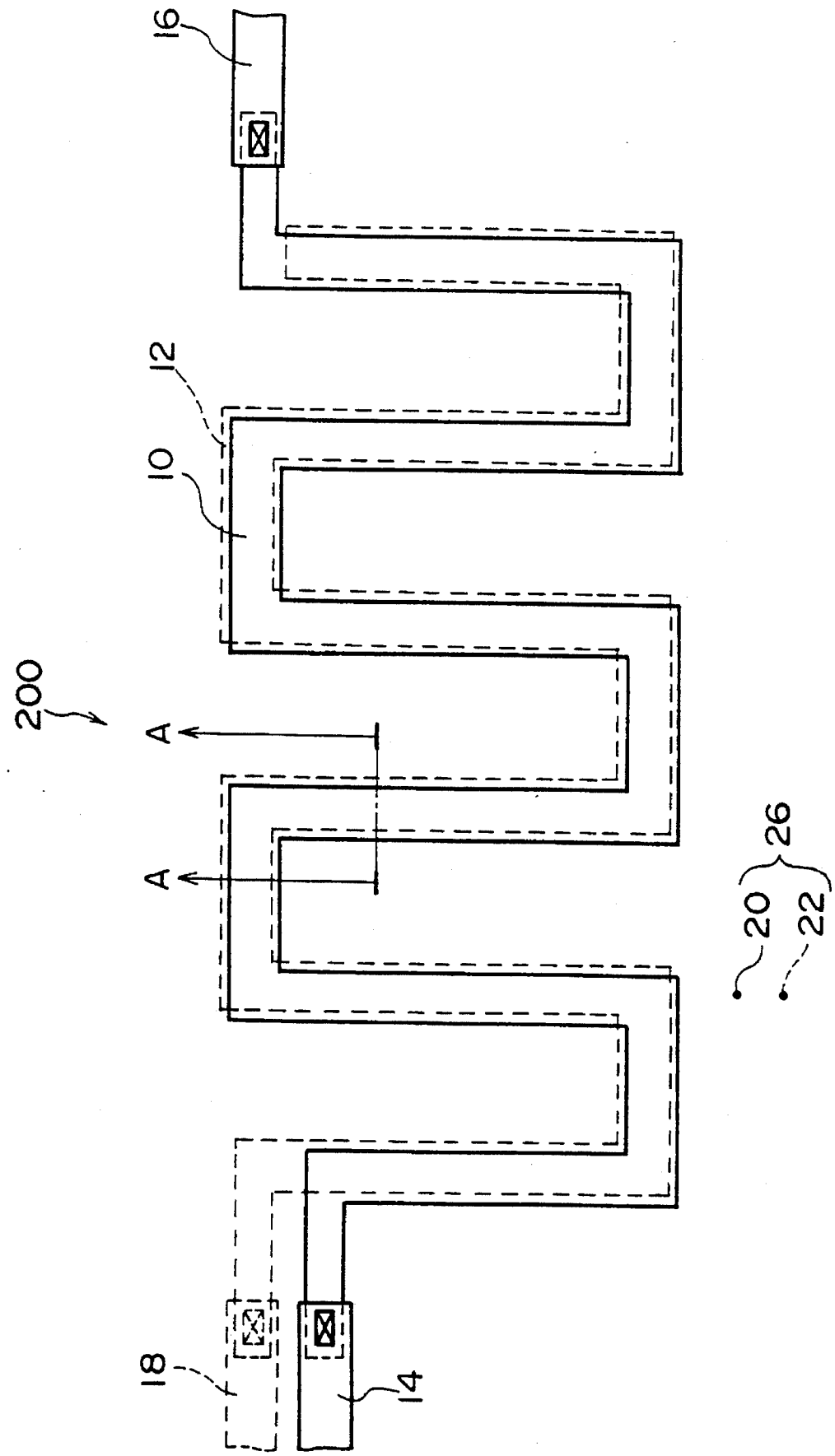
FIG. 10 indicates an example of a variation of the second embodiment wherein first and second electrodes are arranged in essentially opposing positions on opposite sides of a p-Si substrate.

FIG. 10 indicates an example of a variation of the second embodiment whereby the second electrode 12 is disposed essentially in opposition to the first electrode 10 on the opposite face (rear) of the p-Si substrate 24. For the sake of convenience, the rear electrode shape is shifted slightly toward the upper left in the plan view. Also, the enlarged cross-sectional view of FIG. 6 also applies to FIG. 10 viewed along line A—A. In this manner, even though the two 10 and 12 are disposed essentially in opposition through the pn junction layer 26, in the same manner as the LC element 200 indicated in FIGS. 7 and 8, the first and second electrodes 10 and 12 respectively function as inductors, while formation of a distributed constant type capacitor between these is unchanged, thereby providing such advantages as excellent attenuation characteristics and easy manufacture.

In this manner, the first and second electrodes 10 and 12 respectively comprise inductors and by using the non-spiral shaped pn junction layer 26 formed along these electrodes with reverse bias, the function as a capacitor is obtained. In addition, since the pn junction layer 26 is formed over the entire length of the first and second electrodes 10 and 12, inductances L1 and L2 are respectively formed by the first and second electrodes 10 and 12, and a distributed constant type capacitance C is formed by the pn junction layer 26.

Consequently, by connecting the ground electrode 18 provided at one end of the second electrode 12 to the ground or a fixed potential and using the first electrode 10 as the signal transmission line, an LC element is comprised having excellent attenuation characteristics over a wide band with respect to an input signal.

As mentioned above, since the LC element 200 can be manufactured by using ordinary bipolar transistor and similar manufacturing technology, manufacturing is both easy and applicable to such objectives as down-sizing. Also, when the LC element is manufactured as a portion of a semiconductor substrate, wiring with other components on the same semiconductor substrate can also be performed simultaneously, making assembly work in subsequent processing unnecessary.

Also, by changing the reverse bias voltage applied to the pn junction layer 26, the capacitance C of the distributed constant type capacitor can be variably controlled and the overall frequency response of the LC element 200 can be adjusted or changed.

In addition, since the first and second electrodes 10 and 12 are non-spiral shapes, input/output signal wiring can be performed on the same plane as the first and second electrodes 10 and 12 without crossing.

Also, in the case of spiral shaped first and second electrodes 10 and 12, one respective end of each electrode is positioned at the center portion and the other end at the outer circumference portion of the LC element. In contrast, in the case of the LC element 200 of this embodiment, both respective ends of the meander shaped first and second electrodes 10 and 12 are positioned at outer peripheral portions of the LC element, thereby rendering convenient conditions for providing terminals or connection to other circuit elements.

THIRD EMBODIMENT

Following is a description of an LC element in accordance with a third embodiment of this invention with reference to the attached drawings.

Figure 11:
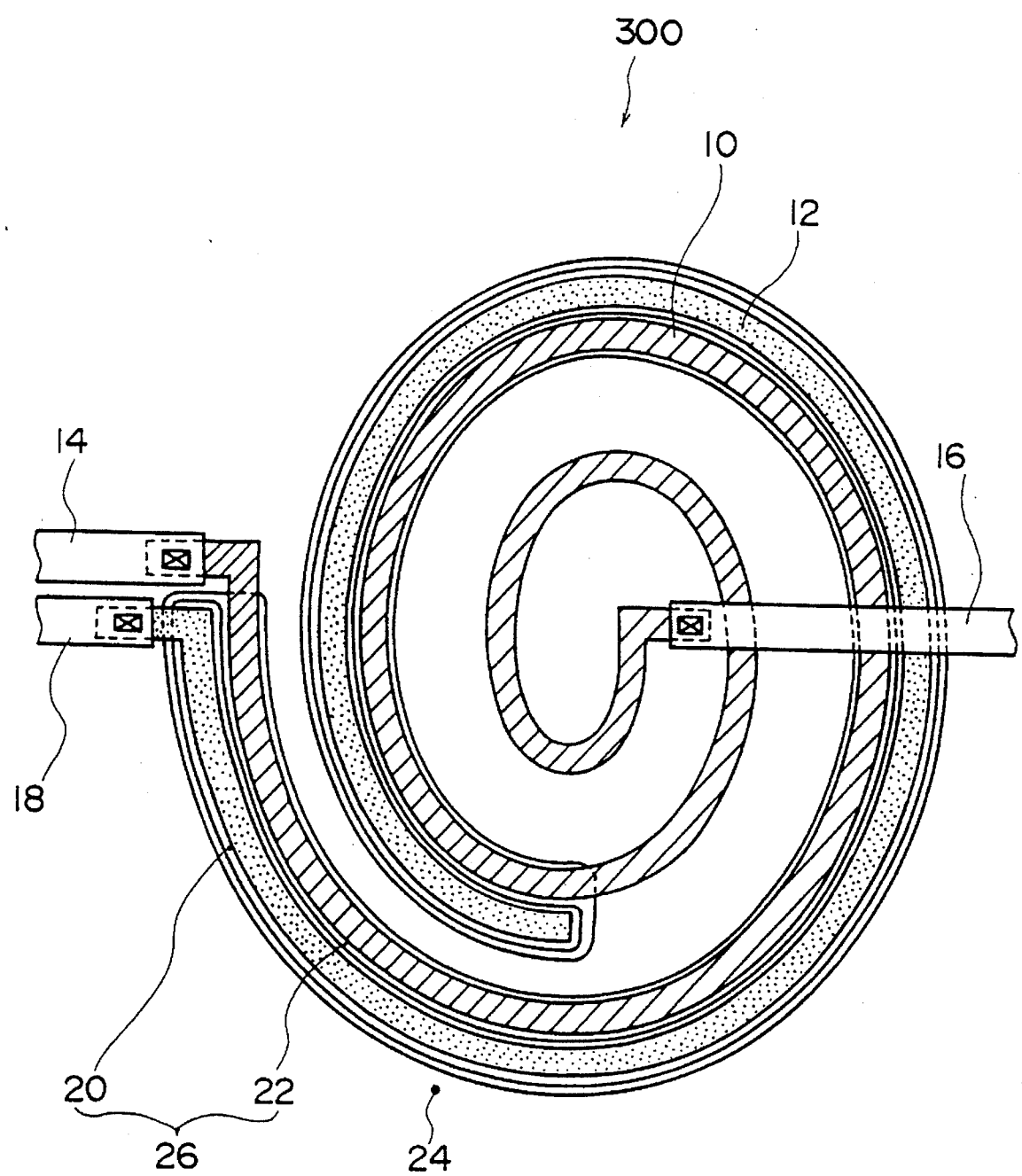
FIG. 11 is a plan view of an LC element in accordance with a third embodiment of this invention.

FIG. 11 is a plan view of an LC element 300 according to the third embodiment. In the case of the above described LC element 100 of the first embodiment, the spiral shaped first and second electrodes 10 and 12 are formed essentially in parallel over their entire length and therefore at essentially the same length. In the case of the LC element 300 of the present embodiment, the second electrode 12 and the corresponding pn junction layer 26 are formed shorter than those of the first embodiment indicated in FIG. 1.

As indicated in FIG. 11, even though the second electrode 12 and pn junction layer 26 are portionally omitted, since an inductor is formed by the shortened second electrode 12 and a distributed constant type capacitor is formed by the shortened pn junction layer 26, excellent attenuation characteristics are obtained in the similar manner as the LC element 100 indicated in FIG. 1.

Figure 12A:
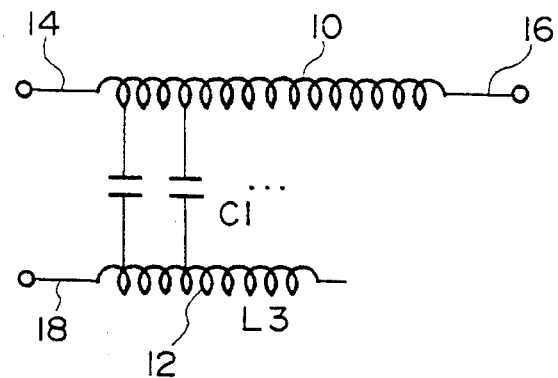
FIGS. 12A, 12B and 12C are schematic diagrams indicating equivalent circuits of LC elements in accordance with the third embodiment.

FIG. 12A shows an equivalent circuit of the LC element 300. As indicated in the figure, the inductance L3 is reduced by only the extent the second electrode 12 turns are reduced, while the corresponding distributed constant type capacitance C1 is also reduced.

Figure 12B:
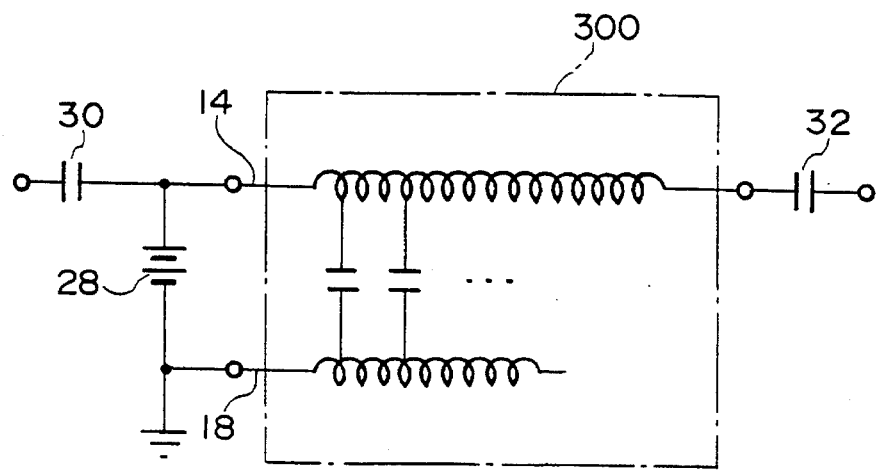
Figure 12C:
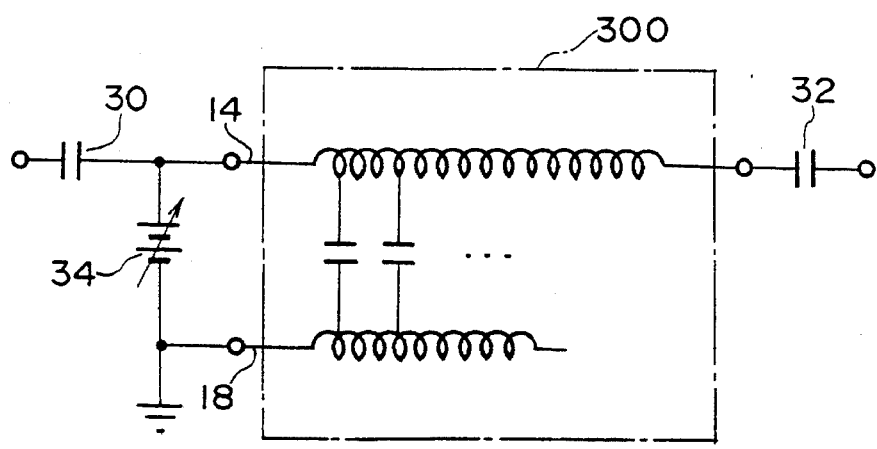

As indicated in FIGS. 12B and 12C, by inserting a bias power supply 28 (or a variable bias power supply 34) between the input/output electrode 14 and the ground electrode 18 and inserting capacitors 30, 32 at the signal transmission line input and output sides, the pn junction layer 26 reverse bias can be securely realized. By variably controlling this reverse bias voltage, the characteristic can be changed in the same manner as the above described embodiments.

In this manner, by forming either one of the first and second electrodes 10 and 12 shorter than the other, and forming the pn junction layer 26 between these, distributed constant type inductors and capacitor are produced and functions as an element having excel lent attenuation characteristics can be obtained. Also, advantages of the LC element 300 which are the same as those of the LC element 100 and others of the above described embodiments include capability of manufacture by using semiconductor manufacturing technology and formation as a portion of an LSI or other device, in which case, wiring work in subsequent processing can be abbreviated.

Figure 13:
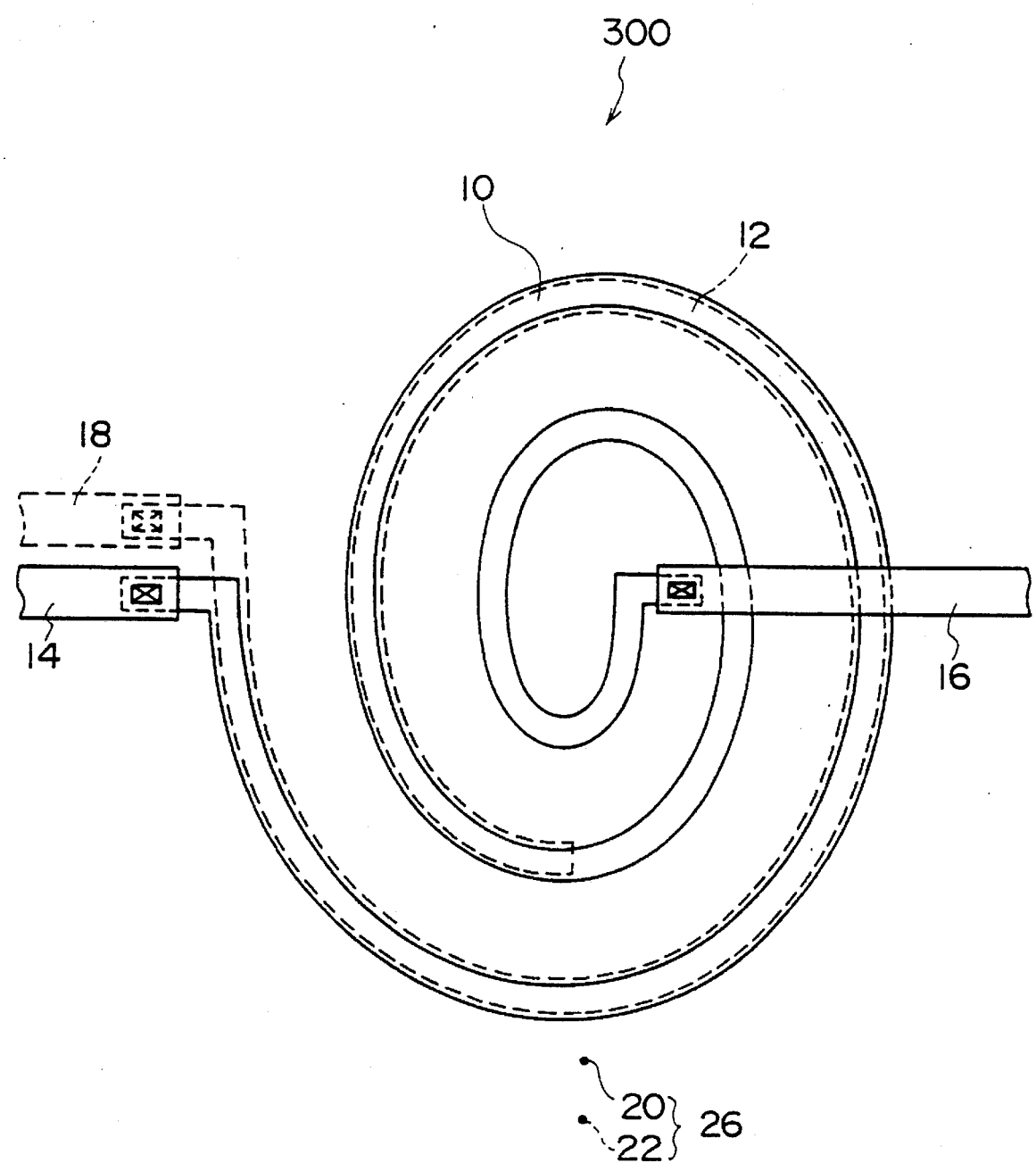
FIG. 13 indicates an example of a variation of the third embodiment wherein first and second electrodes are arranged in essentially opposing positions on opposite sides of a p-Si substrate.

FIG. 13 indicates an example of a variation of the third embodiment whereby the second electrode 12 is disposed essentially in opposition to the first electrode 10 on the opposite face of the p-Si substrate 24. For the sake of convenience, the rear electrode shape is shifted slightly toward the upper left in the plan view. As indicated in the figures, even though the differing length spiral shaped electrodes 10 and 12 are disposed essentially in opposition, in the same manner as the LC element 300 indicated in FIG. 11, the first and second electrodes 10 and 12 respectively function as inductors, while formation of a distributed constant type capacitor between these is unchanged, thereby providing such advantages as excellent attenuation characteristics and easy manufacture.

The portion of the LC element effectively operating as a capacitor for AC current flow is only the spiral shaped pn junction layer 26 positioned near the mutually opposing electrodes, in the same manner as described for the LC element of the first embodiment variation.

FOURTH EMBODIMENT

An LC element in accordance with a fourth embodiment of this invention differs from the third embodiment mainly by using non-spiral shapes for the first and second electrodes 10 and 12, and the pn junction layer 26. In the figures, the same designations are used for items that correspond to those of the third embodiment.

Figure 14:
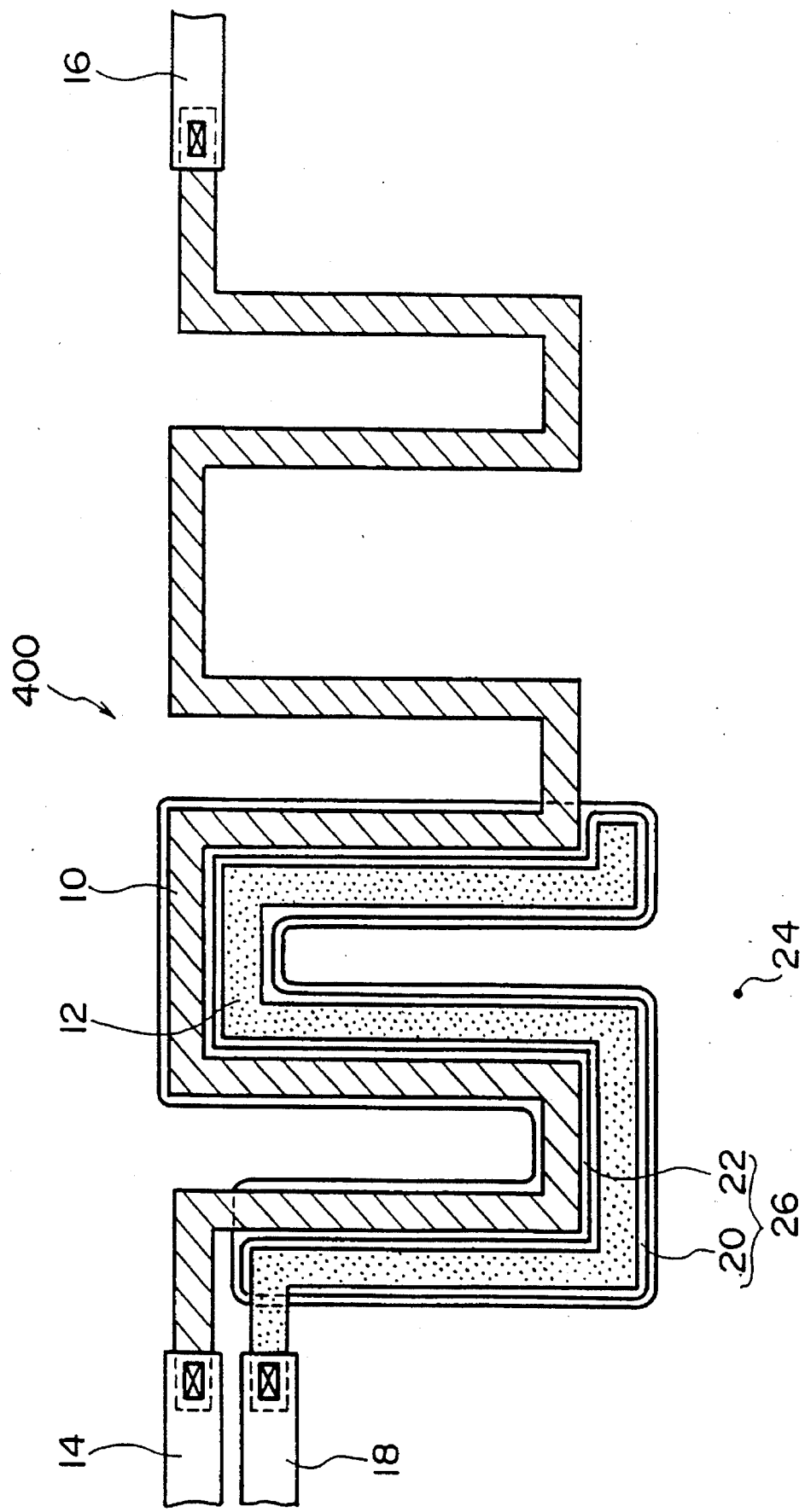
FIG. 14 is a plan view of an LC element in accordance with a fourth embodiment of this invention.

FIG. 14 is a plan view of an LC element 400 according to the fourth embodiment. In the case of the above described LC element 200 of the second embodiment, the meander shaped first and second electrodes 10 and 12 are formed essentially in parallel over their entire length and therefore at essentially the same length. In the case of the LC element 400 of the present embodiment, the second electrode 12 and the corresponding pn junction layer 26 are formed shorter than those of the second embodiment indicated in FIG. 7.

Except for the inductance and capacitance values, the LC element 400 equivalent circuit is the same as the third embodiment indicated in FIG. 12A. As indicated in FIG. 12A, the inductance L3 is reduced by only the extent the second electrode 12 concave and convex bends are reduced, while the corresponding distributed constant type capacitance C1 is also reduced.

As indicated in the figure, even though the second electrode 12 and pn junction layer 26 are portionally omitted, since an inductor is formed by the shortened second electrode 12 and a distributed constant type capacitor is formed by the shortened pn junction layer 26, excellent attenuation characteristics are obtained in the similar manner as the LC element 200 indicated in FIG. 7.

As indicated in FIGS. 12B and 12C of the third embodiment, by inserting a bias power supply 28 (or a variable bias power supply 34) between the input/output electrode 14 and the ground electrode 18 and inserting capacitors 30, 32 at the signal transmission line input and output sides, the pn junction layer 26 reverse bias can be securely realized. By variably controlling this reverse bias voltage, the capacitance C of the distributed constant type capacitor can be variably controlled and the overall frequency response of the LC element 400 can be adjusted or changed in the same manner as the above described embodiments.

Figure 15:
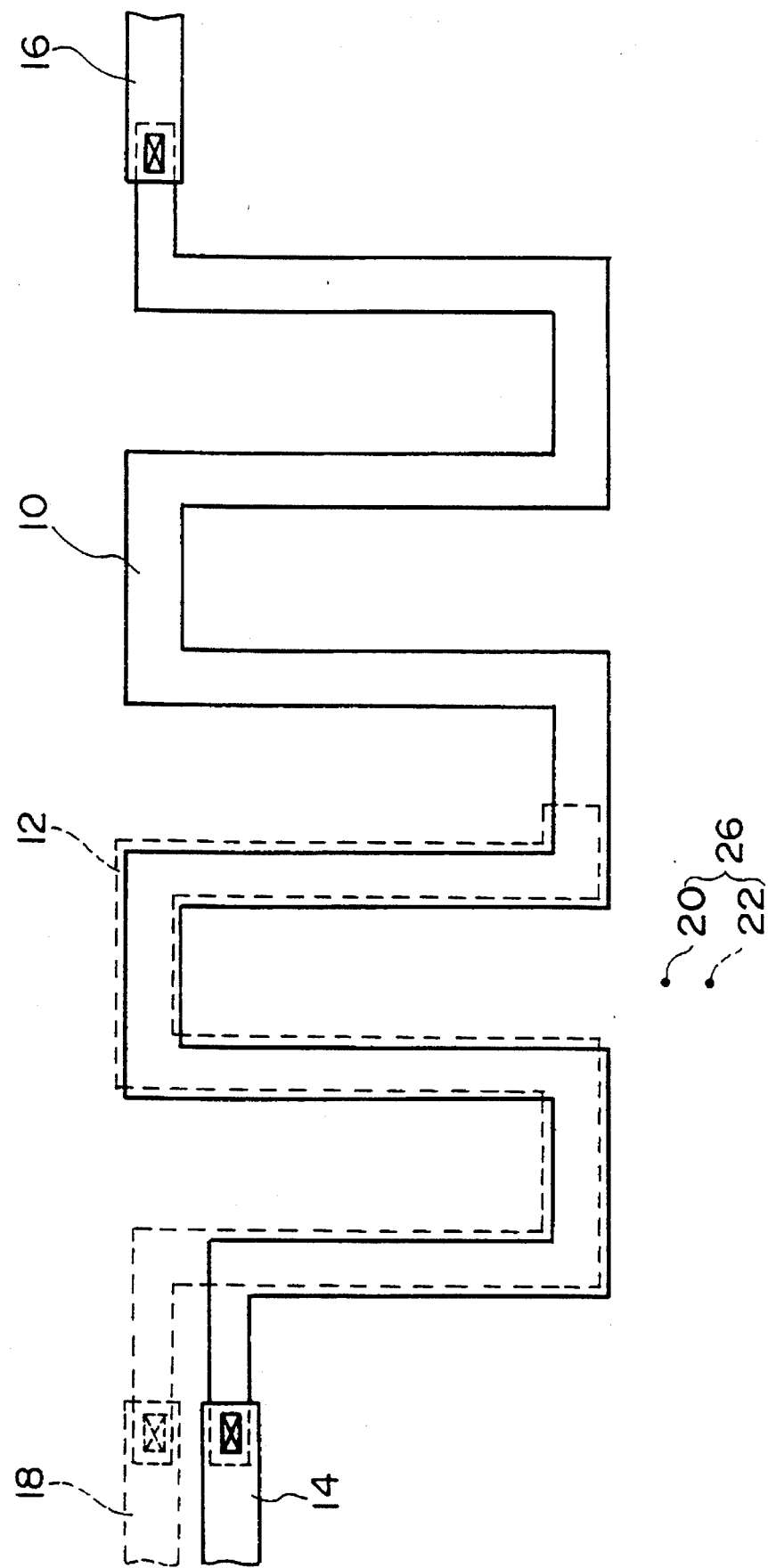
FIG. 15 indicates an example of a variation of the fourth embodiment wherein first and second electrodes are arranged in essentially opposing positions on opposite sides of a p-Si substrate.

Also, as indicated in FIG. 15, in the same manner as the above described embodiments, the second electrode 12 can be disposed on the reverse face of the p-Si substrate 24 essentially in opposition to the first electrode 10. For the sake of convenience, the rear electrode shape is shifted slightly toward the upper left in the plan view. As indicated in the figure, even though the differing length non-spiral shaped first and second electrodes 10 and 12 are disposed essentially in opposition, in the same manner as the LC element 400 indicated in FIG. 14, the first and second electrodes 10 and 12 respectively function as inductors, while formation of a distributed constant type capacitor between these is unchanged, thereby providing the same advantages such as excellent attenuation characteristics as mentioned for the FIG. 14 embodiment.

Also, advantages of the LC element 400, which are the same as the LC elements of the above described embodiments, include capability of manufacture by using semiconductor manufacturing technology and formation as a portion of an LSI or other device, in which case, wiring work in subsequent processing can be abbreviated.

In addition, since the first and second electrodes 10 and 12 are non-spiral shapes, input/output signal wiring for the first and second electrodes 10 and 12 can be performed on the same plane without crossing electrodes.

Also, in the case of spiral shaped first and second electrodes 10 and 12, one respective end of each electrode is positioned at the center portion and the other end at the outer circumference portion of the LC element. In contrast, in the case of the LC element 400 of this embodiment, both respective ends of the meander shaped first and second electrodes 10 and 12 are positioned at outer peripheral portions of the LC element, thereby rendering convenient conditions for providing terminals or connection to other circuit elements.

FIFTH EMBODIMENT

Following is a description of an LC element 500 in accordance with a fifth embodiment of this invention with reference to the attached drawings.

The LC elements 100 and others of the above described embodiments function as three-terminal normal mode elements. In contrast, the LC element 500 of the fifth embodiment functions as a four-terminal common mode element.

Figure 16:
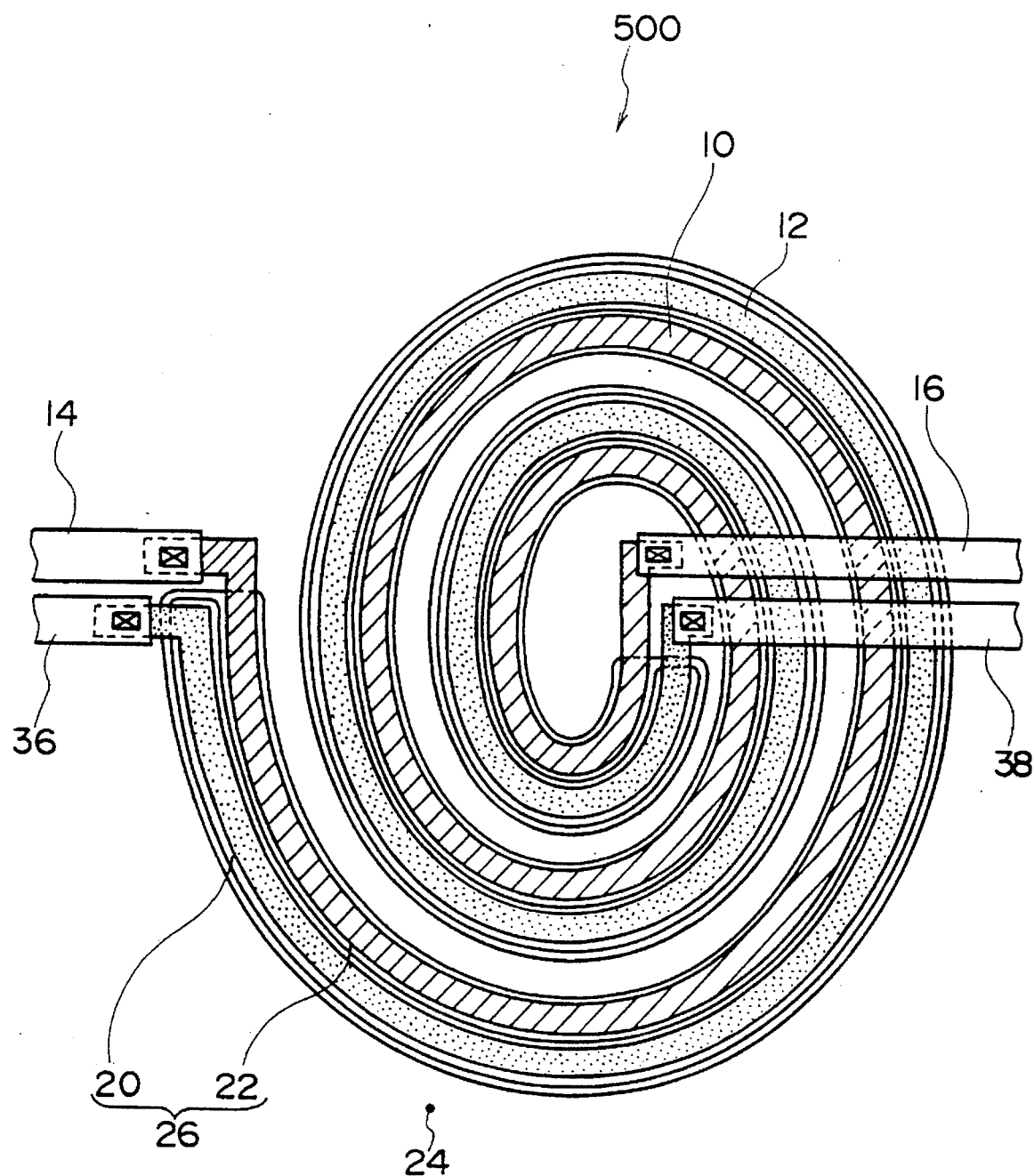
FIG. 16 is a plan view of an LC element in accordance with a fifth embodiment of this invention.

FIG. 16 is a plan view of an LC element 500 according to the fifth embodiment. As indicated in the figure, input/output electrodes 36 and 38 are connected to the respective ends of the spiral shaped second electrode 12. This point differs from the LC element 100 indicated in FIG. 1.

Figure 17A:
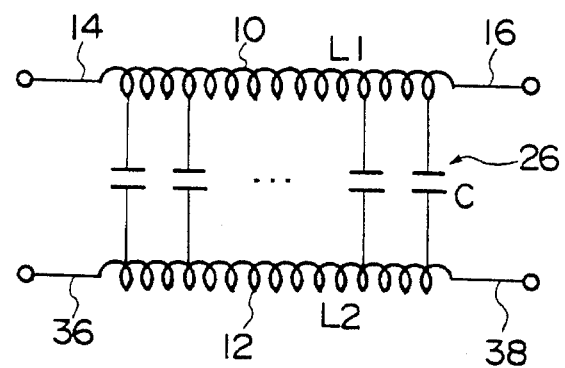
FIGS. 17A, 17B and 17C are schematic diagrams indicating equivalent circuits of LC elements in accordance with the fifth embodiment.

FIG. 17A indicates an equivalent circuit of the LC element 500. As indicated in the figure, the first electrode 10 formed between the two input/output electrodes 14 and 16 functions as an inductor with inductance L1, while the second electrode 12 formed between the two input/output electrodes 36 and 38 functions as an inductor with inductance L2. Between these two inductors, in the same manner as the LC element 100 of the first embodiment, the pn junction layer 26 forms a distributed constant type capacitor with capacitance C.

In this manner, by not only providing input/output electrodes 14 and 16 for the first electrode 10, but by also providing input/output electrodes 36 and 38 at the respective ends of the second electrode 12, the LC element 500 can function as a four-terminal common mode type element with excellent attenuation characteristics.

Since the pn junction layer 26 functions as a capacitor when the first electrode 10 relative potential is at high reverse bias with respect to the second electrode 12, in order for operation as an above mentioned four-terminal common mode type element, the input signal level at the first electrode 10 needs to be set higher than the input signal level at the second electrode 12.

Figure 17B:
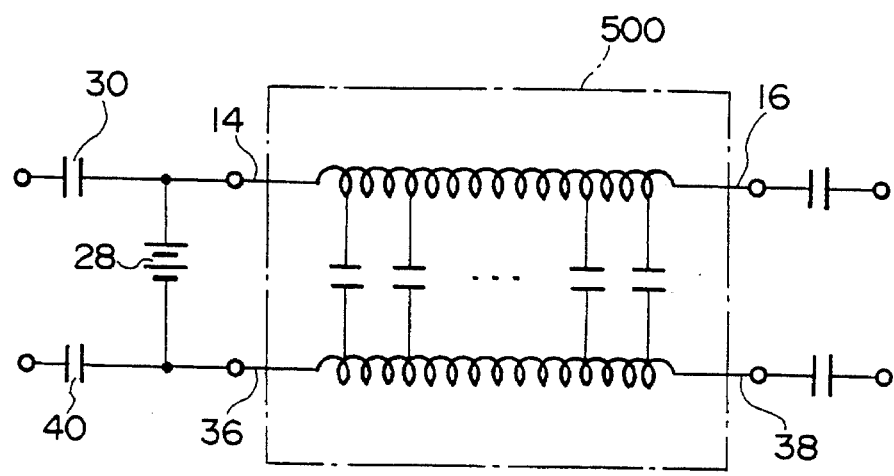

FIG. 17B shows an example of forcibly applying reverse bias voltage between the first and second electrodes 10 and 12. This reverse bias voltage is applied by the bias power supply 28. Also, in the case of this embodiment, since input signals are applied to both input/output electrodes 14 and 36, in addition to the capacitor 30 used in the first embodiment, a capacitor 40 is connected to the input/output electrode 36 side.

In this manner, by using the capacitors 30 and 40, the DC components of the respective input signals to the input/output electrodes 14 and 36 are removed and only the AC components of the respective signals are overlapped on the reverse bias voltage applied from the bias power supply 28 for input to the LC element 500.

Consequently, reverse bias voltage can be securely applied with respect to the pn junction layer 26 for forming distributed constant type capacitors as well as inductors. As a result, excellent attenuation characteristics can be obtained.

Figure 17C:
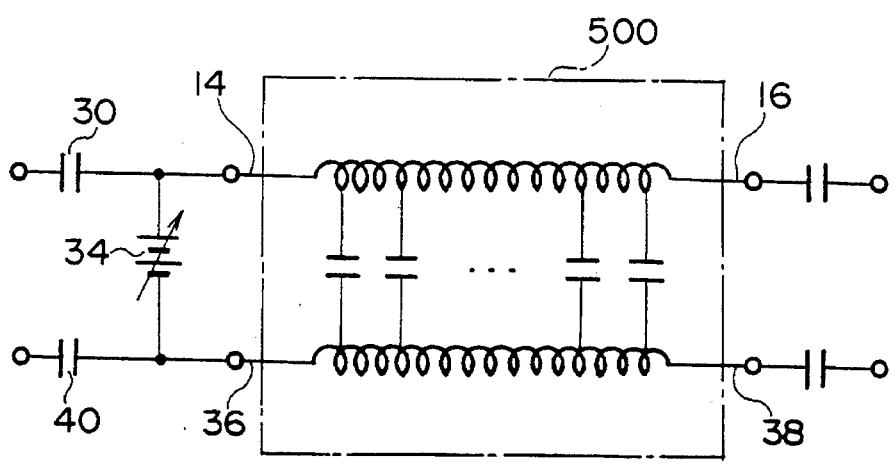

FIG. 17C shows an example of replacing the bias power supply 28 of FIG. 17B with a variable bias power supply 34. The reverse bias voltage from the variable bias power supply 34 can be varied, thereby varying the capacitance C of the pn junction layer 26 and varying the overall characteristics of the LC element 500.

Figure 18:
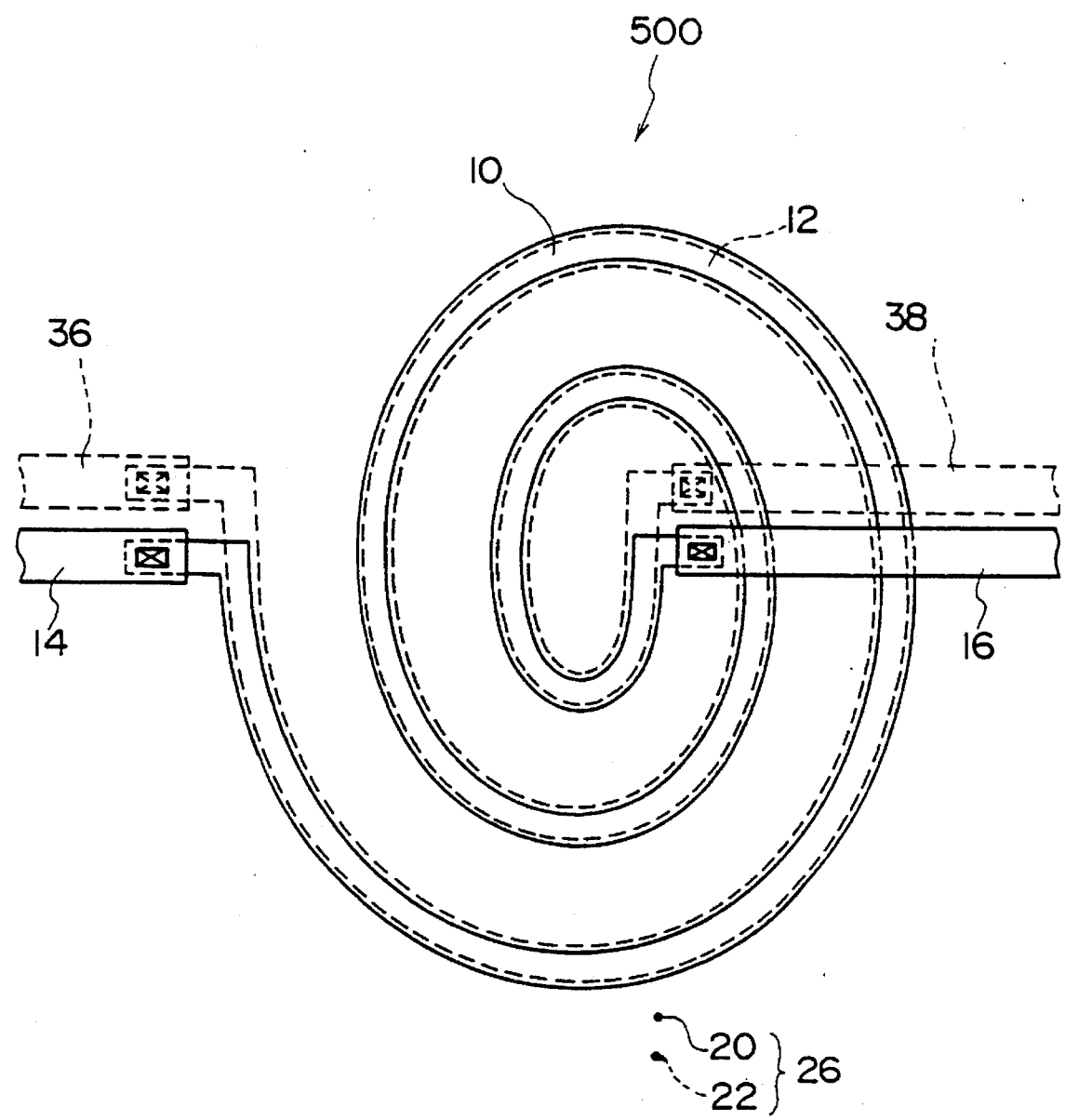
FIG. 18 indicates an example of a variation of the fifth embodiment wherein first and second electrodes are arranged in essentially opposing positions on opposite sides of a p-Si substrate.

FIG. 18 indicates an example of a variation of the fifth embodiment whereby the second electrode 12 is disposed essentially in opposition to the first electrode 10 on the opposite face of the p-Si substrate 24. For the sake of convenience, the rear electrode shape is shifted slightly toward the upper left in the plan view. As indicated in the figure, even though the spiral shaped first and second electrodes 10 and 12 are disposed essentially in opposition, in the same manner as the LC element 500 indicated in FIG. 16, the first and second electrodes 10 and 12 respectively function as inductors, while a distributed constant type capacitor is formed between these to comprise a four-terminal common mode type element having such advantages as excellent frequency characteristics and easy manufacture.

The cross-sectional construction of this LC element is the same as the first embodiment variation indicated in FIG. 6. The portion of the LC element effectively operating as a capacitor for AC current flow is only the spiral shaped pn junction layer 26 positioned near the mutually opposing electrodes, in the same manner as described for the LC element of the first embodiment variation.

Although the foregoing description is given in correspondence with the LC element 100 of the first embodiment wherein the first and second electrodes are of equal length, in correspondence with the LC element 300 of the third embodiment as well, wherein the first and second electrodes are of different length, a four-terminal common mode LC element can be comprised in the same manner.

Also, advantages of the LC element 500, which are the same as the LC elements of the above described embodiments, include capability of manufacture by using semiconductor manufacturing technology and formation as a portion of an LSI or other device, in which case, wiring work in subsequent processing can be abbreviated.

SIXTH EMBODIMENT

An LC element in accordance with a sixth embodiment of this invention is essentially the same as that of the fifth embodiment, but differs from the fifth embodiment mainly in using non-spiral shapes for the first and second electrodes 10 and 12, and the pn junction layer 26. In the figures, the same designations are used for items that correspond to those of the fifth embodiment.

Figure 19:
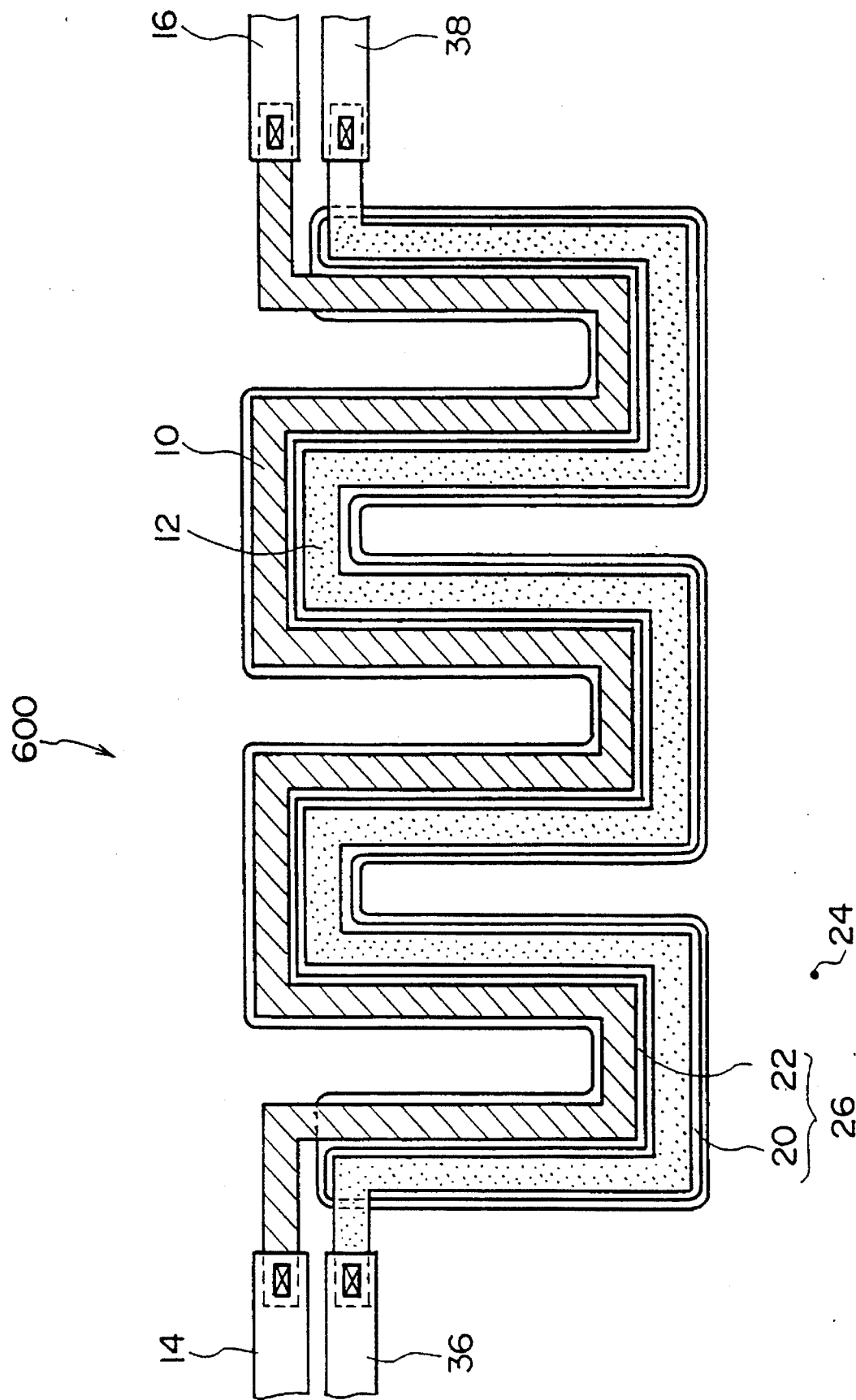
FIG. 19 is a plan view of an LC element in accordance with a sixth embodiment of this invention.

FIG. 19 is a plan view of an LC element 600 according to the sixth embodiment. As indicated in the figure, input/output electrodes 36 and 38 are connected to the respective ends of the non-spiral shaped second electrode 12. This point differs from the LC element 200 indicated in FIG. 7.

Except for the inductance and capacitance values, the LC element 600 equivalent circuit is the same as the fifth embodiment indicated in FIG. 17A. As indicated in the figure, the first electrode 10 formed between the two input/output electrodes 14 and 16 functions as an inductor with inductance L1, while the second electrode 12 formed between the two input/output electrodes 36 and 38 functions as an inductor with inductance L2. Between these two inductors, in the same manner as the LC element 100 and others of the foregoing embodiments, the pn junction layer 26 forms a distributed constant type capacitor with capacitance C.

In this manner, by not only providing input/output electrodes 14 and 16 for the first electrode 10, but by also providing input/output electrodes 36 and 38 at the respective ends of the second electrode 12, the LC element 600 can function as a four-terminal common mode type element with excellent attenuation characteristics.

In the same manner as the fifth embodiment, by connecting capacitors and power supplies as indicated in FIGS. 17B and 17C, a fixed or variable reverse bias voltage can be securely applied to the LC element 600 of this embodiment. As a result, in the same manner as the fifth embodiment, the pn junction layer 26 can be securely operated as a capacitor. Also, by using variable reverse bias, the capacitance C of the pn junction layer 26 can be varied, thereby varying the overall characteristics of the LC element 600.

Figure 20:
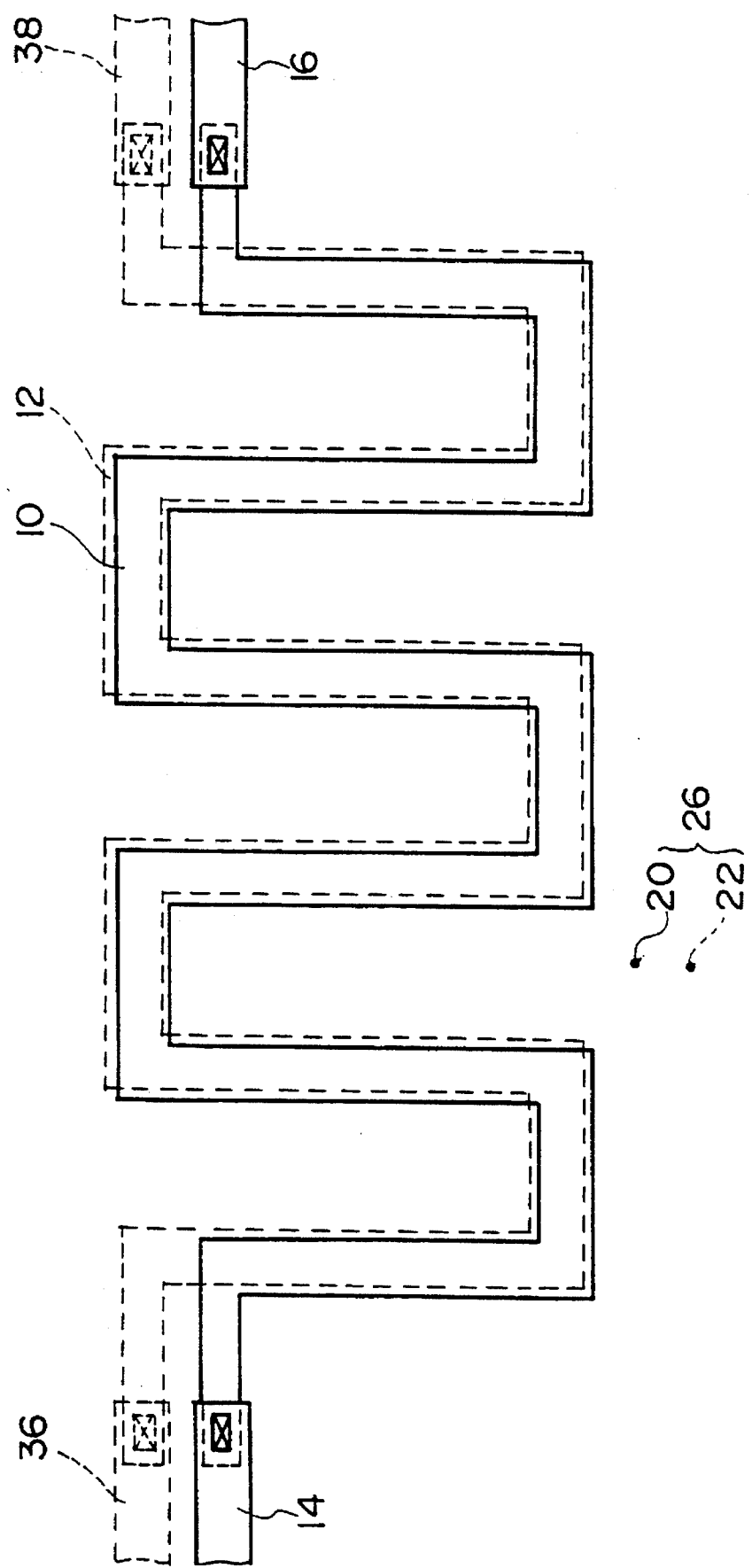
FIG. 20 indicates an example of a variation of the sixth embodiment wherein first and second electrodes are arranged in essentially opposing positions on opposite sides of a p-Si substrate.

In the same manner as the above described embodiments, as indicated in FIG. 20, the second electrode 12 can be disposed essentially in opposition to the first electrode 10 on the opposite face of the p-Si substrate 24. For the sake of convenience, the rear electrode shape is shifted slightly toward the upper left in the plan view. As indicated in the figure, even though the non-spiral shaped first and second electrodes 10 and 12 are disposed essentially in opposition, in the same manner as the LC element 600 indicated in FIG. 19, the first and second electrodes 10 and 12 respectively function as inductors, while a distributed constant type capacitor is formed between these to comprise a four-terminal common mode type element having such advantages as excellent frequency characteristics and easy manufacture.

Although the foregoing description is given in correspondence with the LC element 200 of the second embodiment wherein the first and second electrodes are of equal length, in correspondence with the LC element 400 of the fourth embodiment as well, wherein the first and second electrodes are of different length, a four-terminal common mode LC element can be comprised in the same manner.

Also, advantages of the LC element 600, which are the same as the LC elements of the above described embodiments, include capability of manufacture by using semiconductor manufacturing technology and formation as a portion of an LSI or other device, in which case, wiring work in subsequent processing can be abbreviated.

In addition, since the first and second electrodes 10 and 12 are non-spiral shapes, input/output signal wiring for the first and second electrodes 10 and 12 can be performed on the same plane without crossing electrodes.

Also, in the case of spiral shaped first and second electrodes 10 and 12, one respective end of each electrode is positioned at the center portion and the other end at the outer circumference portion of the LC element. In contrast, in the case of the LC element 600 of this embodiment, both respective ends of the meander shaped first and second electrodes 10 and 12 are positioned at outer peripheral portions of the LC element, thereby rendering convenient conditions for providing terminals or connection to other circuit elements.

SEVENTH EMBODIMENT

Following is a description of an LC element 700 in accordance with a seventh embodiment of this invention with reference to the attached drawings.

The second electrode 12 of the LC elements 100 and others of the above described embodiments comprises a single conductor. In the case of the LC element 700 of the present embodiment, the second electrode 12 is divided into a plurality (for example, 2) of divided electrode segments 12-1 and 12-2.

Figure 21:
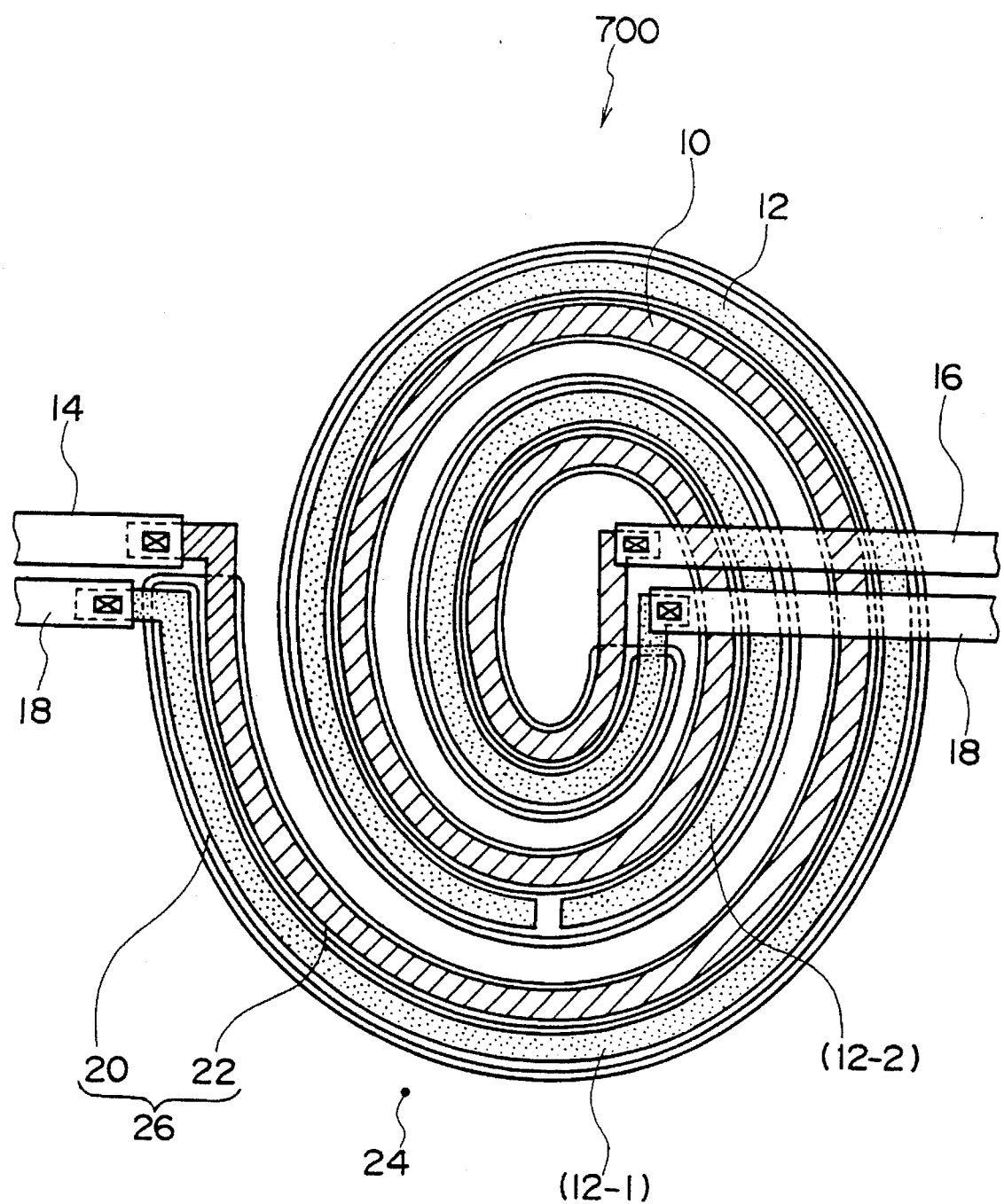
FIG. 21 is a plan view of an LC element in accordance with a seventh embodiment of this invention.

FIG. 21 is a plan view of the LC element 700 according to the seventh embodiment. As indicated in the figure, the second electrode 12 used in the LC element 100 indicated FIG. 1 is replaced by two divided electrode segments 12-1 and 12-2. Ground electrodes 18 are respectively connected to the overall spiral shaped divided electrode segments 12-1 and 12-2. By grounding these ground electrodes 18, each inductor respectively formed by the divided electrode segments 12-1 and 12-2 is grounded at one end. Alternatively, by connecting these ground electrodes 18 to a fixed potential power supply, each inductor respectively formed by the divided electrode segments 12-1 and 12-2 is set to a fixed potential.

Figure 22A:
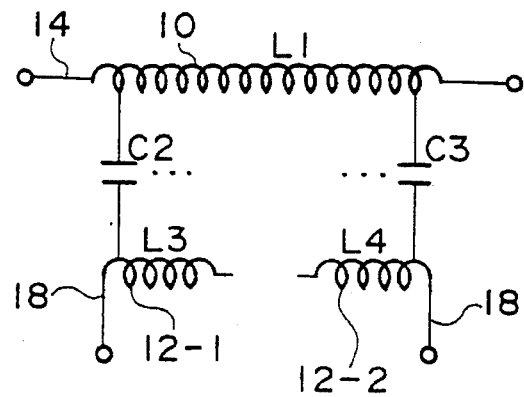
FIGS. 22A, 22B and 22C are schematic diagrams indicating equivalent circuits of LC elements in accordance with the seventh embodiment.

FIG. 22A shows an equivalent circuit of the LC element 700. As indicated in the figure, the first electrode 10 functions as an inductor with an overall inductance L1, while the divided electrode segments 12-1 and 12-2 function as inductors with respective inductances L3 and L4. The pn junction layer 26 between the first electrode 10 and each of the divided electrode segments 12-1 and 12-2 functions as distributed constant type capacitors with respective capacitances C2 and C3.

Figure 22B:
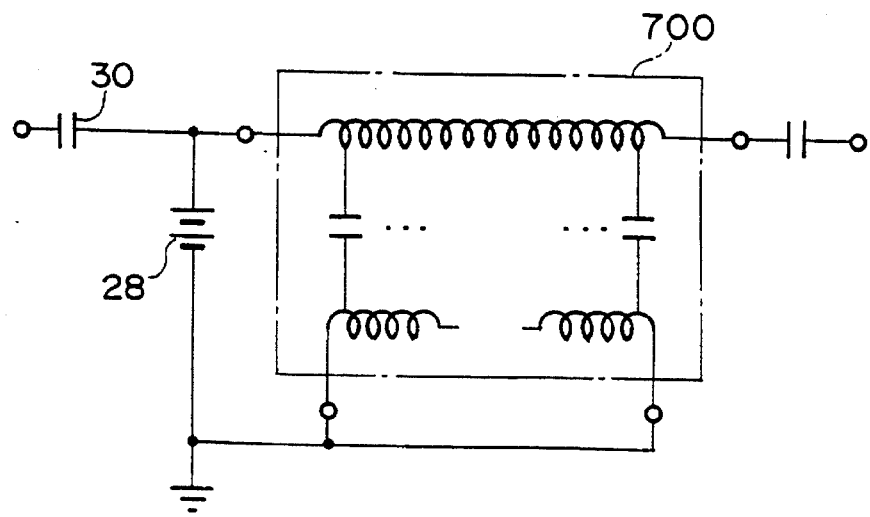
Figure 22C:
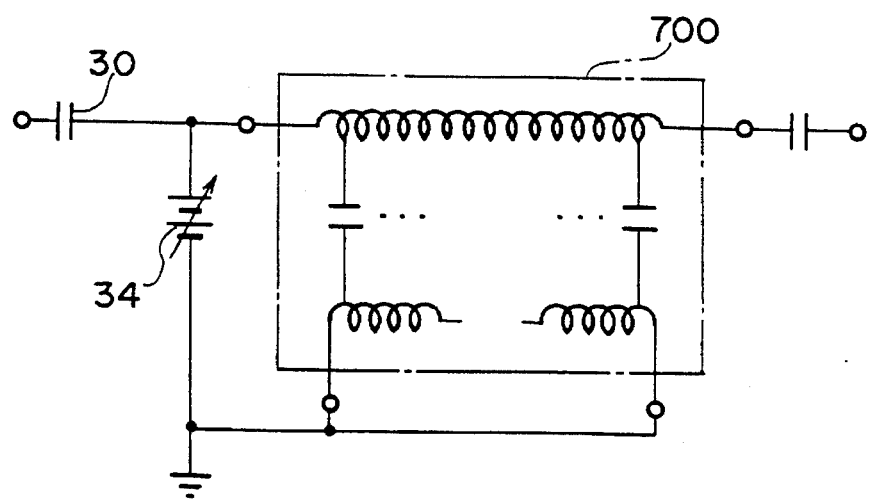

FIGS. 22B and 22C indicate circuit examples for forcibly applying fixed or variable reverse bias voltage. The figures correspond to FIGS. 3B and 3C of the first embodiment. By using these types of circuit construction, the pn junction layer 26 can be securely operated as a capacitor. Also, by using variable reverse bias, the capacitances of the pn junction layer 26 can be varied, thereby varying the overall characteristics of the LC element 700.

In the case of the LC element 700, the respective self inductances L3 and L4 of the divided electrode segments 12-1 and 12-2 are small and have only a small influence on the overall characteristics of the LC element 700. Consequently, the overall characteristics of the LC element are mostly determined by the first electrode 10 inductance L1 and the formed distributed constant type capacitances C2 and C3.

Although division into two segments was described above, the second electrode 12 of the LC element 700 can also be divided into three or more segments. In such cases, as the number of divisions increases, the respective self inductances of the divided segments decreases.

Figure 23:
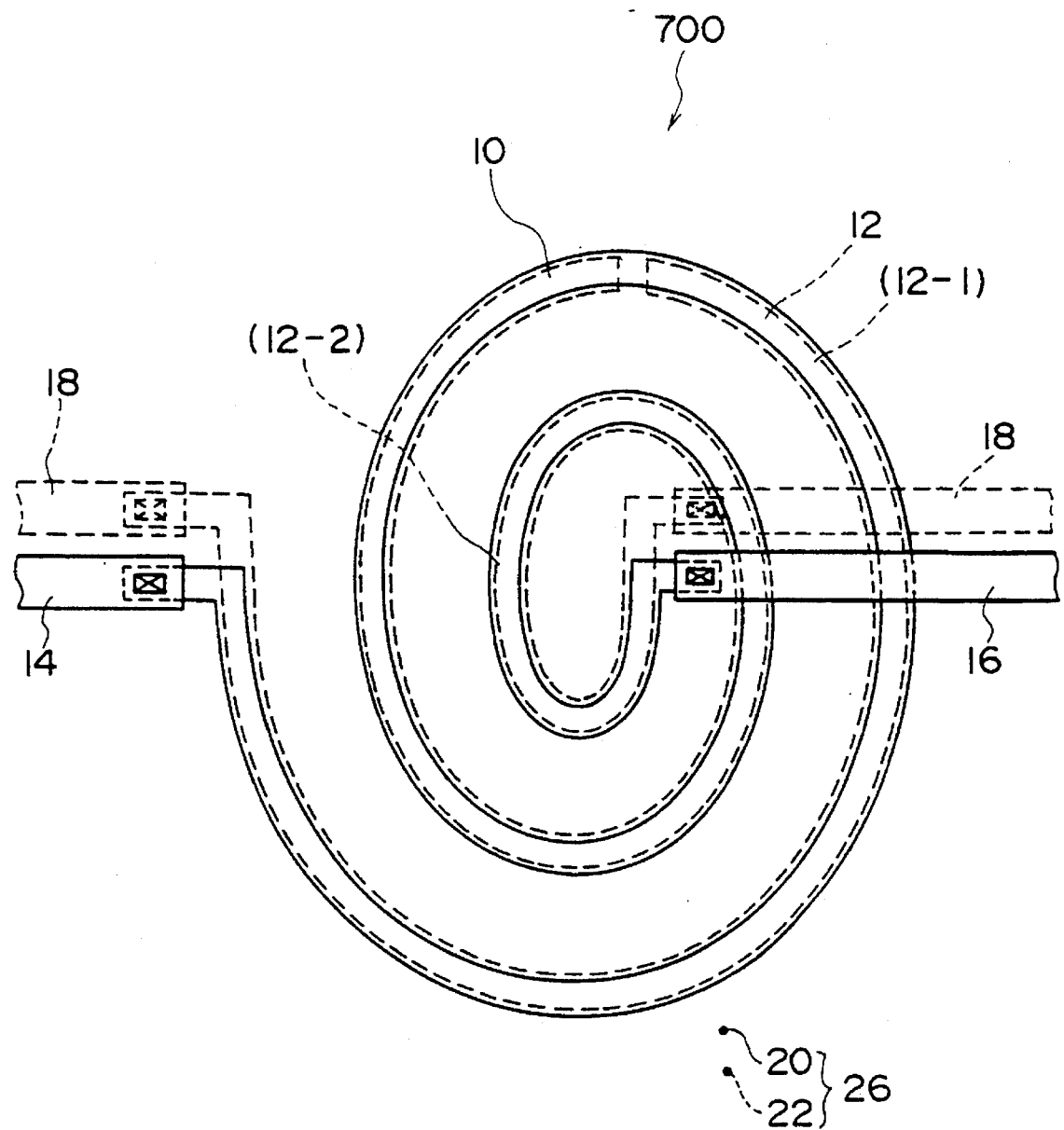
FIG. 23 indicates an example of a variation of the seventh embodiment wherein first and second electrodes are arranged in essentially opposing positions on opposite sides of a p-Si substrate.

FIG. 23 indicates an example of a variation wherein the two divided electrode segments 12-1 and 12-2 are disposed essentially in opposition to the first electrode 10 on the opposite face of the p-Si substrate 24. For the sake of convenience, the rear electrode shape is shifted slightly toward the upper left in the plan view. As indicated in the figures, even though the first spiral shaped electrode 10 and the divided electrode segments 12-1 and 12-2 are disposed essentially in opposition, in the same manner as the LC element 700 indicated in FIG. 21, the first electrode 10 and divided electrode segments 12-1 and 12-2 respectively function as inductors, while formation of a distributed constant type capacitor between these is unchanged, thereby providing such advantages as excellent attenuation characteristics and easy manufacture.

The cross-sectional construction of this LC element is the same as the first embodiment variation indicated in FIG. 6. The portion of the LC element effectively operating as a capacitor for AC current flow is only the spiral shaped pn junction layer 26 positioned near the mutually opposing electrodes, in the same manner as described for the LC element of the first embodiment variation.

Also, advantages of the LC element 700, which are the same as the LC elements of the above described embodiments, include capability of manufacture by using semiconductor manufacturing technology and formation as a portion of an LSI or other device, in which case, wiring work in subsequent processing can be abbreviated.

EIGHTH EMBODIMENT

An LC element in accordance with an eighth embodiment of this invention is essentially the same as that of the seventh embodiment, but differs from the seventh embodiment mainly in using non-spiral shapes for the first and second electrodes 10 and 12, and the pn junction layer 26. In the figures, the same designations are used for items that correspond to those of the seventh embodiment.

Figure 24:
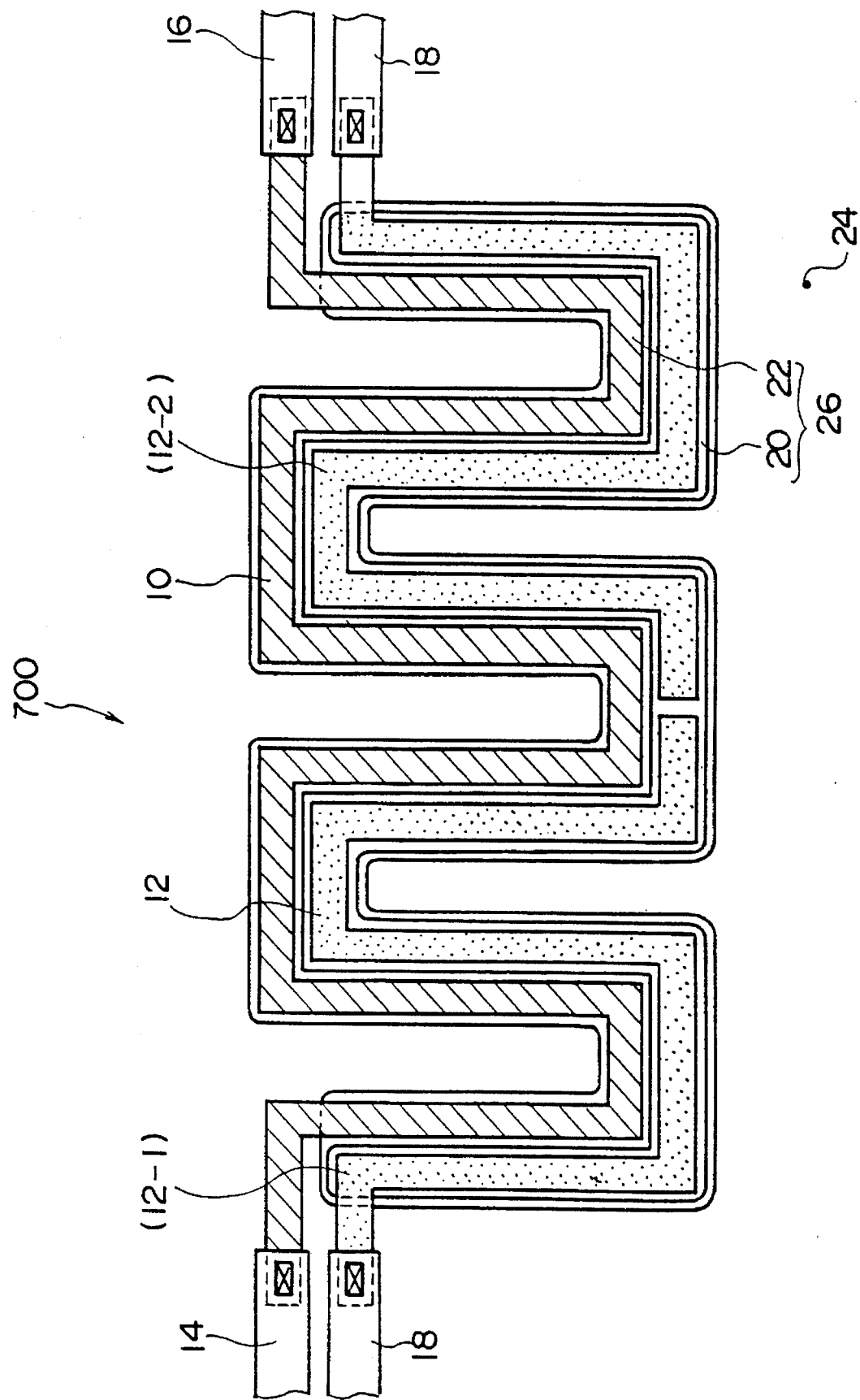
FIG. 24 is a plan view of an LC element in accordance with an eighth embodiment of this invention.

FIG. 24 is a plan view of an LC element 800 according to the eighth embodiment. As indicated in the figure, the second electrode 12 used in the LC element 200 indicated FIG. 7 is replaced by two divided electrode segments 12-1 and 12-2. Ground electrodes 18 are respectively connected to the overall meander shaped divided electrode segments 12-1 and 12-2. By grounding these ground electrodes 18, or by connecting these ground electrodes 18 to a fixed potential power supply, each inductor respectively formed by the divided electrode segments 12-1 and 12-2 is set to a fixed potential.

Except for the inductance and capacitance values, the LC element 800 equivalent circuit is the same as the seventh embodiment indicated in FIG. 22A. As indicated in the figure, the first electrode 10 functions as an inductor with an overall inductance L1, while the divided electrode segments 12-1 and 12-2 function as inductors with respective inductances L3 and L4. The pn junction layer 26 between the first electrode 10 and each of the divided electrode segments 12-1 and 12-2 functions as distributed constant type capacitors with respective capacitances C2 and C3.

In the same manner as the seventh embodiment, by connecting capacitors and power supplies to the LC element of this embodiment as indicated in FIGS. 22B and 22C, a fixed or variable reverse bias voltage can be securely applied to the pn junction layer 26. As a result, in the same manner as the seventh embodiment, the pn junction layer 26 can be securely operated as a capacitor. Also, by using variable reverse bias, the capacitance C of the pn junction layer 26 can be varied, thereby varying the overall characteristics of the LC element 800.

Figure 25:
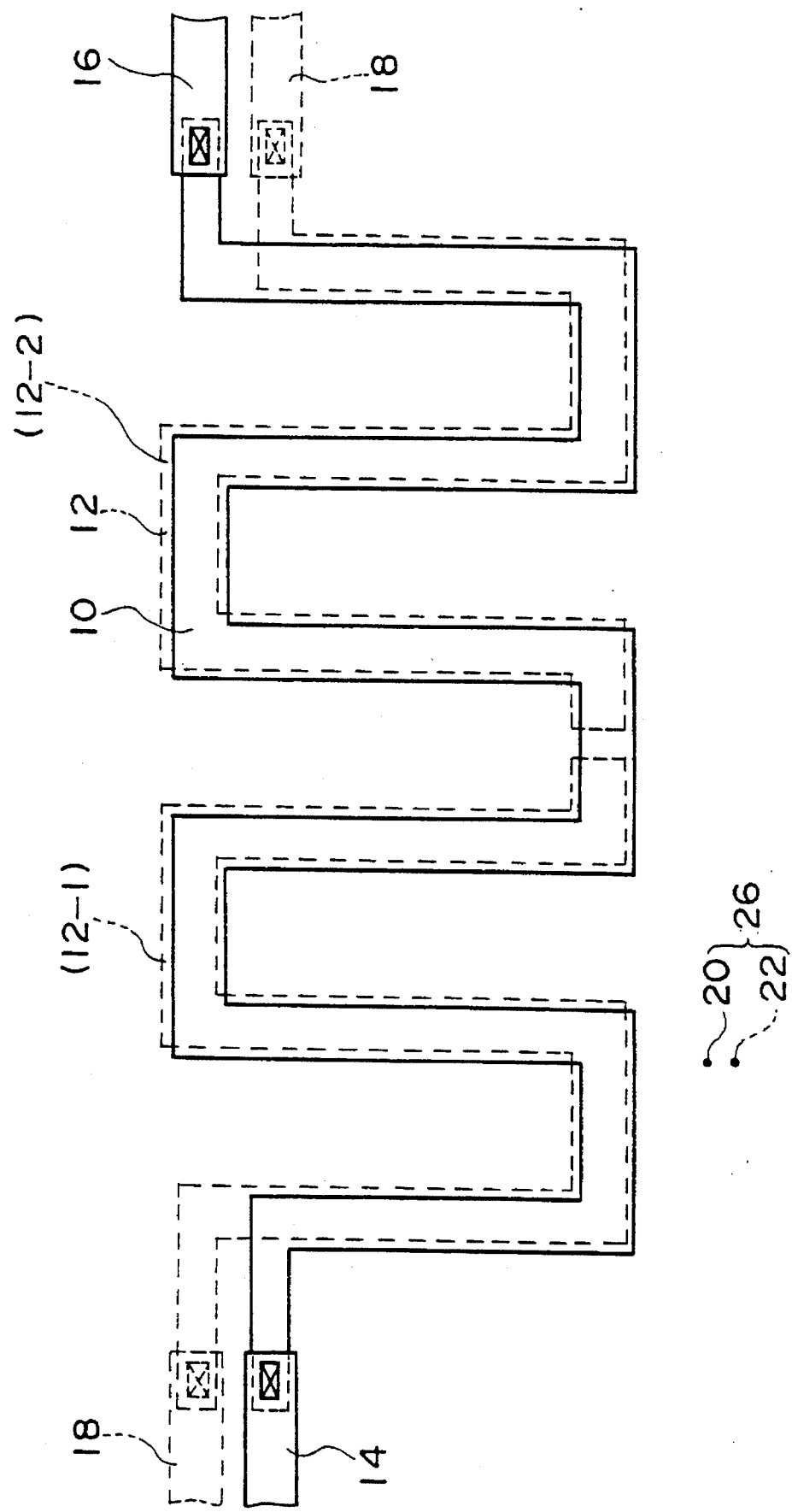
FIG. 25 indicates an example of a variation of the eighth embodiment wherein first and second electrodes are arranged in essentially opposing positions on opposite sides of a p-Si substrate.

In the same manner as the above described embodiments, as indicated in FIG. 25, the divided electrode segments 12-1 and 12-2 can be disposed essentially in opposition to the first electrode 10 on the opposite face of the p-Si substrate 24. For the sake of convenience, the rear electrode shape is shifted slightly toward the upper left in the plan view. As indicated in the figure, even though the non-spiral shaped electrode 10 and divided electrode segments 12-1 and 12-2 are disposed essentially in opposition, in the same manner as the LC element 700 indicated in FIG. 24, the first and second electrodes 10 and divided electrode segments 12-1 and 12-2 respectively function as inductors, while formation of a distributed constant type- capacitor between these is unchanged, thereby providing the same advantages such as excellent frequency response as in the embodiment shown in FIG. 24.

Although division into two segments was described above, the second electrode 12 of the LC element 800 can also be divided into three or more segments. In such cases, as the number of divisions increases, the respective self inductances of the divided segments decreases.

Also, advantages of the LC element 800, which are the same as the LC elements of the above described embodiments, include capability of manufacture by using semiconductor manufacturing technology and formation as a portion of an LSI or other device, in which case, wiring work in subsequent processing can be abbreviated.

In addition, since the first and second electrodes 10 and 12 are non-spiral shapes, input/output signal wiring for the first and second electrodes 10 and 12 can be performed on the same plane without crossing electrodes.

Also, in the case of spiral shaped first and second electrodes 10 and 12, one respective end of each electrode is positioned at the center portion and the other end at the outer circumference portion of the LC element. In contrast, in the case of the LC element 800 of this embodiment, both respective ends of the meander shaped first and second electrodes 10 and 12 are positioned at outer peripheral portions of the LC element, thereby rendering convenient conditions for providing terminals or connection to other circuit elements.

NINTH EMBODIMENT

Following is a description of an LC element in accordance with a ninth embodiment of this invention with reference to the attached drawings.

In general, an inductor function having a predetermined inductance is obtained by using a spiral shape for a conductor. Also, as mentioned above, an inductor function having a predetermined inductance is obtained in cases where a meander shape is used for the electrodes 10 and 12. However, in cases where the input signal frequency band is limited to high frequency, shapes other than spiral and meander, and in extreme cases, a straight line shape, can function as inductors having an inductance components. The LC element of this embodiment considers these points and relates to forming the electrodes 10 and others in other than spiral or meander shape.

FIGS. 26A, 26B, 27A and 27B are plan views of LC elements of this embodiment wherein the first and second electrodes 10 and 12 respectively have straight line shapes.

FIG. 26A corresponds to the above mentioned FIGS. 1 and 7, and indicates a three-terminal type LC element wherein the first and second electrodes 10 and 12 are essentially both equal length and parallel. FIG. 26B corresponds to FIGS. 11 and 14, and indicates an LC element wherein the second electrode 12 is provided in correspondence with a portion of the first electrode 10.

FIG. 27A corresponds to FIGS. 16 and 19, and indicates providing input/output electrodes 36 and 38 at the respective ends of the second electrode 12 for use as a four-terminal common mode type element. FIG. 27B corresponds to FIGS. 21 and 24, and indicates a case of dividing the second electrode 12 into two divided electrode segments 12-1 and 12-2.

Although FIGS. 26 and 27 indicate LC elements wherein the first and second electrodes 10 and 12 are formed on the same plane, in the same manner as indicated in FIGS. 5, 6 and others, the first and second electrodes 10 and 12 can also be formed essentially in opposition sandwiching the pn junction layer 26 to comprise straight line shaped LC elements.

FIG. 28 is a plan view of an LC element comprising the first and second electrodes 10 and 12 of a curved line shape with a large radius of curvature. In cases where other components etc. must be disposed at positions on the straight line joining the two input/output electrodes 14 and 16, curved line shapes such as indicated in the figure can be used for the first and second electrodes 10 and 12.

Figure 29:
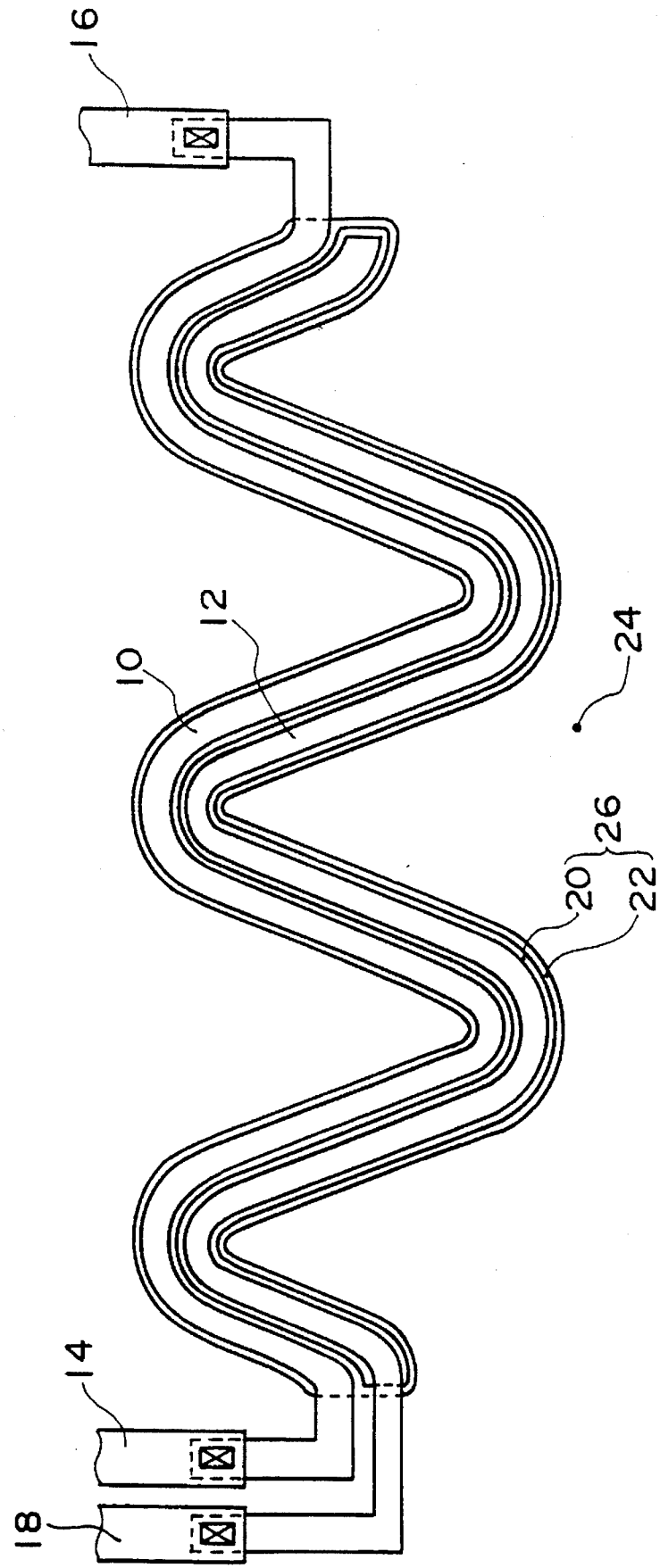
FIG. 29 indicates an example of a variation of the ninth embodiment.

FIG. 29 is a plan view of an LC element comprising wave shaped first and second electrodes 10 and 12. Although not to the extent of the spiral and meander shapes indicated in FIGS. 1, 7 and others, this LC element has a larger inductance compared to using straight line or large curve shapes for the first and second electrodes 10 and 12.

Figure 30:
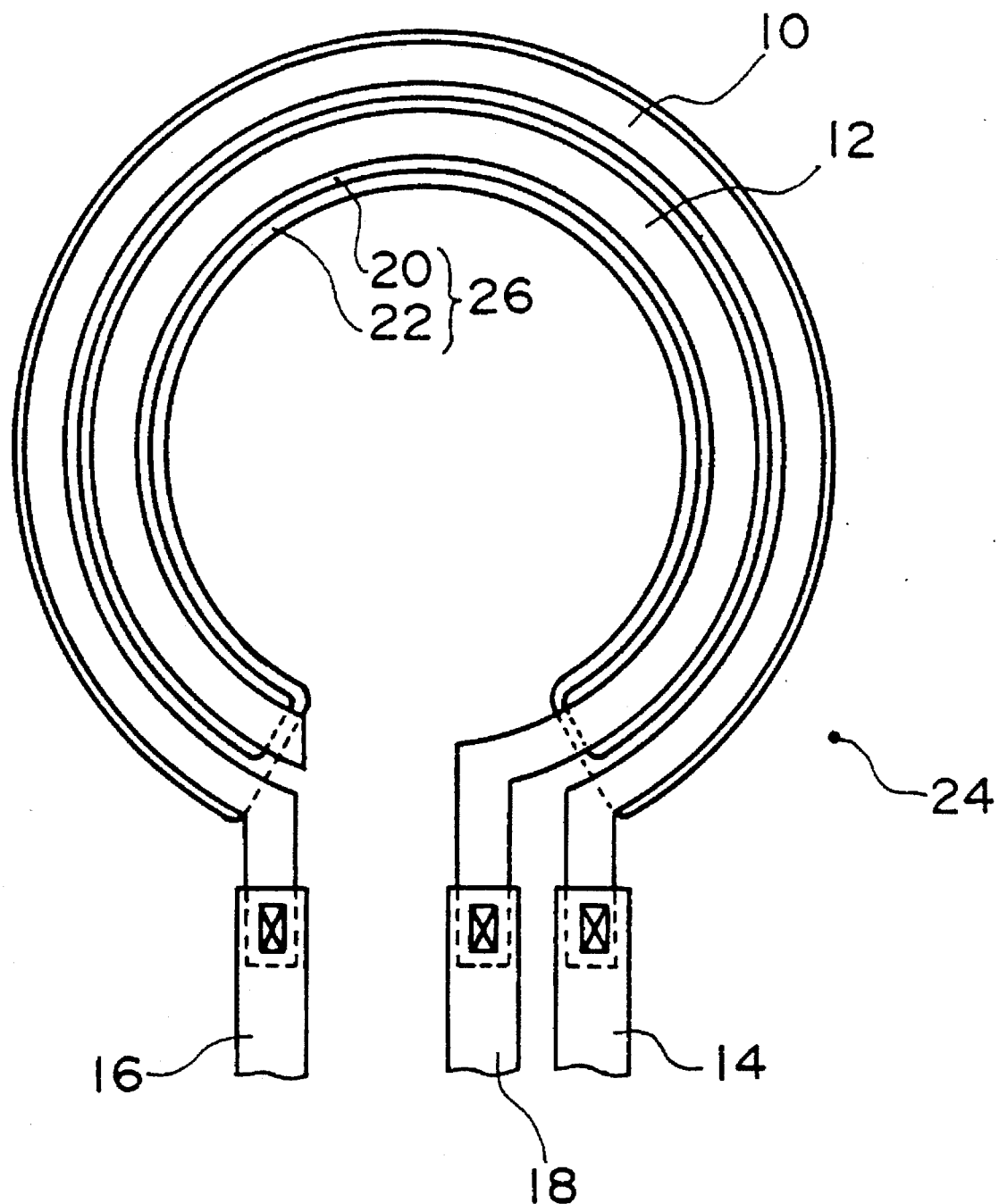
FIG. 30 indicates an example of a variation of the ninth embodiment.

FIG. 30 is a plan view of an LC element wherein the first and second electrodes 10 and 12 comprise incomplete circle shapes. As indicated in the figure, by forming the first and second electrodes 10 and 12 in an incomplete circular shape, an LC element having a small inductance can be comprised. Also, by portionally folding back one or both ends of the respective first and second electrodes 10 and 12, generated magnetic flux can be portionally cancelled and the inductance reduced, thereby allowing the overall LC element inductance, i.e., frequency characteristics to be adjusted.

In order to simplify the descriptions, only the example of the LC element indicated in FIG. 26A is indicated in FIGS. 28–30. However, the same concepts can also be applied with respect to the types indicated in FIGS. 26B, 27A and 27B, as well as to types wherein the first and second electrodes 10 and 12 are disposed essentially in opposition sandwiching the pn junction layer 26.

In this manner, the LC elements indicated in FIGS. 26A–30 respectively comprise different shaped first and second electrodes 10 and 12 and in the same manner as the above described first—seventh embodiments, functions as LC elements having excellent attenuation characteristics can be obtained. Also, in the same manner as the above described embodiments, by changing the reverse bias voltage applied to the pn junction layer 26, the capacitance of the formed distributed constant type capacitor is also changed and thus, the overall LC element characteristics can be variably controlled.

Also, advantages of the LC elements of this embodiment, which are the same as the LC elements of the above described embodiments, include capability of manufacture by using semiconductor manufacturing technology and formation as a portion of an LSI or other device, in which case, wiring work in subsequent processing can be abbreviated.

In addition, since the first and second electrodes 10 and 12 are non-spiral shapes, input/output signal wiring for the first and second electrodes 10 and 12 can be performed on the same plane without crossing electrode.

OTHER EMBODIMENTS

Following is a description of other embodiments of this invention with reference to the attached drawings.

Figure 31:
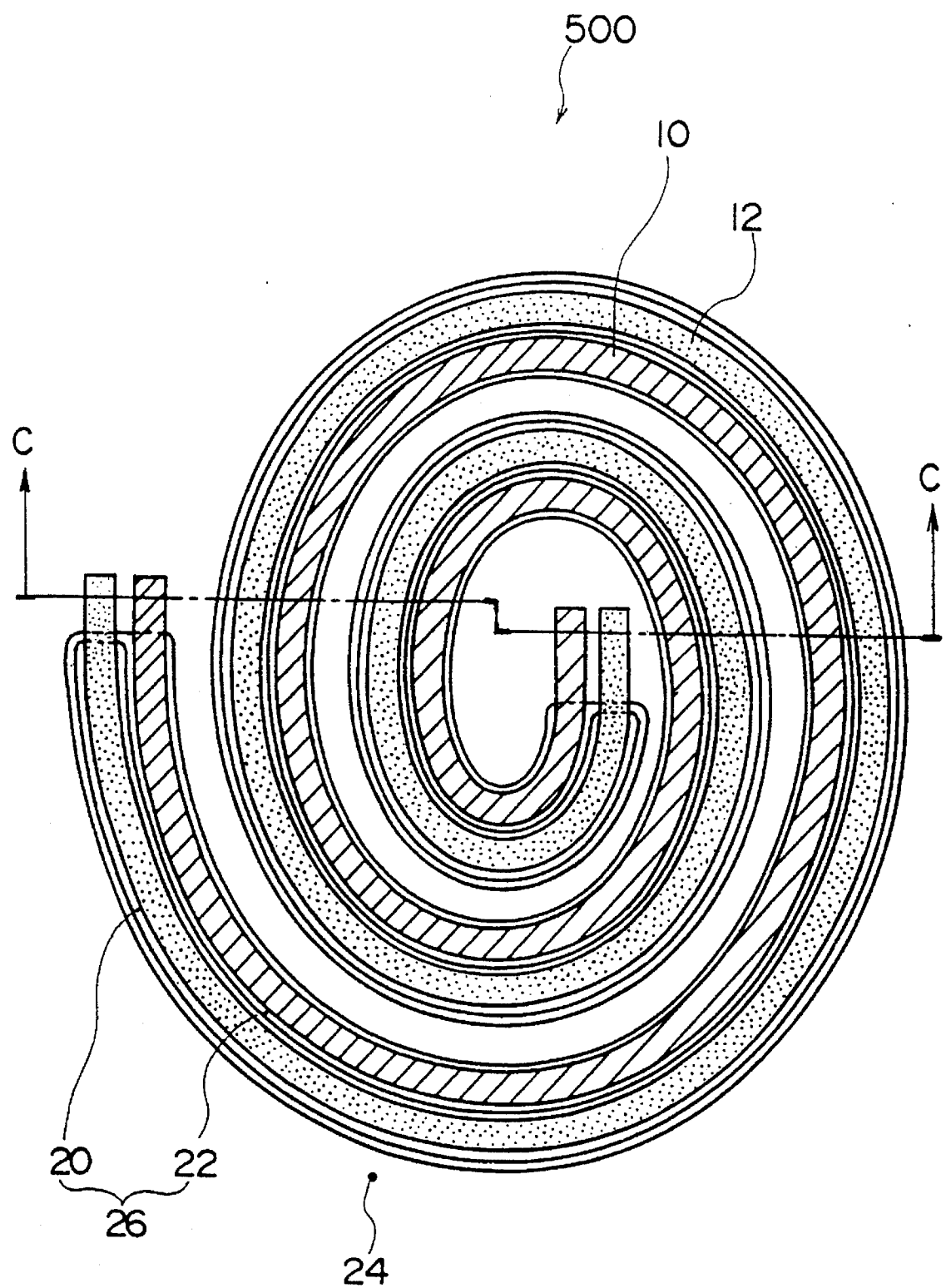
FIG. 31 is an abbreviated plan view of a case where terminals are provided using chemical liquid phase deposition.
Figure 32:
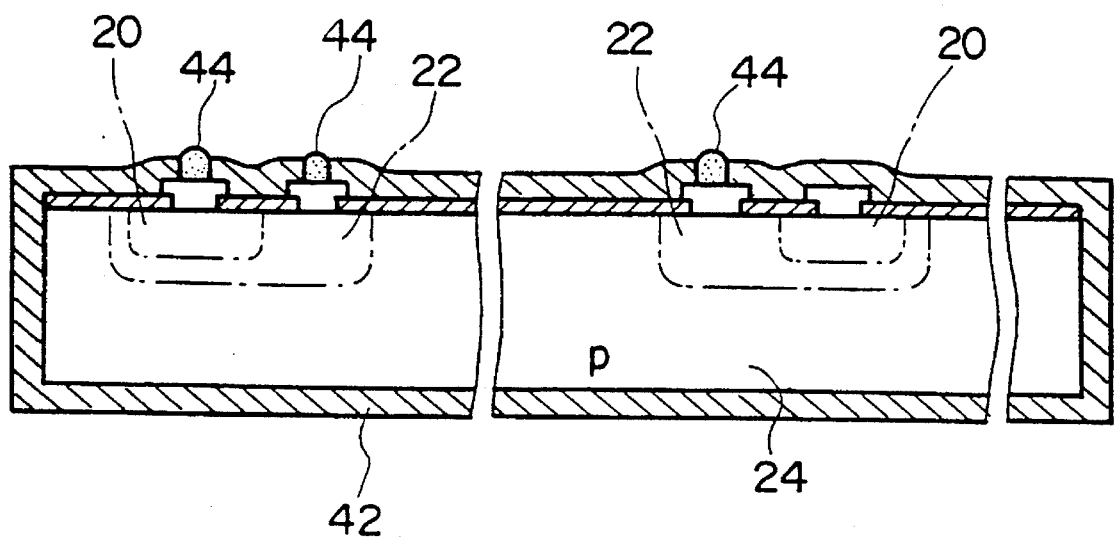
FIG. 32 is an abbreviated cross-sectional view of a case where terminals are provided using chemical liquid phase deposition.
Figure 40:
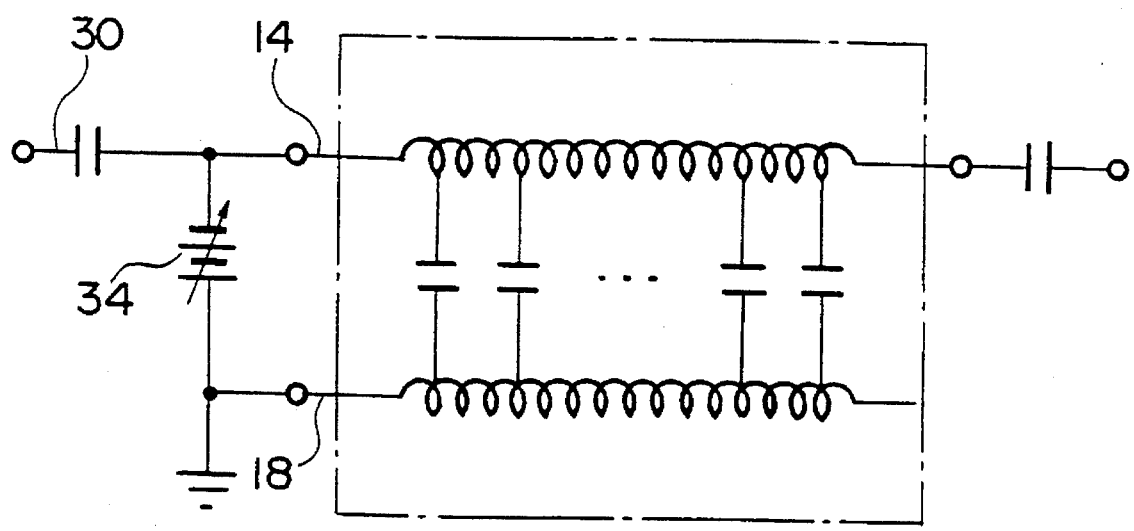
FIG. 40 is a schematic diagram of an example of bias circuit connection to an LC element having npn construction.

FIGS. 31 and 32 are explanatory drawings of providing terminals by chemical liquid phase deposition. FIG. 31 is a plan view of an LC element 500 according to this embodiment and corresponds to FIGS. 1 and others. As indicated in the figure, input/output electrodes 14 and others are not provided at the respective ends of the first and second electrodes 10 and 12. After separating a semiconductor substrate including first and second electrodes 10 and 12 having this type of shape, a silicon oxide film 42 is formed as an insulation film on the entire surface of the individual separated chip (element) by chemical liquid phase deposition. Afterwards, the silicon oxide film 42 over the end portions of the first and second electrodes 10 and 12 is removed by etching to open perforations. These perforations are closed by solder 44 applied to the extent of protruding above the surface. Since the protruding solder 44 can be brought into direct contact with, for example, printed wiring board lands, the condition is convenient for surface mounting. FIG. 40 is a cross-sectional view of an LC element formed in this manner. This figure corresponds to a cross-sectional view viewed along line C—C in FIG. 31 which is a plan view of a semiconductor substrate prior to processing.

Synthetic resin or other insulating material can be used for the element surface protective film and laser light can be used for the protective film perforations.

Figure 33:
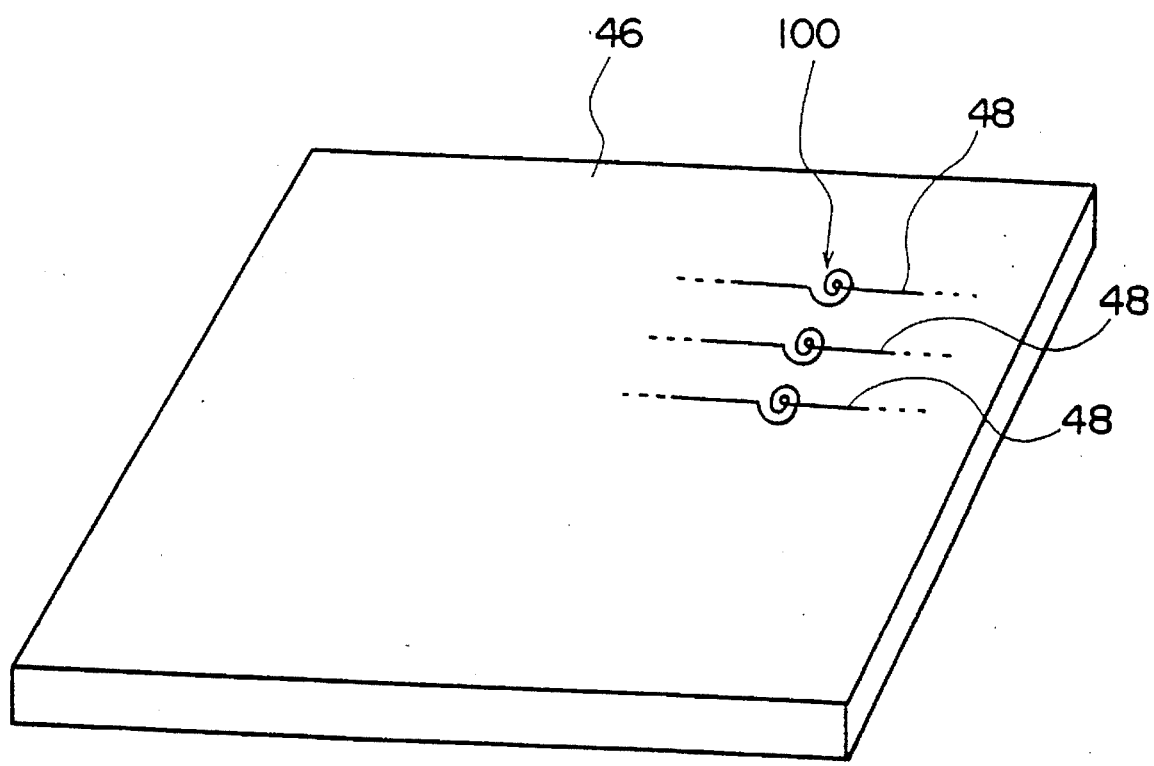
FIG. 33 is an explanatory drawing of forming LC elements of each embodiment as portions of an LSI or other device.

FIG. 33 is an explanatory drawing of forming the LC element 100 and others of the above described embodiments as portions of an LSI or other device. As indicated in the figure, the above mentioned LC elements are inserted into the signal or power supply lines 48 on the semiconductor chip 46. In particular, since the LC element 100 and others of the foregoing embodiments can be manufactured simultaneously with the forming processes of other circuits on the semiconductor chip 46, such work as wiring between the LC elements and other circuits is unnecessary in subsequent processing.

In FIG. 33 and the below mentioned FIG. 34, although the LC element 100 of the first embodiment is shown as a representative for incorporating into the circuit, the same concept can be applied by exchanging this with LC elements of the other above mentioned embodiments, such as LC element 300.

Figure 34A:
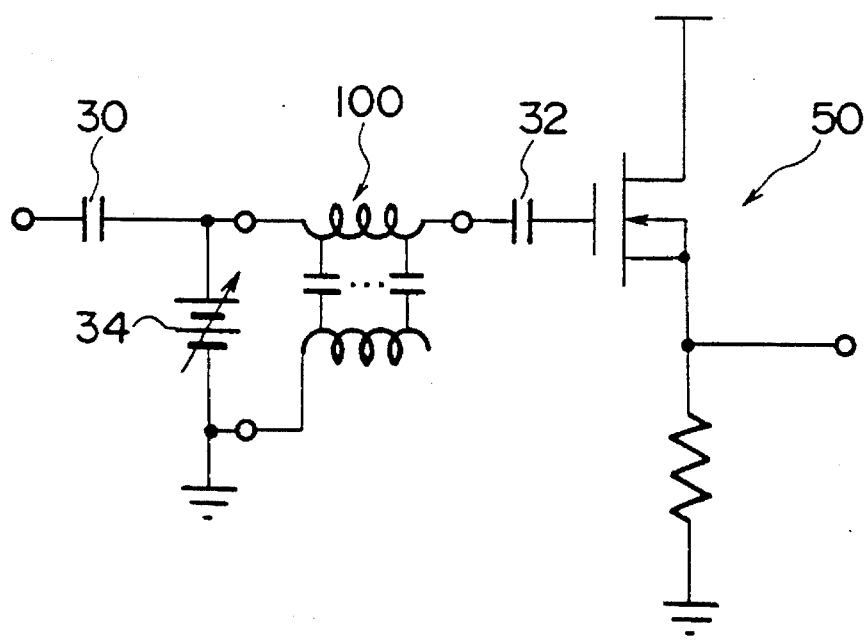
FIGS. 34A–34E are schematic diagrams showing examples of buffer circuit connection to the output side of the LC elements of each embodiment.

FIGS. 34A–34E show examples of buffer connections to the output side of the above mentioned embodiments, such as LC element 100. FIG. 34A indicates use of a source-follower circuit 50 comprising a MOSFET and resistor as a buffer. Since the MOSFET construction differs only slightly from the construction of the LC elements of the above mentioned embodiments, the overall LC element including the source-follower circuit 50 can be formed in integrated manner on the same semiconductor substrate.

Figure 34B:
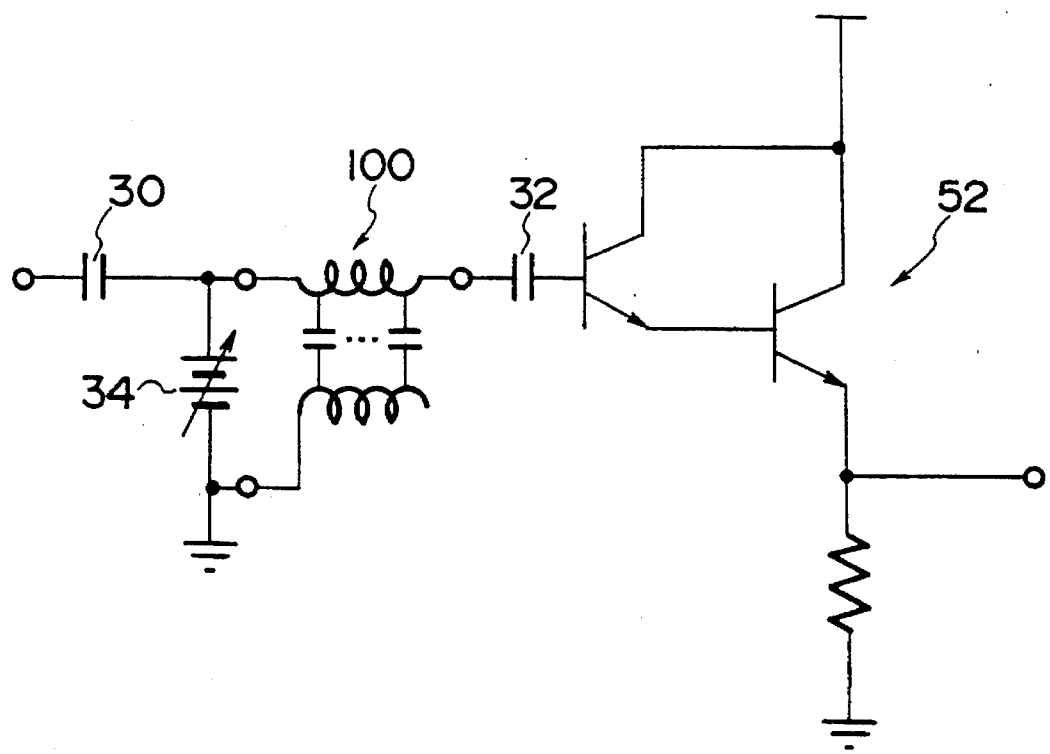

FIG. 34B indicates use of an emitter-follower circuit 52 comprising two bipolar transistors in a Darlington connection and a resistor as a buffer. Since the bipolar transistor construction is the same as the construction of the LC elements of the above mentioned embodiments, the overall LC element including the emitter-follower circuit 52 can be formed in integrated manner on the same semiconductor substrate. Also, by grounding the base of the transistor closer to the output through a resistor, the transistor operating point can be further stabilized.

Figure 34C:
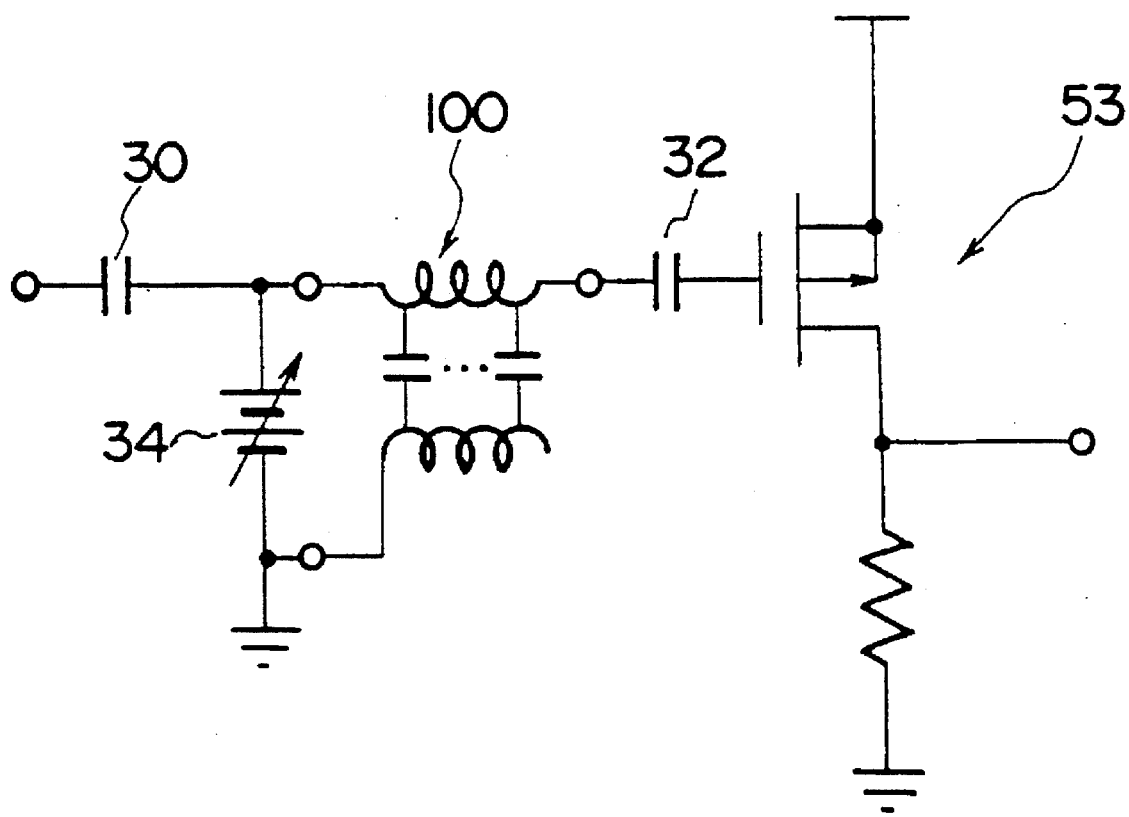

FIG. 34C shows an example of a circuit comprising a p-channel MOSFET used with reverse bias as a buffer.

Figure 34D:
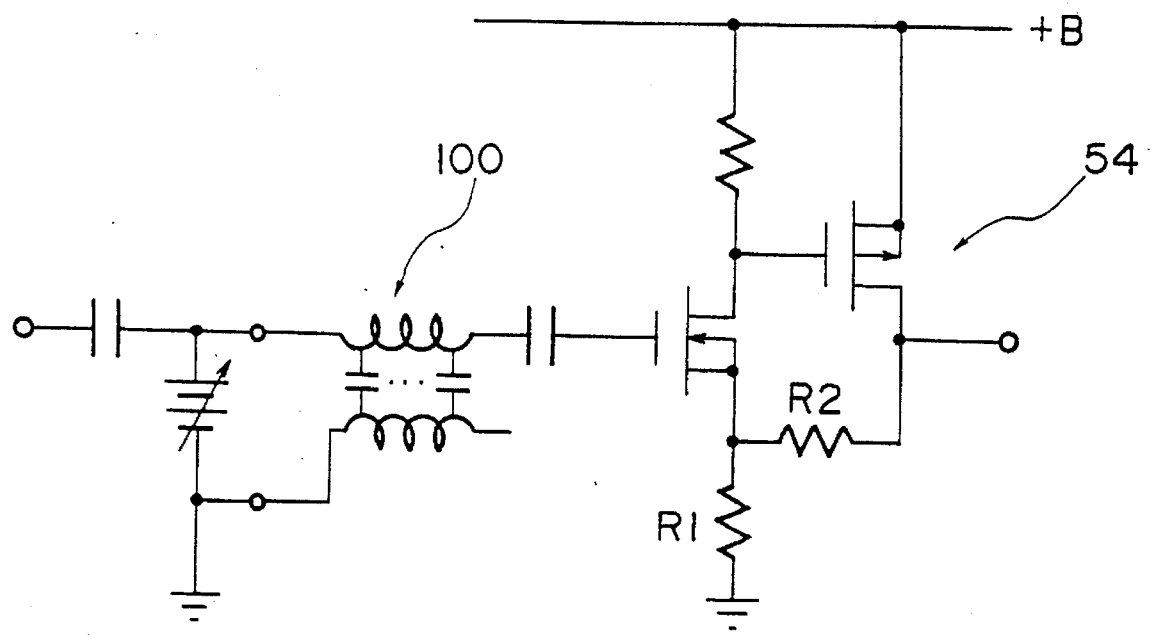

FIG. 34D shows an example of an amplifier circuit 54 comprising two MOSFETs and resistors used as a buffer. Since the MOSFET construction differs only slightly from the construction of the LC elements of the above mentioned embodiments, the overall LC element including the amplifier circuit 54 can be formed in integrated manner on the same semiconductor substrate. The voltage amplification factor of this circuit is 1+ (R2/R1), and by setting R2=0, the circuit is equivalent to a source-follower.

Figure 34E:
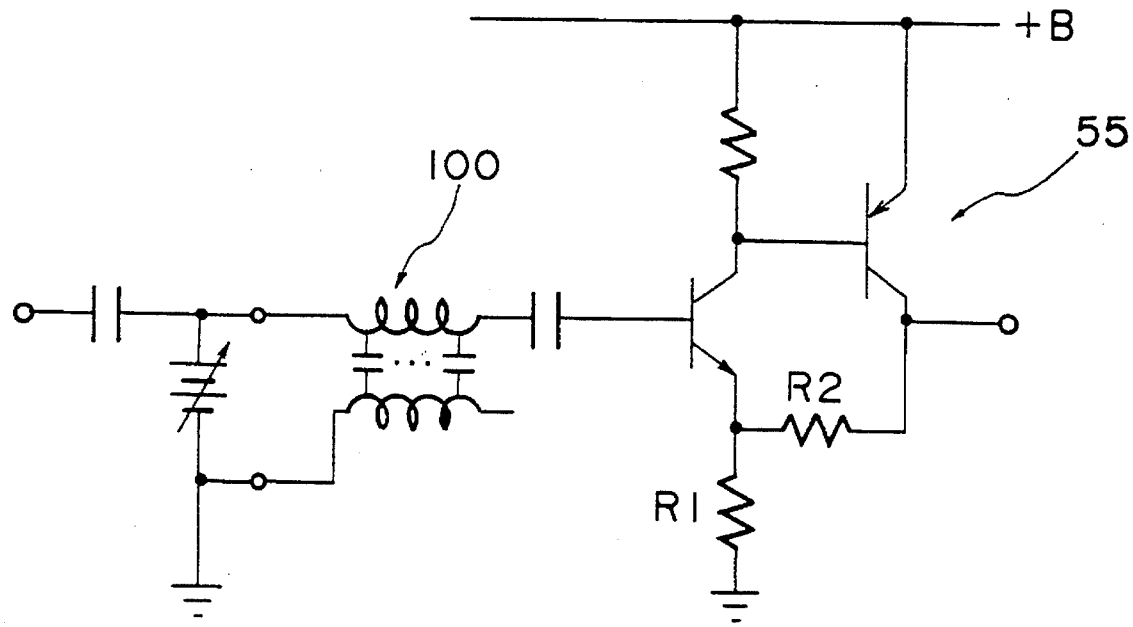

FIG. 34E shows an example of an amplifier circuit 55 comprising two bipolar transistors and resistors used as a buffer. Since the bipolar transistor construction is the same as the construction of the LC elements of the above mentioned embodiments, the overall LC element including the amplifier circuit 55 can be formed in integrated manner on the same semiconductor substrate. The voltage amplification factor of this circuit is 1+ (R2/R1) and by setting R2=0, the circuit is equivalent to an emitter-follower.

In cases where the LC element 100 indicated in FIGS. 34A–34E is replaced by, for example, an LC element 500, 600 of the fifth or the sixth embodiment, since both the first and second electrodes 10 and 12 are used as signal transmission lines, an above mentioned buffer circuit 50, 52, 53, 54, or 55 is also connected to the second electrode 12 output side.

In this manner, by providing a buffer at the output side, the signal not only of which frequency components of a comparatively wide band are removed by the LC elements of the above mentioned embodiments, but also of which signal level attenuated via the first electrode 10 etc. can have restored signal level. Thus, an output signal with excellent SN ratio can be obtained and such functions as matching the impedance with respect to subsequent circuit stages are enabled.

Also, by connecting a level converter circuit to the output side, the signal level attenuated via first electrode 10 etc. can be amplified, while conversion to a predetermined level or level correction can be performed.

In the same manner as the above mentioned buffers, these level converter circuits can be formed in integrated manner with the LC elements of the above described embodiments on the same semiconductor substrate.

Also, in the case of the LC element 500, 600 of the fifth or sixth embodiment, a level converter circuit is also connected to the second electrode 12 output side as in the case of the above mentioned buffers.

In addition, this invention is not limited to the above mentioned embodiments, but numerous variations are possible within the range of the scope of this invention.

For example, in the above described embodiments, the first and second electrodes 10 and 12 were formed directly contacting the surface of the pn junction layer 26. However, an insulation layer 62 comprising $SiO_2$ or other material can be inserted between the pn junction layer 26 and at least one of the first and second electrodes 10 and 12.

Figure 35A:
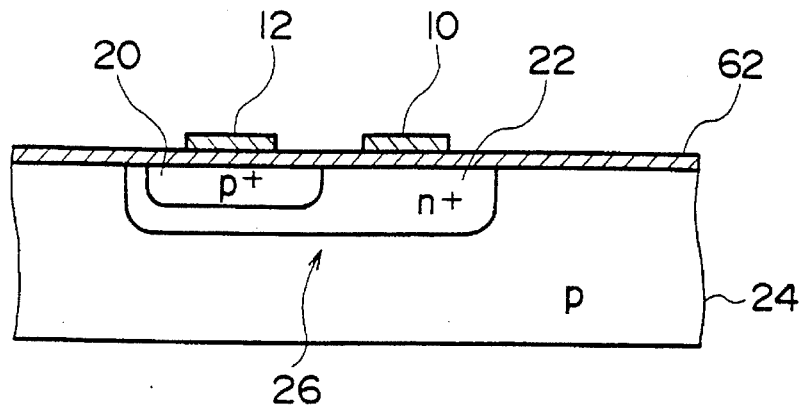
FIGS. 35A, 35B and 35C are cross-sectional drawings when insulation layer is formed between the electrodes and the semiconductor substrate.
Figure 35B:
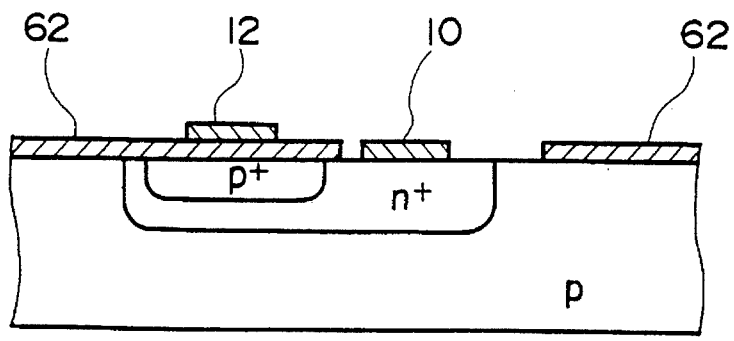
Figure 35C:
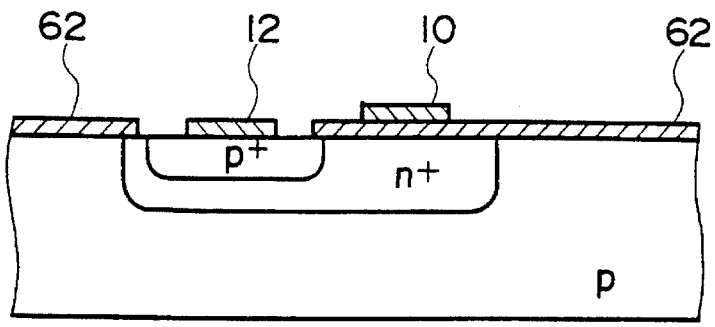

FIGS. 35A, 35B and 35C are drawings showing examples of cross-sectional construction wherein the insulation layer 62 is formed between the pn junction layer 26 and at least one of the two electrodes 10 and 12.

In the FIG. 35A case, the insulation layer 62 is formed both between the electrode 10 and the pn junction layer 26 between the electrode 12 and the pn junction layer 26. In this case, reverse bias voltage is directly applied to the pn junction layer 26, while a signal can be input directly to the input/output electrode 14 provided at one end of the first electrode 10. As a result, a capacitor function is produced via the insulation layer 62 between the first electrode 10 and the $n^+$ region 22 or the second electrode 12 and the $p^+$ region 20 and a capacitor 30 for removing the DC component as indicated in the above mentioned FIGS. 3B and others is unnecessary.

In the FIG. 35B case, the insulation layer 62 is formed only between the electrode 12 and the pn junction layer 26, and in the FIG. 35C, the insulation layer 62 is formed between the electrode 10 and the pn junction layer 26. In both cases, reverse bias voltage is directly applied to the pn junction 26, while a signal can be input directly to the input/output electrode 14 provided at one end of the first electrode 10 as in the case of FIG. 35A.

Figure 36A:
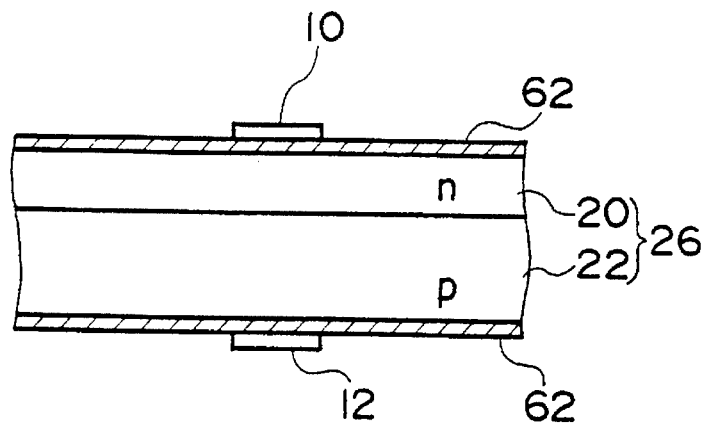
FIGS. 36A, 36B and 36C are cross-sectional drawings when insulation layer are formed between the electrodes and the semiconductor substrate.
Figure 36B:
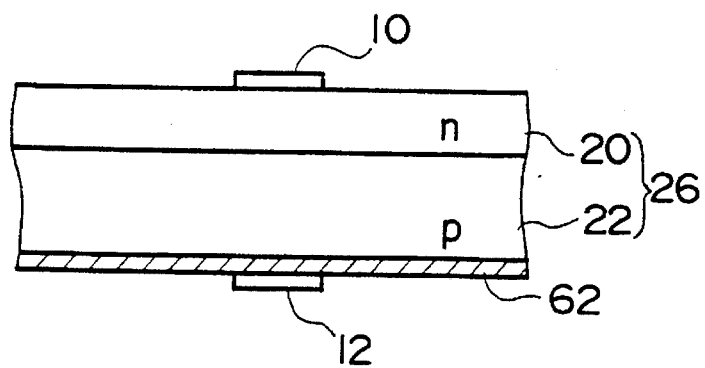
Figure 36C:
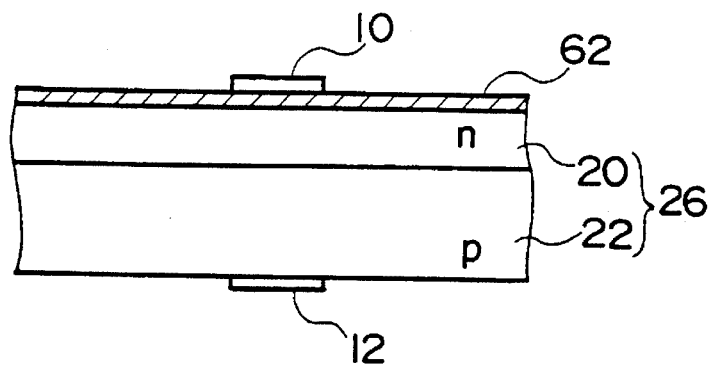

FIGS. 36A, 36B and 36C are drawings showing examples of cross-sectional construction wherein the first and second electrodes 10 and 12 are disposed essentially in opposition and the insulation layer 62 is formed between the pn junction layer 26 and at least one of these two electrodes 10 and 12. In the FIG. 36A case, the insulation layer 62 is formed both between the electrode 10 and the pn junction layer 26 and between the electrode 12 and the pn junction layer 26. In this case, reverse bias voltage is directly applied to the pn junction layer 26, while a signal can be input directly to the input/output electrode 14 provided at one end of the first electrode 10. FIG. 36B indicates a case whereby the insulation layer 62 is formed only between the second electrode 12 and the pn junction layer 26, while FIG. 36C indicates the opposite case whereby the insulation layer 62 is formed only between the first electrode 10 and the pn junction layer 26.

Also, although the above described embodiments referred to LC element types wherein the first and second electrodes 10 and 12 functioning as inductors are disposed completely in opposition, these electrodes 10 and 12 functioning as inductors can be shifted slightly from the essentially opposing position as long as capacitor electrode functions can also be comprised by the first and second electrodes 10 and 12 for the pn junction layer 26.

Figure 37:
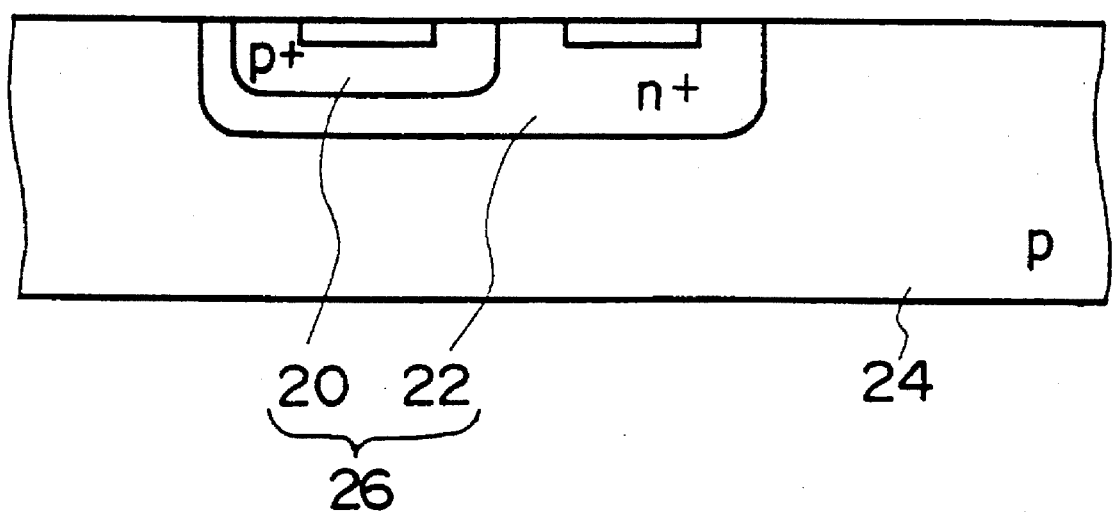
FIG. 37 indicates an example of a variation with flat surface formation.
Figure 38:
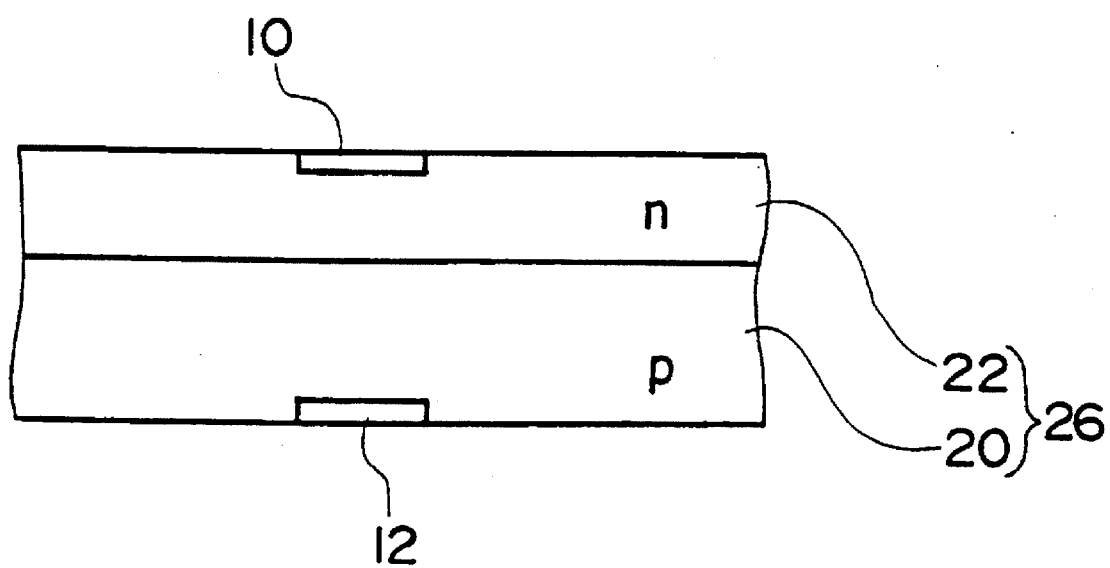
FIG. 38 indicates an example of a variation with flat surface formation.

Also, in the above mentioned embodiments, the first and second electrodes are formed by vapor deposition of aluminum or other material in a final process, resulting in a protruding cross-sectional shape as indicated in FIG. 2. However, by forming a groove of predetermined shape by etching or other means in part of the pn junction layer 26, the electrodes 10 and 12 can be embedded in the pn junction layer 26 as indicated in FIG. 37 or FIG. 38. In this manner, an essentially flat LC element can be formed without an irregular surface.

Figure 39:
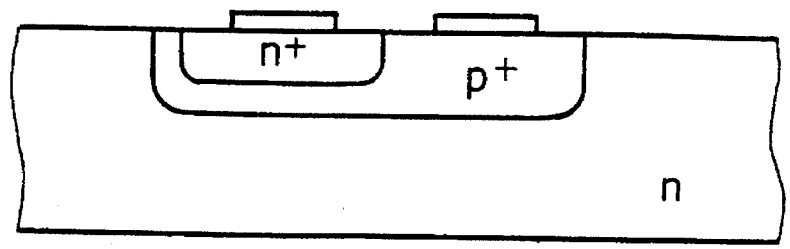
FIG. 39 is a cross-sectional view of an LC element using npn construction.

Also, in the above mentioned embodiments, the LC element was formed using pnp construction including a P-Si substrate 24. However, npn construction can also be used in the same manner. FIG. 39 is a partial cross-sectional view of an LC element having npn construction. In the case of this type of construction, the reverse bias polarity applied to the pn junction layer needs to be reversed. FIG. 40 indicates a circuit example when applying reverse polarity reverse bias voltage and corresponds to FIG. 3C.

Figure 41:
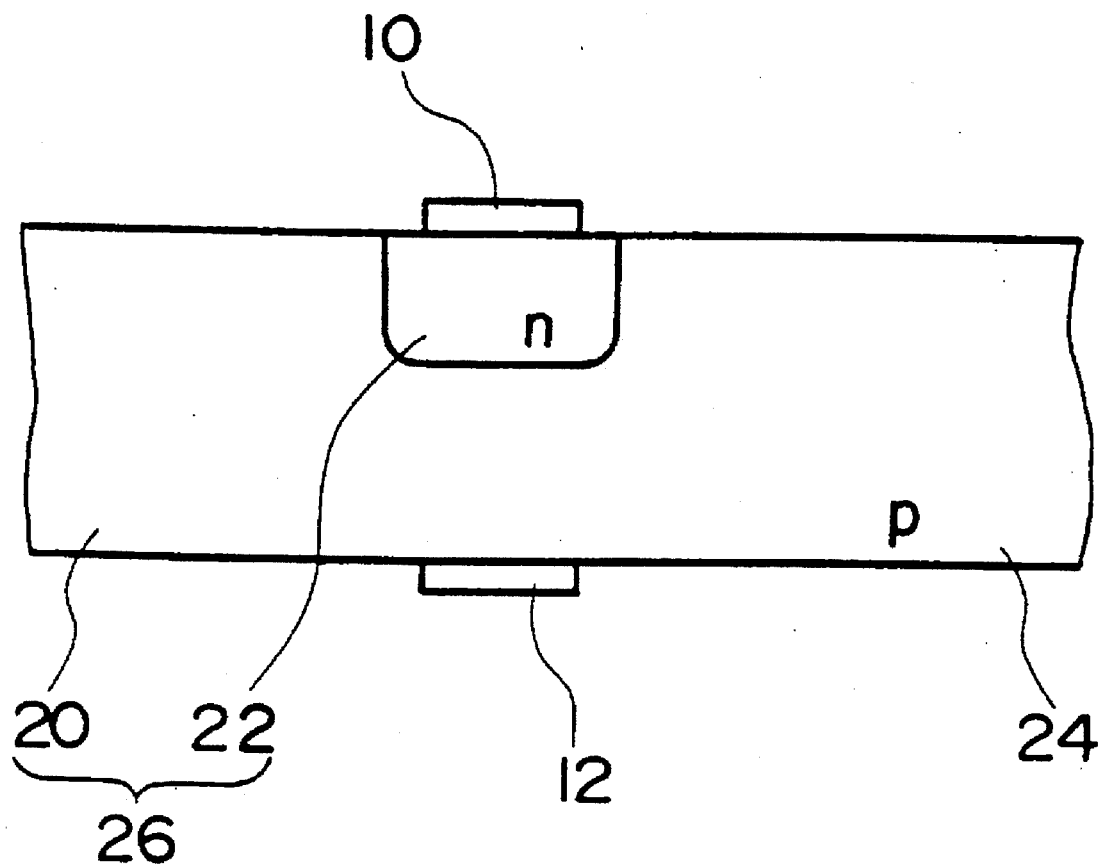
FIG. 41 indicates an example of a variation using a meander shaped pn junction layer.

Also, embodiments wherein the first and second electrodes 10 and 12 are disposed at essentially opposing positions sandwiching the pn junction layer 26 (such as the LC element 100 indicated in FIG. 5) referred to examples when the overall p-Si substrate 24 is used as the pn junction layer 26 comprising an n region 22 and a p region 20. However, as indicated in FIG. 41, the n region 22 (or p region 20) can also be formed along the first electrode 10 etc. In this case, since a depletion layer is produced in the boundary (pn junction) between the n region 22 and p region 20 to form a spiral or other shaped capacitor, the spiral or other shaped capacitor can be more reliably formed compared to construction such as indicated in FIG. 6.

Also, when actually using the overall p-Si substrate 24 as the pn junction layer 26 comprising an n region 22 and p region 20, the p-Si substrate 24 thickness needs to be made thinner than the wafer. Also, from the viewpoint that n type wafers are generally easier to procure, construction such as indicated in FIGS. 42A–42D can also be used.

Figure 42A:
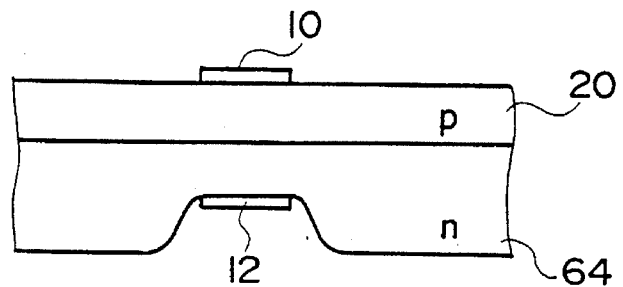
FIGS. 42A–42D indicate examples of variations wherein etching is used to reduce the thickness of portions of the semiconductor substrate.

In other words, as indicated in FIG. 42A, a p region 20 is formed by such means as epitaxial growth on the surface of an n-Si substrate 64. After forming the first electrode 10 over this, etching is performed on the rear surface of the n-Si substrate 64 and the second electrode 12 is formed in this etched portion.

Figure 42B:
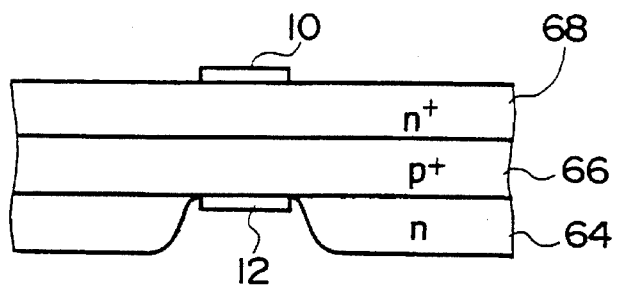

In the FIG. 42B example, a $p^+$ region 66 and an $n^+$ region 68 are formed in sequence on the n-Si substrate 64 surface. After forming the first electrode 10 over these, etching is performed on the rear surface of the n-Si substrate 64 and the second electrode 12 is formed in this etched portion.

Figure 42C:
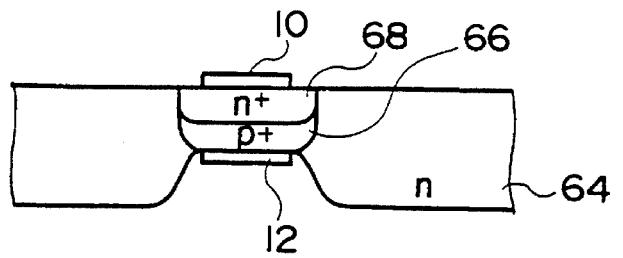
Figure 42D:
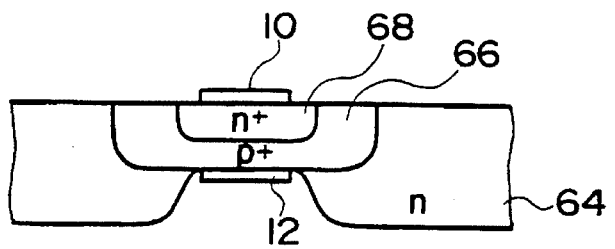

FIGS. 42C and 42D indicate examples wherein a $p^+$ region 66 is formed essentially along the first electrode 10 in a portion of the n-Si substrate 64, then in this portion, the $n^+$ region 68 is additionally formed along the first electrode 10. Etching is performed on the rear surface of the n-Si substrate 64 in the portion to be corresponding to the second electrode 12, then the second electrode 12 is formed in this etched portion. On the opposite face, the first electrode 10 is formed over the $n^+$ region 68. In the case of construction as indicated in FIG. 42D, three layers having pnp or npn construction always exist between the inductor electrodes 10 and 12 of one portion and the inductor electrodes 10 and 12 of an adjacent portion, resulting in excellent isolation compared to the FIG. 42C case.

In the above described embodiments, carrier concentration higher than the normal p type or n type substrate was expressed as $p^+$ or $n^+$, but if the pn junction layer is able to function as a capacitor with a distributed constant type capacitance, normal p or n regions are acceptable.

Also, although the above described embodiments using spiral shaped electrodes referred to essentially circular spiral shapes for the first and second electrodes 10 and 12, and the pn junction layer 26, if the overall shape is a spiral, a rectangular or other form of spiral shape can be used.

Also, in regard to the above embodiments, the ability to form the LC element 100 etc. as a portion of an LSI or other device was mentioned, but formation as a portion of an LSI or other device is not essential. After forming the LC element 100 on the semiconductor substrate, providing respective terminals for the input/output electrodes 14 and 16, and the ground electrode 18, or providing terminals by chemical liquid phase deposition such as indicated in FIGS. 31 and 32, forming as a discrete element is also acceptable. In this case, by simultaneously forming a plurality of LC elements on the same semiconductor substrate, then cutting the semiconductor substrate and providing terminals to the LC elements, easy mass production is enabled.

In the above described embodiments, the input/output electrodes 14 and 16, and the ground electrode 18 were respectively provided at the very ends of the first and second electrodes 10 and 12. However, it is not essential that these be provided at the very ends and their attachment positions may be shifted according to requirements.

Also, in the case of LC elements of the above described first and other embodiments using spiral shaped electrodes, the outer positioned second electrode 12 is grounded or connected to a fixed potential. However, the first and second spiral shaped electrodes 10 and 12 may also be disposed oppositely. Also, although the ground electrode 18 was provided at one end of the outer circumference side of the second spiral shaped electrode 12, the ground electrode 18 may also be provided at one end of the inner circumference side.

Also, in the case of the above described embodiments using meander shaped electrodes, although the first and second input/output electrodes 14 and 16 were disposed at separated positions near the respective ends of the first electrode 10, the shape of the first electrode 10 can be modified to allow disposing the first and second input/output electrodes 14 and 16 in proximity.

Figure 43:
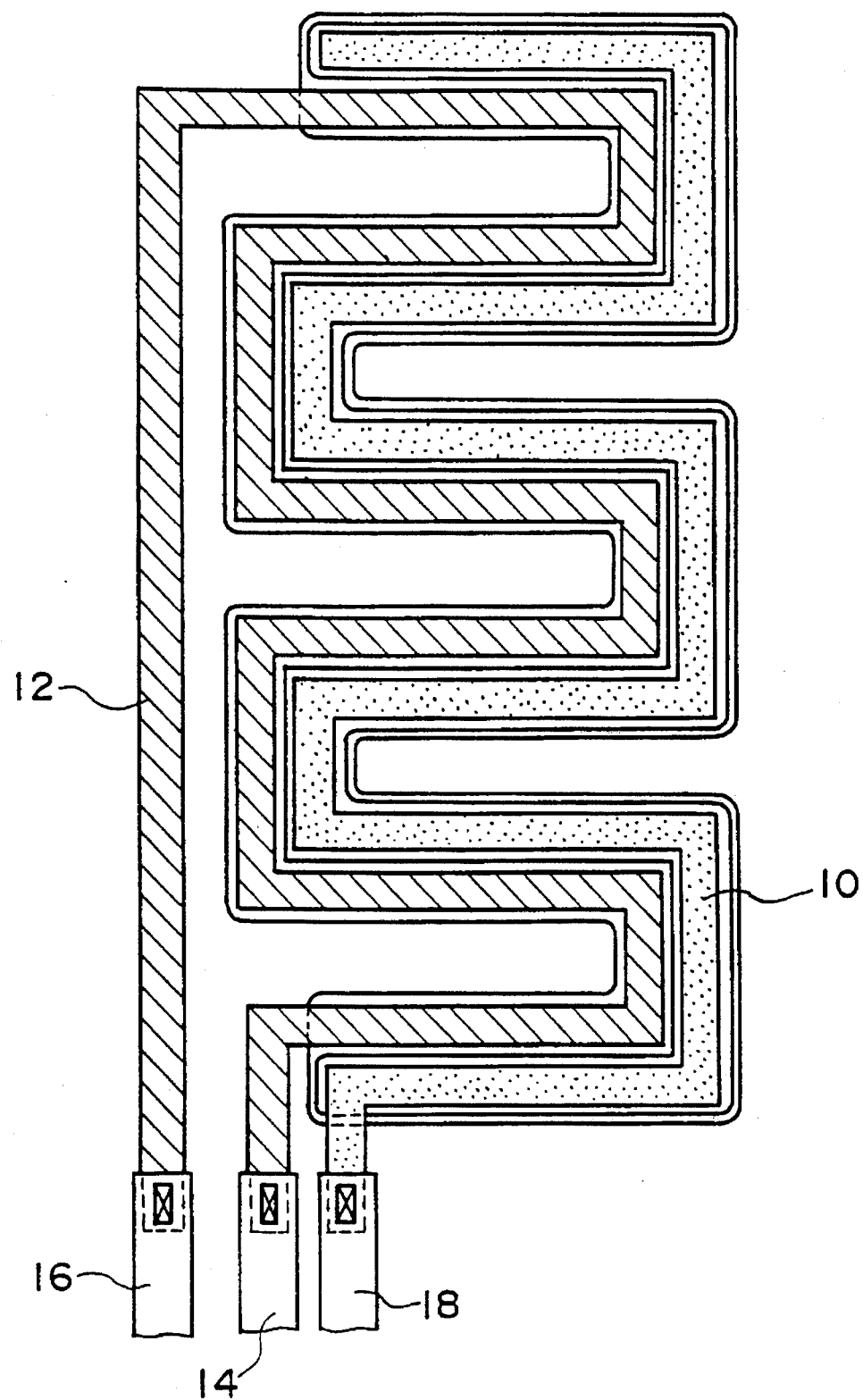
FIG. 43 indicates an example of a variation of input/output electrode position.
Figure 44:
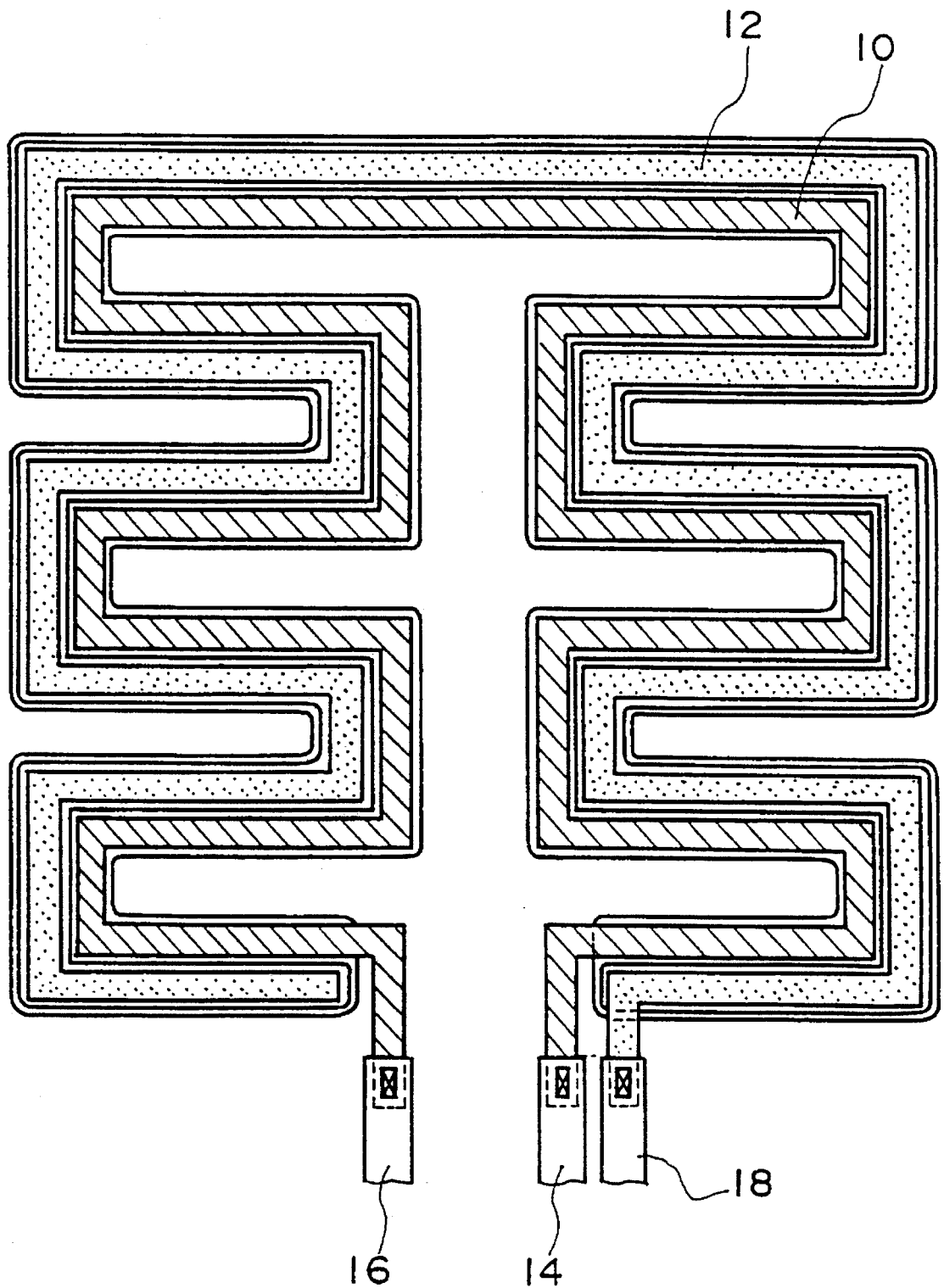
FIG. 44 indicates an example of a variation of input/output electrode position.

For example, as indicated in FIG. 43, in order to allow adjacent positioning of the two input/output electrodes 14 and 16, one end of the first or second electrode 10 or 12 of the LC element 100 indicated in FIG. 1 is extended to reach the input/output electrode 16. Alternatively, as indicated in FIG. 44, the first and second electrodes 10 and 12 of the LC element 100 indicated in FIG. 1 are folded back while maintaining the meander shape to allow adjacent positioning of the two input/output electrodes 14 and 16.

In this manner, by modifying the shape of the first electrode 10 (or both first and second electrodes 10 and 12), the two input/output electrodes 14 and 16 can be positioned in proximity and the ground electrode 18 can be formed at nearly the same position as these input/output electrodes 14 and 16. Consequently, wiring when providing terminals is easy, while manufacturing processes can be simplified.

Also, in the case of the above described LC element 100 and others of the foregoing embodiments, by changing the reverse bias voltage, the capacitance of the distributed constant type capacitor is also changed and as a result, the frequency response as an LC element can be variably controlled. Consequently, by using the LC element 100 and others as portions of circuits, variable frequency type tuner, modulator, oscillator, filter and other circuits can be easily constructed.

Also, although forming the pn junction layer 26 on a P-Si substrate 24 was described in the foregoing embodiments on the LC element 100 and others, germanium or other type of semiconductor or a non-crystalline material such as amorphous silicon can also be used.

What is claimed is:

1. A method of manufacturing an LC element comprising the steps of:

a first process whereby a spiral shaped second conductivity type region is formed in a semiconductor substrate having a first conductivity type, a second process whereby a spiral shaped pn junction layer is formed by forming an inverted layer of a first conductivity type region in a portion of said second conductivity type region including a surface formed in said first process, a third process whereby two inductor electrodes respectively having inductances are formed, electrically connected over their entire length respectively to said first conductivity type region and said second conductivity type region, on a surface of said pn junction layer, and a fourth process whereby wiring layers are formed respectively connected to said two inductor electrodes.

2. A method of manufacturing an LC element comprising the steps of:

a first process whereby a meander shaped second conductivity type region is formed in a semiconductor substrate having a first conductivity type, a second process whereby a meander shaped pn junction layer is formed by forming an inverted layer of a first conductivity type region in a portion of said second conductivity type region including a surface formed in said first process, a third process whereby two inductor electrodes respectively having inductances are formed, electrically connected over their entire length respectively to said first conductivity type region and said second conductivity type region, on a surface of said pn junction layer, and a fourth process whereby wiring layers are formed respectively connected to said two inductor electrodes.

* * * * *